(12) United States Patent
Narukawa et al.

(10) Patent No.: US 8,076,694 B2
(45) Date of Patent: Dec. 13, 2011

(54) NITRIDE SEMICONDUCTOR ELEMENT HAVING A SILICON SUBSTRATE AND A CURRENT PASSING REGION

(75) Inventors: Yukio Narukawa, Tokushima (JP); Tomotsugu Mitani, Awa (JP); Masatsugu Ichikawa, Anan (JP); Akira Kitano, Komatsushima (JP); Takao Misaki, Anan (JP)

(73) Assignee: Nichia Corporation, Anan-shi (JP)

( * ) Notice: Subject to any disclaimer, the term of this patent is extended or adjusted under 35 U.S.C. 154(b) by 519 days.

(21) Appl. No.: 11/413,206

(22) Filed: Apr. 28, 2006

(65) Prior Publication Data

US 2006/0243988 A1 Nov. 2, 2006

(30) Foreign Application Priority Data

May 2, 2005 (JP) ................................ 2005-134066
May 2, 2005 (JP) ................................ 2005-134690

(51) Int. Cl.
*H01L 33/00* (2010.01)
(52) U.S. Cl. .......... 257/103; 257/E33.022; 257/E33.003
(58) Field of Classification Search .................. 257/103, 257/E33.002, E33.003
See application file for complete search history.

(56) References Cited

U.S. PATENT DOCUMENTS

| | | | |
|---|---|---|---|
| 5,710,439 A | 1/1998 | Ohkubo et al. | |
| 6,054,716 A | 4/2000 | Sonobe et al. | |
| 6,291,258 B2 | 9/2001 | Kadota et al. | |
| 6,326,645 B1 | 12/2001 | Kadota et al. | |
| 6,531,716 B2 | 3/2003 | Udagawa et al. | |
| 6,606,333 B2 | 8/2003 | Kadota et al. | |
| 6,936,860 B2 | 8/2005 | Sung et al. | |
| 2001/0000916 A1 | 5/2001 | Kadota | |
| 2001/0036678 A1 | 11/2001 | Udagawa | |
| 2002/0100412 A1 | 8/2002 | Hirayama et al. | |
| 2002/0126719 A1 | 9/2002 | Kadota | |
| 2002/0179918 A1 | 12/2002 | Sung et al. | |
| 2003/0122139 A1* | 7/2003 | Meng et al. ..................... 257/81 |
| 2003/0189201 A1* | 10/2003 | Chen ................................. 257/13 |
| 2005/0110029 A1* | 5/2005 | Aoyagi et al. ................... 257/94 |
| 2006/0157730 A1 | 7/2006 | Otsuka et al. | |
| 2006/0175628 A1 | 8/2006 | Otsuka et al. | |

FOREIGN PATENT DOCUMENTS

| | | |
|---|---|---|
| JP | 04-207079 | 7/1992 |
| JP | 6-334168 A | 12/1994 |
| JP | 7-321051 A | 12/1995 |
| JP | 8-236453 A | 9/1996 |
| JP | 9-148625 A | 6/1997 |

(Continued)

*Primary Examiner* — Lynne Gurley
*Assistant Examiner* — Hsin-Yi Hsieh
(74) *Attorney, Agent, or Firm* — Birch, Stewart, Kolasch & Birch, LLP

(57) ABSTRACT

It is an object of the present invention to provide a nitride semiconductor element, which uses Si as a substrate, and whose voltage in the forward direction (Vf) is lower than in the prior art. In the nitride semiconductor element which has a nitride semiconductor layer over an Si substrate, at least a portion of the Si substrate and the nitride semiconductor layer are included in an current pass region, and the electrical conductivity type of the current pass region on the Si substrate is p-type. Furthermore, in the nitride semiconductor element which has a nitride semiconductor layer over an Si substrate, at least a portion of the Si substrate and the nitride semiconductor layer are included in an current pass region, and the majority carriers of the current pass region of the Si substrate are holes.

8 Claims, 17 Drawing Sheets

FOREIGN PATENT DOCUMENTS

| | | |
|---|---|---|
| JP | 9-213918 A | 8/1997 |
| JP | 10-107317 A | 4/1998 |
| JP | 10-200159 A | 7/1998 |
| JP | 11-40847 A | 2/1999 |
| JP | 11-54840 A | 2/1999 |
| JP | 11-224958 A | 8/1999 |
| JP | 11-243228 A | 9/1999 |
| JP | 11-251635 A | 9/1999 |
| JP | 2000-4047 A | 1/2000 |
| JP | 2000-31535 A | 1/2000 |
| JP | 2000-36617 A | 2/2000 |
| JP | 2000-82842 A | 3/2000 |
| JP | 2000-183325 A | 6/2000 |
| JP | 2000-269542 A | 9/2000 |
| JP | 2001-7395 A | 1/2001 |
| JP | 2001-7396 A | 1/2001 |
| JP | 2001-53338 A | 2/2001 |
| JP | 2001-223390 | 8/2001 |
| JP | 2001-308381 A | 11/2001 |
| JP | 2002-50790 A | 2/2002 |
| JP | 2002-170776 A | 6/2002 |
| JP | 2003-8061 A | 1/2003 |
| JP | 2003-60236 A | 2/2003 |
| JP | 2003-142729 A | 5/2003 |
| JP | 2003-179258 A | 6/2003 |
| JP | 2004-207763 A | 7/2004 |
| JP | 2005-347492 A | 12/2005 |
| JP | 2005-347493 A | 12/2005 |
| WO | WO 2005/029587 A1 | 3/2005 |
| WO | WO-2005/029588 A1 | 3/2005 |

\* cited by examiner

F I G. 1
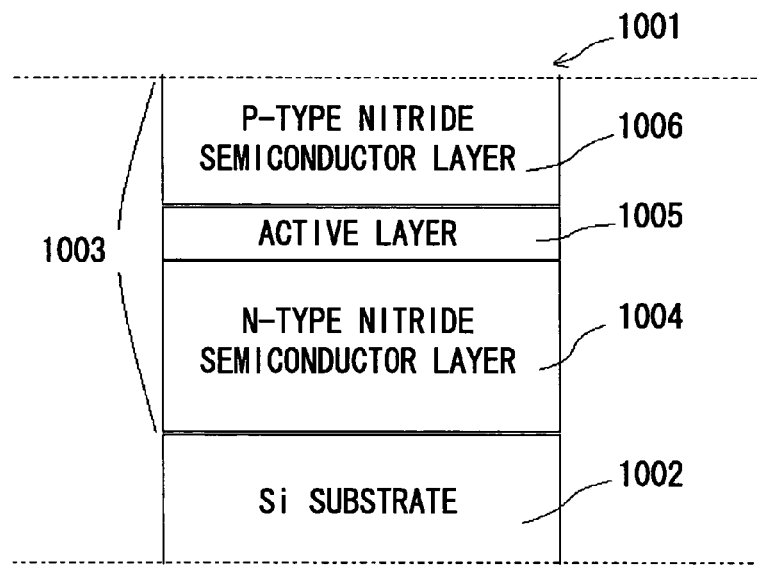
F I G. 2
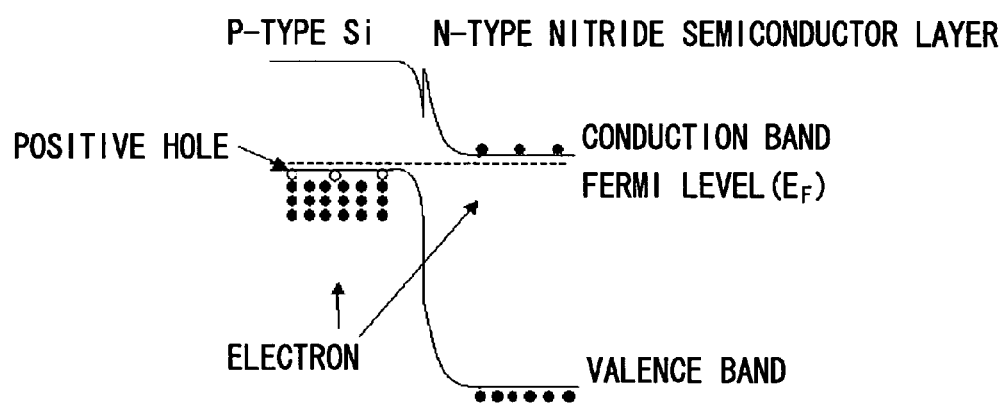
BOTH Si AND NITRIDE DEGENERATE AT JUNCTION F I G.3
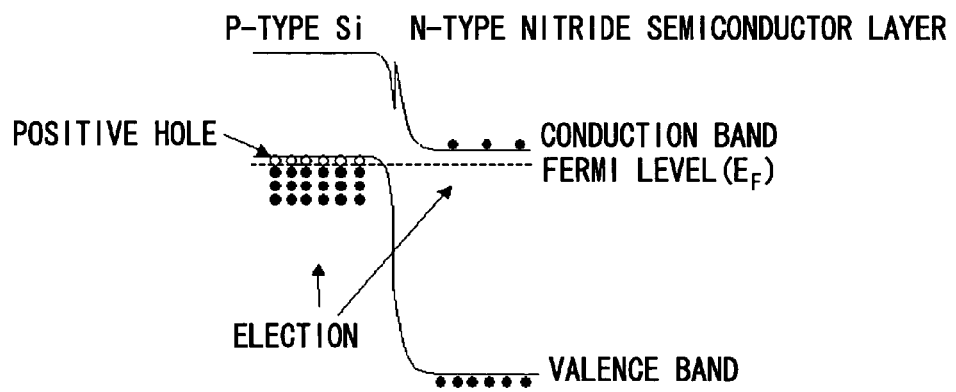
ONLY Si DEGENERATE AT JUNCTION
F I G.4
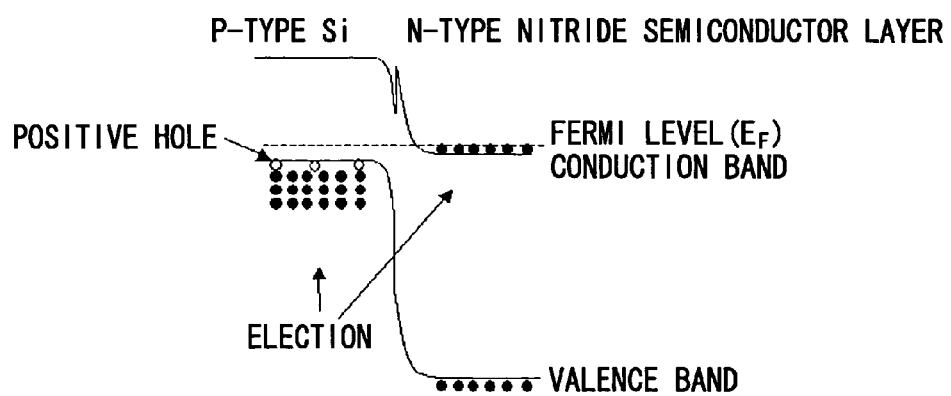
ONLY NITRIDE DEGENERATE AT JUNCTION Si AND NITRIDE BOTH DEGENERATE AT JUNCTION WHEN APPLIED IN LED FORWARD DIRECTION
(APPLIED IN OPPOSITE DIRECTION OF Si/NITRIDE INTERFACE)

F I G.1 2
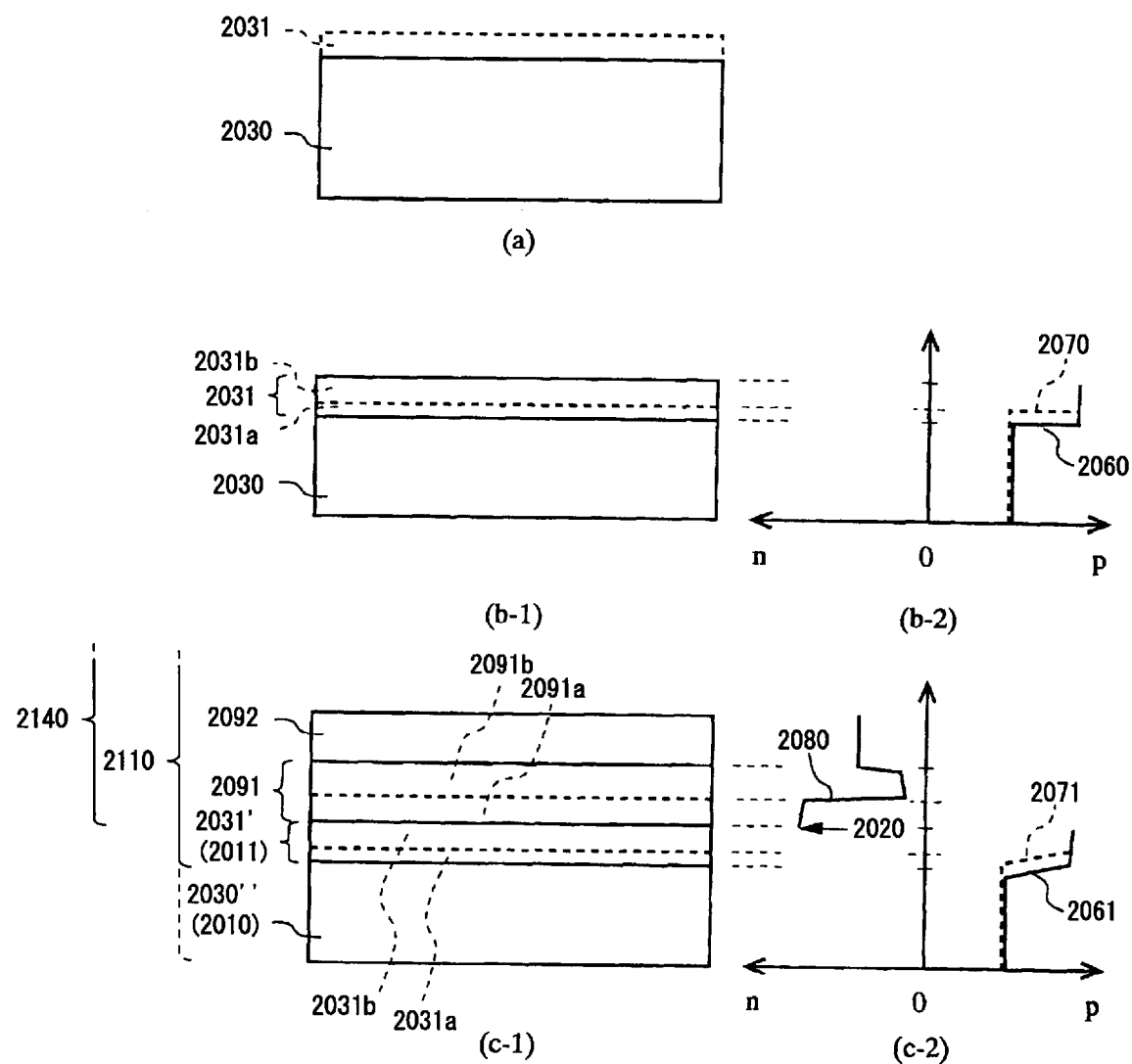

F I G. 1 4
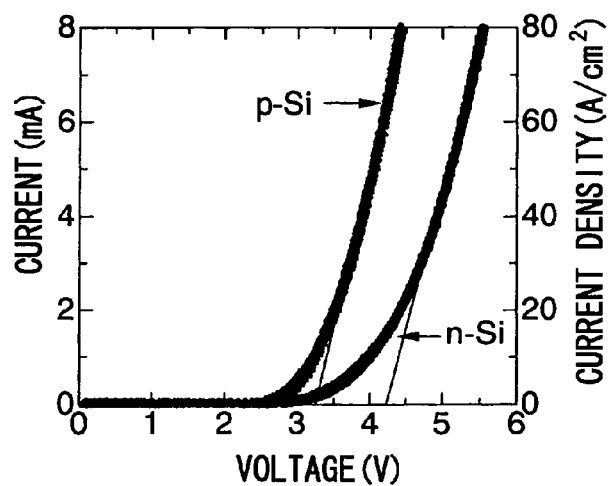
F I G. 1 5
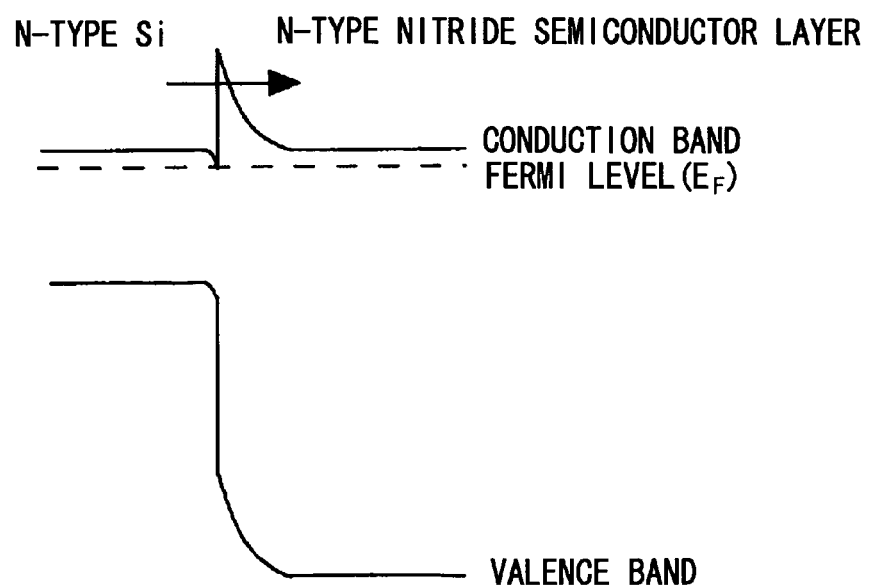

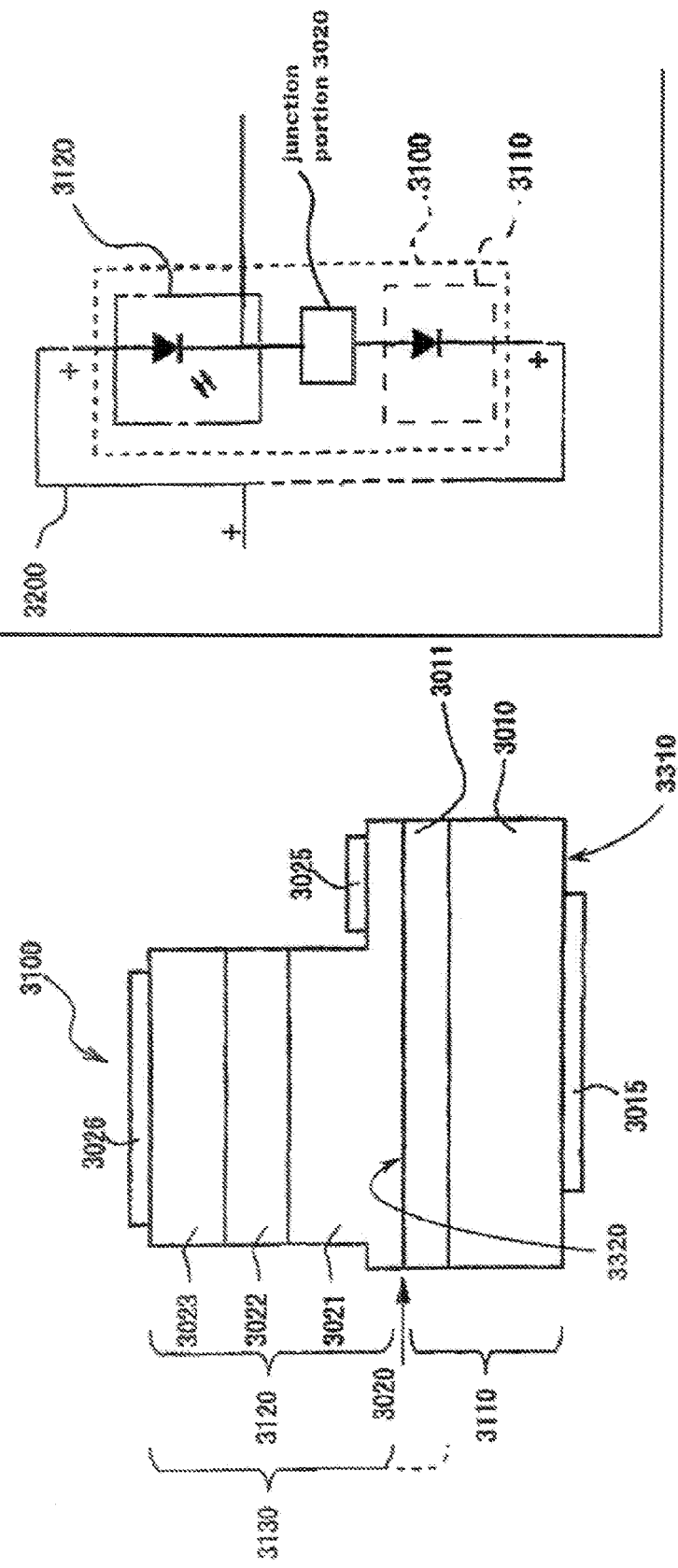
F I G. 16

F I G. 17A
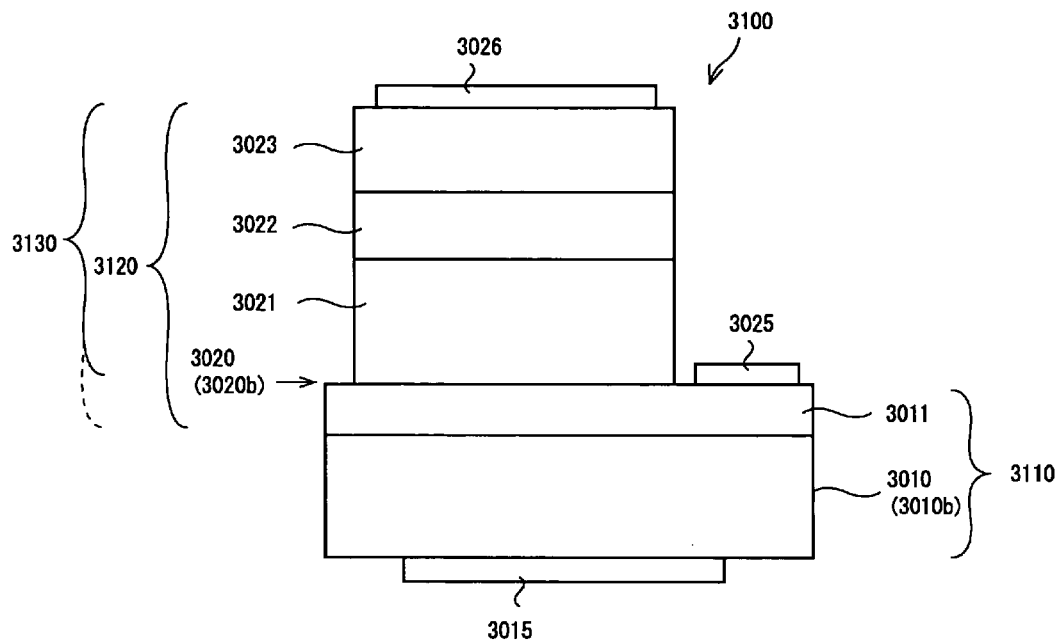
F I G. 17B
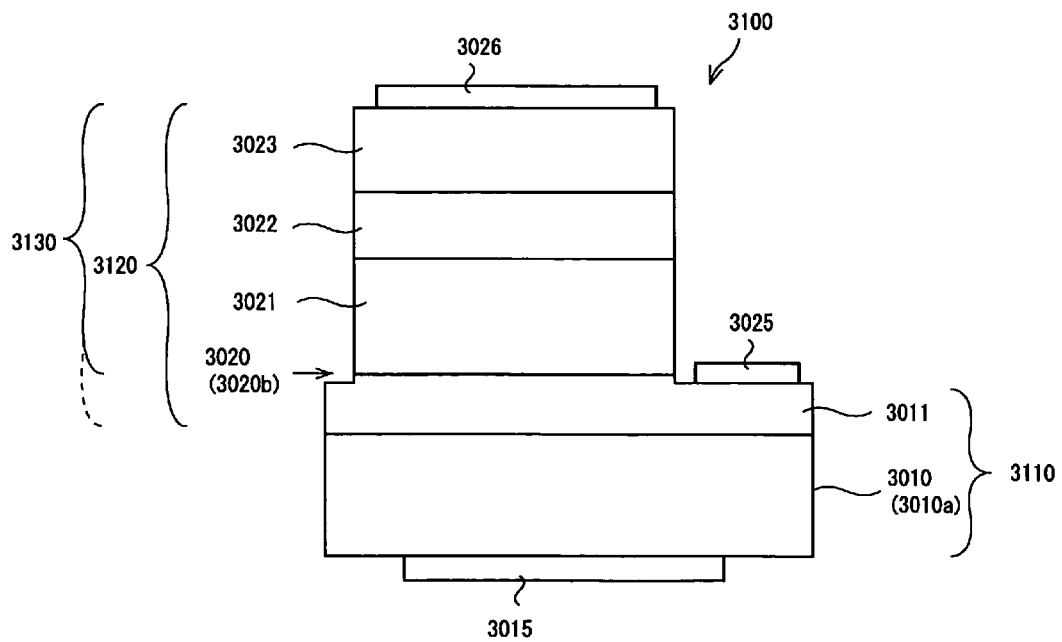

F I G. 1 8 A
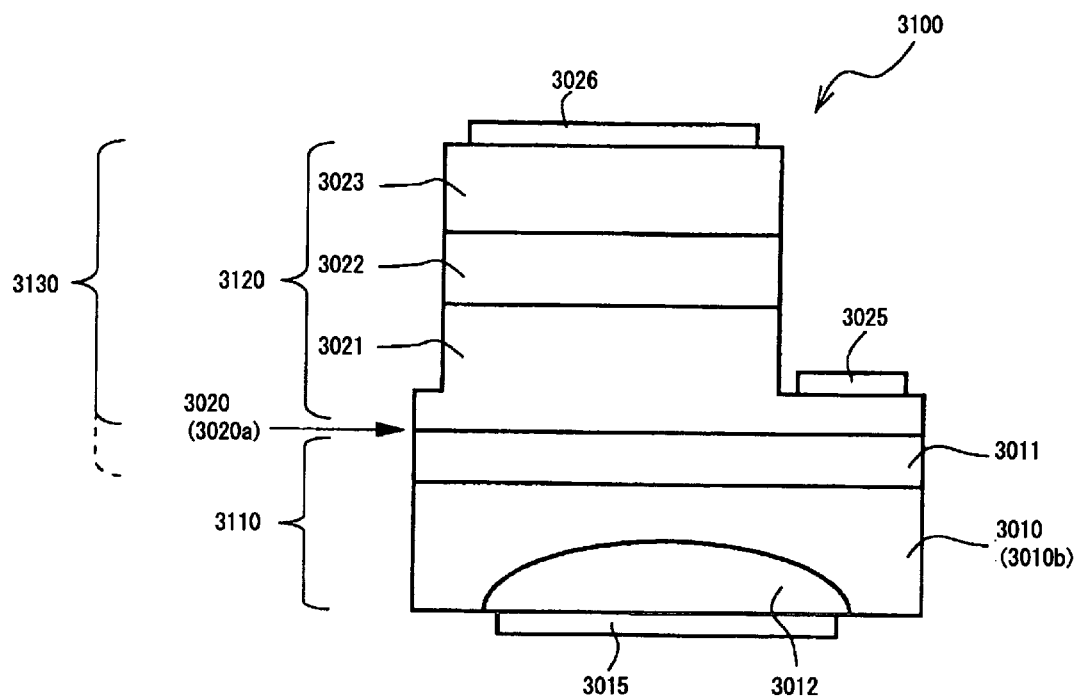
F I G. 1 8 B
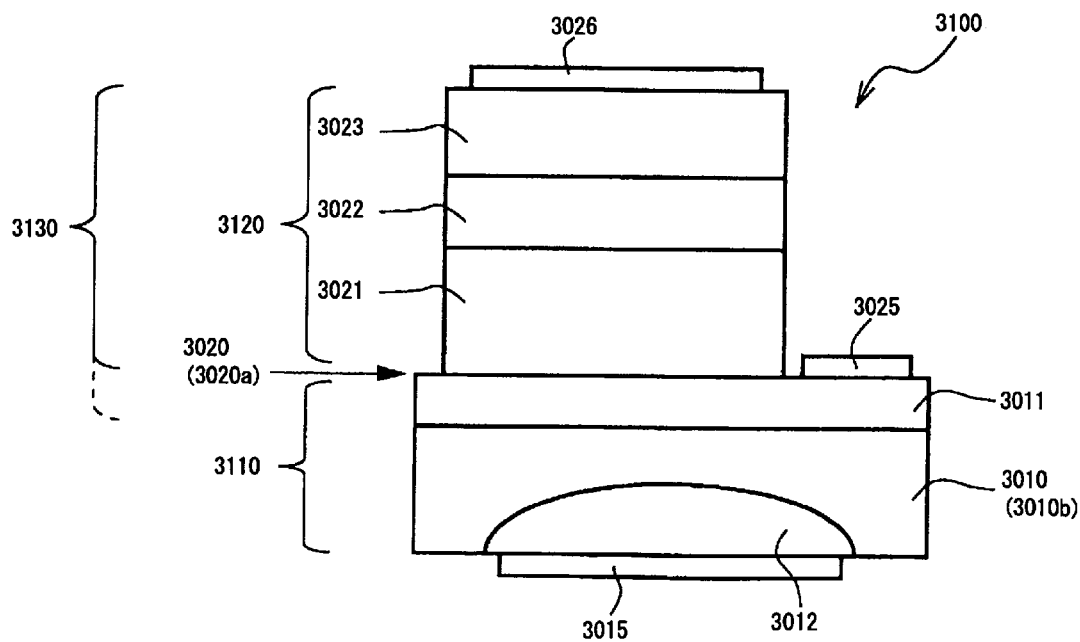

F I G. 2 4
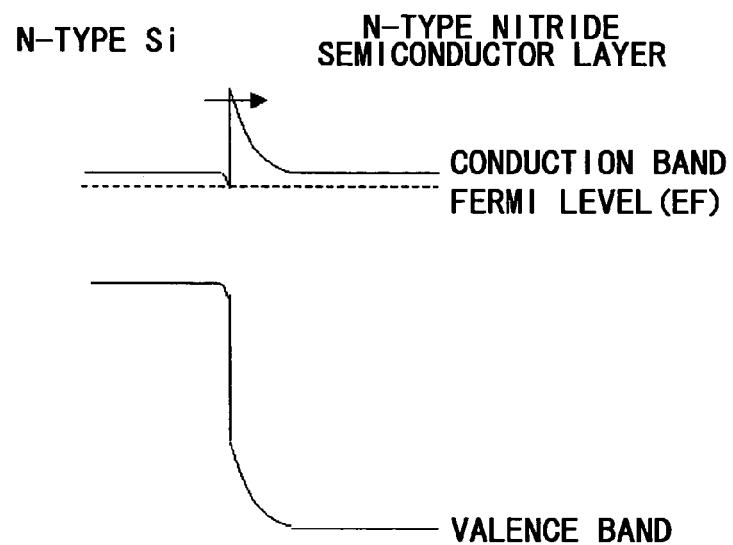
F I G. 2 5
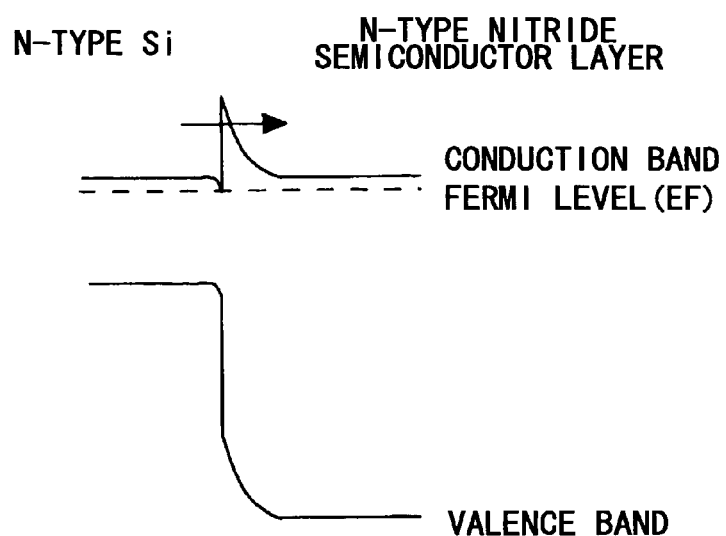

NITRIDE SEMICONDUCTOR ELEMENT HAVING A SILICON SUBSTRATE AND A CURRENT PASSING REGION

BACKGROUND OF THE INVENTION

1. Field of the Invention

The present invention relates to a semiconductor element, and in particular relates to a nitride semiconductor element.

2. Description of the Related Art

With a nitride semiconductor element, sapphire is often used for the substrate, but it becomes difficult to reduce the cost of the nitride semiconductor element when sapphire is used for the substrate, since sapphire is high in cost. Furthermore, since sapphire is an insulator, if it is used as the substrate, instead of providing electrodes on the rear surface of the substrate, it becomes necessary to expose a portion of the nitride semiconductor layer above the substrate, and to form the electrodes on this exposed portion (when this is done, the area of the nitride semiconductor element becomes greater, and it becomes difficult to reduce the cost). Thus, in the prior art, a nitride semiconductor element has been proposed (refer to Japanese Patent Laid-Open Publication 2003-179258, Japanese Patent Laid-Open Publication 2003-142729, and Japanese Patent Laid-Open Publication 2003-8061) in which an n-type nitride semiconductor layer and a p-type nitride semiconductor layer (or an active layer and a p-type nitride semiconductor layer) have been laminated in order over an n-type Si substrate. Furthermore, in Japanese Patent Laid-Open Publication 2003-8061 it is described that, if a p-type silicon substrate is employed, it is necessary to manufacture p-type and n-type nitride crystals in order, in order to make a semiconductor light emitting element. Moreover, since an Si substrate is cheaper in price, as compared with an SiC substrate which is more expensive than sapphire, nitride semiconductor elements have been proposed, as in Japanese Patent Laid-Open Publication 2003-179258 and Japanese Patent Laid-Open Publication 2003-8061, in which a nitride semiconductor layer is laminated over various types of Si substrate. Further, in Japanese Patent Laid-Open Publication 2003-8061, there is described the production of a semiconductor light emitting element by manufacturing, in order, an n-type and a p-type nitride semiconductor on an n-type silicon substrate.

It should be understood that it is proposed in PD (Japanese Patent Laid-Open Publication 2000-004047 etc.) to provide an integrated element on such an Si substrate by forming a GaN type light emitting element on the Si substrate.

Furthermore, a structure is proposed in Japanese Patent Laid-Open Publication 2002-050790 in which tunnel junctions are provided within the structure of the light emitting element.

Yet further, in Japanese Patent Laid-Open Publication Heisei 11-224958 it is proposed to manufacture a light emitting element in which a p-SiC layer is grown on a p-SiC substrate, and an InGaN active layer and an AlGaN cladding layer are further laminated thereon.

Even further, in Japanese Patent Laid-Open Publication 2000-031535 etc., a structure is proposed in which a n-GaN/active layer/p-GaN element structure is laminated on an Si substrate with the interposition of BP, Al, ZnO or the like.

Still further, in Japanese Patent Laid-Open Publication Heisei 8-236453, as a method for crystal growth of a compound semiconductor using an Si substrate, it is proposed to form a p-type impurity doping layer over the Si substrate, and to grow a p-type epitaxial layer of gallium arsenide or the like over the p-type impurity doping layer.

Furthermore, in the prior art, in order to prevent the occurrence of cracks, buffering of the following type has been proposed (refer to Japanese Patent Laid-Open Publication 2002-170776). In detail, a thin film of AlN is grown as a first initial layer on a substrate consisting of 6H—SiC (0001), and $Al_{0.15}Ga_{0.75}N$ which has been grown at a layer thickness of 200 nm as a second initial layer over this AlN thin film which constitutes the first initial layer is the buffer (refer to paragraph [0035] and FIG. 1 of Japanese Patent Laid-Open Publication 2002-170776). The fact that Si can be used as a substrate is described in this Japanese Patent Laid-Open Publication 2002-170776. Furthermore, in this Japanese Patent Laid-Open Publication 2002-170776, an invention is described in which a superlattice structure is formed by alternately laminating a first layer and a second layer a predetermined number of times on a substrate which consists of Si (silicon), SiC (silicon carbide), $Al_2O_3$ (sapphire) or the like.

An integrated element has also been proposed in which a GaN type light emitting element is formed on an Si substrate by providing MOS (refer to Japanese Patent Laid-Open Publication Heisei 7-321051) or PD (refer to Japanese Patent Laid-Open Publication 2000-004047) or the like on the Si substrate.

Furthermore, in Japanese Patent Laid-Open Publication 2002-050790, a structure is proposed in which tunnel junctions are provided within a light emitting element structure of the same type of material.

Moreover, in Japanese Patent Laid-Open Publication Heisei 11-224958, a light emitting element structure is proposed in which a p-SiC layer is grown on a p-SiC substrate, and then an InGaN active layer and an AlGaN cladding layer are laminated thereover.

However, in Japanese Patent Laid-Open Publication 2003-179258, Japanese Patent Laid-Open Publication 2003-142729, and Japanese Patent Laid-Open Publication 2003-8061, with an Si substrate and a nitride semiconductor layer, it is considered that, at their junction as shown in FIG. 24, a high electrical potential barrier is present at the interface between them; and accordingly, with the above described nitride semiconductor element, there has been the problem that the voltage (Vf) in the forward direction is extremely high.

Furthermore although, as in Japanese Patent Laid-Open Publication 2000-004047 etc., there is a method of providing a LED element by forming a diffuse layer or the like on an Si substrate, and by making a light receiving element or the like by forming a p-n junction and by laminating it on this substrate, however, with these hetero-junction interfaces between the Si substrate and the compound semiconductor of the LED element, it is not possible to implement a junction which is appropriate for the operation of the element, so that it has been difficult to drive both of the elements (the Si substrate and the LED element) sufficiently. In concrete terms, with these hetero-junction interfaces, it becomes difficult to plan sufficient matching for the bands etc., due to the band offset at these interfaces, and moreover when bias is applied. Furthermore, when growing a GaN type semiconductor on several different types of material surfaces, problems arise of crystalline deterioration due to non-matching of the lattices, differences in the coefficients of thermal expansion, and the like, so that, due to this as well, the above described problems at the junction portions between the different types of material are promoted and become worse. In addition, when the Si substrate surface at the junction portion with the GaN layer is an impurity diffusion region or the like, that region undergoes crystalline deterioration, and it is considered that the problems like those described above in growing the GaN layer thereon become yet more acute at the hetero-junction interface.

In Japanese Patent Laid-Open Publication 2002-050790 etc., a method is proposed of, at a p-n junction of a LED element, interposing a layer of an oppositely electrically conductive type in one of the p side and n side regions, thus causing tunneling at this junction, and supplying both p side and n side electric charges and injecting them into the light emitting layer. However, this is done with the objective of forming both the anode and cathode electrodes on the same conductive layer from the same material and by the same process, and so on.

In Japanese Patent Laid-Open Publication Heisei 11-224958, a device is proposed in which a LED element structure is formed from a SiC substrate, a SiC layer thereover, and a GaN type layer over that; but, since a p-n junction made with an interface between different materials is provided within this LED structure, a barrier occurs between the bands at this hetero-material interface, so that it is difficult to obtain a satisfactory LED element. Furthermore, with a light emitting element, the p-n junction is the most important portion in terms of determining its overall performance, and the decrease in performance of the light emitting element becomes rather acute due to the provision of a hetero-junction interface at this portion.

In Japanese Patent Laid-Open Publication 2000-031535 it is proposed, in order to form a light emitting element structure with a GaN type semiconductor on a Si substrate, to interpose various different types of material (BP, ZnO, $SiO_2$), but the same type of problem as that described above occurs, since this material has a hetero-junction interface with both the Si substrate and the GaN layer.

Furthermore, with the buffer of Japanese Patent Laid-Open Publication 2002-170776, the crystalline characteristics of the nitride semiconductor layer which is formed on the Si substrate do not become adequate. Furthermore, in particular, if a nitride semiconductor layer is formed on a Si substrate, there is a tendency for it to be difficult to obtain a nitride semiconductor layer of good crystalline characteristics. Due to this, with the superlattice structure of the above described Japanese Patent Laid-Open Publication 2002-170776, in the case of forming, in particular, a nitride semiconductor layer while using a Si substrate as the substrate, it is the current situation that it is not possible to obtain a nitride semiconductor layer whose crystalline characteristics are as good as before.

With the above described integrated element, for example in Japanese Patent Laid-Open Publication Heisei 7-321051, in order to arrange a LED portion and a MOS portion within the surface of the substrate, the manufacturing cost becomes high, since the area per one element becomes large. On the other hand, with such an element which is integrated within the substrate surface, since there is a necessity for wiring up each element portion, a lot of man-hours are required, and the manufacturing cost is also increased thereby. Furthermore, since the area ratio which is occupied by the light emitting portion within the surface is low, when implementing a light emitting device or the like, the size of the light emitting portion is small in comparison with the implementation area for the element, so that it is difficult to obtain a satisfactory light output. Yet further, in order to arrange the LED portion and the MOS portion within the surface of the substrate, limitations arise with regard to the position of the LED within the surface of the element, in other words with regard to the position of the light source, and, in the implementation of a light emitting device or the like, position adjustment of a point light source becomes difficult, and in addition the optical design of the reflecting plate for the light emitting device becomes difficult, so that it is difficult to obtain a light emitting device with a suitable light output.

On the other hand, as another example of the above described integrated element, there is a method, as described in Japanese Patent Laid-Open Publication 2000-004047 etc., of making a p-n junction by diffusing a layer into a Si substrate, and thereby forming a light receiving element or the like, and of laminating on this substrate, thus providing a LED element; but it is not possible to implement an appropriate junction for element operation at the hetero-junction interface between the Si substrate and the semiconductor compound of the LED element, and it has been difficult to drive each of the elements (the Si substrate and the LED element) sufficiently. In concrete terms, with a hetero-junction interface, it becomes difficult to plan on sufficient matching of the band offset and so on at this interface, and further to plan for sufficient matching of the bands etc. when they are biased. According to considerations by the present inventors, since, as shown in FIG. 25, at the junction between the Si substrate and the nitride semiconductor layer, a high electrical potential barrier is present between both of them where they are joined (i.e. at the interface), it has been realized that there is a problem, in the above described prior art type of nitride semiconductor element which uses a Si substrate, with regard to the fact that the voltage in the forward direction (Vf) is extremely high. Thus it is an object of the present invention, according to one aspect thereof, to provide a semiconductor element, using Si for its substrate, whose voltage in the forward direction (Vf) at such an Si/GaN hetero-junction is lower than in the prior art.

Furthermore, in Japanese Patent Laid-Open Publication Heisei 9-213918, it is disclosed, by laminating a semiconductor layer (p-type or n-type) of the same type of material (a GaN type semiconductor compound) on the substrate, separating the surface by a groove or the like, and combination of the exposed layer (the electrode formation layer), to use, on the one hand a LED, and on the other hand a protection and compensation diode; but, in this case, the protective element and the light emitting element are laminated on the substrate using the same type of material, and are integrated together, and, since they are formed from the same type of material, there is a tendency for it to be difficult to bring out sufficiently the characteristics of each element, and in particular of the protective element. Furthermore, since they are integrated within the surface, in the same way as described above, there are problems with regard to light output, and with regard to the implementation and the manufacturing cost of such a light emitting device.

In Japanese Patent Laid-Open Publication 2002-050790 etc., a method is provided of, at a p-n junction of a LED element, interposing an oppositely conductive layer at one of the p side and the n-side region, causing tunneling at this junction, supplying both p side and n side electric charges, and injecting them into the light emitting layer. However, this is with the object of, in a semiconductor light emitting structure of one type of material, forming both the anode and the cathode in the same conductive layer from the same material and by the same process.

In Japanese Patent Laid-Open Publication Heisei 11-224958, it is proposed to form a LED element structure from a SiC substrate, a SiC layer over it, and a GaN type layer over that; but, since a hetero-material interface is provided within this LED structure, a barrier between bands occurs at the above described hetero-material interface, and it is difficult to obtain a suitable LED element.

Thus, the present invention takes as its object to provide a nitride semiconductor element which uses Si as a substrate, whose voltage in the forward direction (Vf) is lower than in the prior art.

SUMMARY OF THE INVENTION

In considerations by the present inventors, at the junction between the Si substrate and the nitride semiconductor layer, as shown in FIG. 24, it is considered that a high electrical potential barrier is present between the two materials which are joined together (at their interface), and it has been discovered that, in the above described prior art nitride semiconductor element using a Si substrate, there is the problem that the voltage in the forward direction (Vf) is very high. Thus, according to one aspect of the present invention, it is an object thereof to provide a semiconductor element, using Si for its substrate, whose voltage in the forward direction (Vf) at such an Si/GaN hetero-junction is lower than in the prior art.

According to the present invention, the above described problems are solved by the following means.

A first invention is a nitride semiconductor element comprising a nitride semiconductor layer over an Si substrate, wherein: at least a portion of the Si substrate and the nitride semiconductor layer are included in an current pass region; and the electrical conductivity type of the current pass region on the Si substrate is p-type.

With this first invention, the type of the electrical conductivity of the portion on the Si substrate which constitutes the current pass region is p-type, and, by doing this, with this nitride semiconductor element which uses Si as its substrate, it becomes possible to flow a larger current with a smaller voltage than in the prior art, so that it becomes possible to reduce the voltage in the forward direction (Vf) by comparison with the prior art.

Also, a first invention is a nitride semiconductor element comprising a nitride semiconductor layer over an Si substrate, wherein: at least a portion of the Si substrate and the nitride semiconductor layer are included in an current pass region; and the majority carriers of the current pass region on the Si substrate are holes.

With this first invention, the majority carriers of the portion which constitutes the current pass region within the Si substrate are made to be holes, and, by doing this, with this nitride semiconductor element which uses Si as its substrate, it becomes possible to flow a larger current with a smaller voltage than in the prior art, so that it becomes possible to reduce the voltage in the forward direction (Vf) by comparison with the prior art.

A second invention is the nitride semiconductor element according to the first invention, wherein the hole density of the current pass region on the Si substrate is greater than or equal to approximately $1 \times 10^{18}$ cm$^{-3}$ and less than or equal to approximately $1 \times 10^{21}$ cm$^{-3}$.

With this second invention, the hole density of the portion on the Si substrate which constitutes the current pass region is greater than or equal to approximately $1 \times 10^{18}$ cm$^{-3}$ and less than or equal to approximately $1 \times 10^{21}$ cm$^{-3}$; and, by doing this, with this nitride semiconductor element which uses Si as its substrate, it becomes possible further to reduce the voltage in the forward direction (Vf).

A third invention is the nitride semiconductor element according to the first invention, wherein the impurity density of the current pass region on the Si substrate is greater than or equal to approximately $1 \times 10^{18}$ cm$^{-3}$ and less than or equal to approximately $1 \times 10^{22}$ cm$^{-3}$.

With this third invention, the impurity density of the portion on the Si substrate which constitutes the current pass region is greater than or equal to approximately $1 \times 10^{18}$ cm$^{-3}$ and less than or equal to approximately $1 \times 10^{22}$ cm$^{-3}$; and, by doing this, with this nitride semiconductor element which uses Si as its substrate, it becomes possible further to reduce the voltage in the forward direction (Vf).

A fourth invention is the nitride semiconductor element according to the first invention, wherein the specific resistance of the current pass region on the Si substrate is less than or equal to approximately 0.05 Ωcm.

With this fourth invention, since the specific resistance of all or of a portion which constitutes the current pass region on the Si substrate is less than or equal to approximately 0.05 Ωcm, accordingly, with this nitride semiconductor element which uses Si as its substrate, it becomes possible further to reduce the voltage in the forward direction (Vf).

A fifth invention is the nitride semiconductor element according to the first invention, wherein the nitride semiconductor layer comprises an n-type nitride semiconductor layer and a p-type nitride semiconductor layer in that order from the Si substrate, and the n-type nitride semiconductor layer contacts the current pass region of the Si substrate.

According to this fifth invention, by making this nitride semiconductor element to include, in order, on a Si substrate, an n-type nitride semiconductor layer and a p-type nitride semiconductor layer, or an n-type nitride semiconductor layer, an active layer, and a p-type nitride semiconductor layer, it becomes possible to reduce the voltage in the forward direction (Vf) by comparison with a nitride semiconductor element of the prior art.

A sixth invention is the nitride semiconductor element according to the fifth invention, wherein at least the side of the n-type nitride semiconductor layer which is the closest to the Si substrate is an n-type GaN layer.

According to this sixth invention, by the n-type nitride semiconductor layer which contacts the Si substrate including an n-type GaN layer, it becomes possible to obtain a nitride semiconductor element in which the voltage in the forward direction (Vf) is lower, by comparison with that in the prior art.

An seventh invention is the nitride semiconductor element according to the fifth invention, wherein the electron density of the n-type nitride semiconductor layer which contacts the current pass region of the Si substrate is greater than or equal to approximately $1 \times 10^{17}$ cm$^{-3}$ and less than or equal to approximately $1 \times 10^{21}$ cm$^{-3}$.

With this seventh invention, the electron density of the n-type nitride semiconductor layer which contacts the current pass region of the Si substrate is greater than or equal to approximately $1 \times 10^{17}$ cm$^{-3}$ and less than or equal to approximately $1 \times 10^{21}$ cm$^{-3}$; and, if this is done, with this nitride semiconductor element which uses Si as its substrate, it becomes possible to reduce the voltage in the forward direction (Vf).

A eighth invention is the nitride semiconductor element according to the fifth invention, wherein the n-type impurity density of the n-type nitride semiconductor layer which contacts the current pass region of the Si substrate is greater than or equal to approximately $1 \times 10^{17}$ cm$^{-3}$ and less than or equal to approximately $1 \times 10^{22}$ cm$^{-3}$.

With this eighth invention, the n-type impurity density of the n-type nitride semiconductor layer which contacts the current pass region of the Si substrate is greater than or equal to approximately $1 \times 10^{17}$ cm$^{-3}$ and less than or equal to approximately $1 \times 10^{22}$ cm$^{-3}$; and, if this is done, with this nitride semiconductor element which uses Si as its substrate, it becomes possible to reduce the voltage in the forward direction (Vf).

A ninth invention is the nitride semiconductor element according to the first invention, wherein the Si substrate makes contact with the nitride semiconductor layer so that carriers pass due to the tunneling effect.

An tenth invention is the nitride semiconductor element of the first invention, wherein the Si substrate and the nitride semiconductor layer are degenerate.

When the present invention has been applied, it has been checked, on an experimental basis, that the voltage in the forward direction (Vf) is lower than in the prior art, but the theoretical reason for this experimental fact is far from clear. However, the following hypothesis will be recounted in an attempt at a theoretical explanation of the present invention. Since the following discussion has only the status of a hypothesis, it need scarcely be the that, in the following explanation, nothing should be taken as being in any way limitative of the present invention.

In the present invention, the type of electrical conductivity of the current pass region on the Si substrate is made to be p-type, and moreover, from the aspect of the carriers, the majority carriers of the current pass region on the Si substrate are made to be holes. When this is done, the Fermi level of the current pass region on the Si substrate becomes close to the valence band. When this is shown on an energy band diagram of the Si substrate, the nitride semiconductor layer, and the junction interface, it is considered to be like FIG. 2. By performing further high density doping, the situation comes to be like the one shown in FIG. 3, in which all or a part thereof degenerates, and the Fermi level comes to be present within the valence band. Moreover, when a large number of electrons are present in the current pass region of the nitride semiconductor layer, the Fermi level of the current pass region of the nitride semiconductor layer becomes close to the conduction band. It is considered that, in the same manner, this happens with an energy band diagram like the one shown in FIG. 2, and, by further high density doping, as shown in FIG. 4, the situation degenerates and the Fermi level comes to be within the conduction band. And, when on the Si substrate side, the Fermi level is present within the valence band, and on the nitride semiconductor layer side the Fermi level is present within the conduction band, the situation becomes as shown in FIG. 5. With the present invention, when a voltage in the forward direction (Vf) is applied to the nitride semiconductor element, since a reverse bias is applied to the Si/nitride semiconductor layer junction surface, the valence band in the current pass region of the Si substrate becomes higher than the conduction band in the current pass region of the nitride semiconductor layer, and moreover the depletion layer which has been formed at the junction portion becomes narrow. When this is shown in a figure, the situation is like the one shown in FIG. 6, and it is considered that, due to this, a large number of electrons in the valence band of the Si substrate tunnel through the narrow depletion layer and are injected into the conduction band of the nitride semiconductor layer. It is considered that, due to this, according to the present invention, with a nitride semiconductor element which uses Si as a substrate, since it is possible to flow a large current with a smaller voltage than in the prior art, it becomes possible for the voltage in the forward direction (Vf) to be lower than in the prior art. Although an n-type GaN layer has been used by way of example as the n-type nitride semiconductor layer in FIGS. 2 to 6 which, here, have been used as energy band diagrams, this is shown as a preferred embodiment, and the n-type nitride semiconductor layer which is the nearest one to the Si substrate is not to be considered as being limited to being such a layer; it would also be possible to utilize an n-type AlInGaN layer. However, it is desirable to utilize an n-type $Al_aGa_{1-a}N$ layer (where $0 \leq a \leq 0.5$), from the aspect of being able, above all, to form the layer with good crystalline characteristics. Furthermore, most desirably, an n-type GaN layer which is a binary mixed crystal should be employed.

As for the current pass region in the present invention, this is the region which determines the basic structure of the nitride semiconductor element, and it is the region which current passes through when a voltage is applied to the element between its positive electrode and its negative electrode. Accordingly, for example, the region in which negative electric charges shift (the negative electric charge shifting region) is included within the current pass region.

Furthermore, in the third invention and the fourth invention described above, the energy position of the valence band of the Si becomes relatively high, and moreover, when a current is applied, the depletion layer between the Si substrate and the nitride semiconductor layer becomes thin. And it is considered that the Fermi level comes to be present at a lower position within the valence band, so that a larger number of electrons come to be injected into the nitride semiconductor layer from the Si substrate, whereby it becomes possible to make the voltage in the forward direction (Vf) lower.

Yet further, in the eighth invention and the ninth invention described above, the energy position of the conduction band of the nitride semiconductor layer becomes relatively low, and moreover, when a current is applied, the depletion layer between the Si substrate and the nitride semiconductor layer becomes thin. And it is considered that the Fermi level comes to be present at a higher position within the valence band, so that a larger number of electrons come to be injected into the nitride semiconductor layer from the Si substrate, whereby it becomes possible to make the voltage in the forward direction (Vf) lower.

A eleventh invention is the nitride semiconductor element according to the first invention, wherein the I-V characteristic of the interface between the Si substrate and the nitride semiconductor layer is approximately linear.

With this eleventh invention, the I-V characteristic of the interface between the Si substrate and the nitride semiconductor layer becomes approximately linear; and, since the ohmic characteristic is satisfactory, with this nitride semiconductor element, it becomes possible to lower the voltage in the forward direction (Vf).

A twelfth invention is the nitride semiconductor element according to the first invention, wherein an active layer which can emit light or receive light is included in the nitride semiconductor layer.

According to this twelfth invention, in this nitride semiconductor element of a double hetero structure, it becomes possible to lower the voltage in the forward direction (Vf) by comparison with the prior art.

A thirteenth invention is the nitride semiconductor element according to the first invention, further comprising a positive electrode and a negative electrode, and wherein the positive electrode contacts a p-type nitride semiconductor layer which is included in the nitride semiconductor layer; and the negative electrode contacts the Si substrate.

According to this thirteenth invention, since the negative electrode contacts the Si substrate, accordingly it is possible for the position of formation of this negative electrode to be made to be any of various positions: the negative electrode may be formed on the surface opposite to the positive electrode, or on a vertical surface facing the positive electrode, or the like, so that it is possible to make a nitride semiconductor element of a shape which corresponds to the demand.

A fourteenth invention is the nitride semiconductor element according to the thirteenth invention, wherein the positive electrode and the negative electrode are provided on opposite surfaces.

According to this fourteenth invention, it becomes possible to make the nitride semiconductor element more compact, as compared to the case in which the positive electrode and the negative electrode are both provided on the same surface. Moreover although, if the negative electrode is provided on the same surface as the positive electrode, the electrons shift in both the vertical direction and in the horizontal direction, when these two cases are compared, since according to this fifteenth invention the electrons come to shift only in the vertical direction, the efficiency is greater than in the case when the positive electrode and the negative electrode are both provided on the same surface.

Moreover, it is also possible to form the negative electrode on the Si substrate on the same surface side as the positive electrode, and, in this case, as compared with the prior art case in which the n-type nitride semiconductor layer surface was exposed for the provision of the negative electrode, it becomes possible to make the layer thickness of the n-type nitride semiconductor layer thinner, since a certain layer thickness was required for such exposure. By making the layer thickness of the n-type nitride semiconductor layer thinner, it is possible further to reduce Vf, and moreover it becomes possible to reduce the cost of manufacture.

A fifteenth invention is the nitride semiconductor element according to the first invention, further comprising a positive electrode and a negative electrode, and wherein the positive electrode contacts a p-type nitride semiconductor layer which is included in the nitride semiconductor layer; and the negative electrode contacts an n-type nitride semiconductor layer which is included in the nitride semiconductor layer.

According to this fifteenth invention, it is possible to obtain an nitride semiconductor element of a structure in which the negative electrode is provided on the same surface side as the positive electrode. Furthermore, if the negative electrode is provided on the same surface side as the positive electrode in this manner, although the negative electrode formation surface is exposed by, for example, reactive ion etching (RIE) from the side of the p-type nitride semiconductor layer, when the negative electrode formation surface is an n-type nitride semiconductor layer, it is not necessary to change the gas which is used for the RIE, so that the manufacturing efficiency is enhanced.

A sixteenth invention is the nitride semiconductor element according to the thirteenth invention, wherein the positive electrode and the negative electrode are provided on surfaces on the same side.

According to this sixteenth invention, with a nitride semiconductor element which is made with a nitride semiconductor element structure on an insulating substrate such as for example sapphire or the like, since an element in which the negative electrode is on the same surface side as the positive electrode is in general use, it becomes simple and easy to replace a light emitting device or the like in which this element is used, and moreover the heat radiation characteristic is enhanced to a greater extent than in the case in which a sapphire substrate is used, and furthermore it also becomes possible to append functions to a separate Si substrate, by which electrical effects are obtained, and the like.

An seventeenth invention is the nitride semiconductor element according to the first invention, wherein the Si substrate includes a p-type impurity in at least its current pass region, and wherein the p-type impurity is desirably an element of the group 13 of the periodic table, and, more desirably, is at least one of boron or aluminum.

According to the invention described above, it is desirably possible to utilize an element of the group 13 of the periodic table as the p-type impurity in all or a portion of the current pass region of the Si substrate. In particular, it is desirable to utilize at least one of boron or aluminum; and, by using one at least of these substances, it is possible to supply electrons for the nitride semiconductor element in an appropriate manner from the negative electrode.

A eighteenth invention is the nitride semiconductor element according to the first invention, wherein the Si substrate contacts, at a (111) surface thereof, an (0001) surface of the nitride semiconductor layer.

According to this eighteenth invention, it is possible to reduce the lattice constant difference between the Si substrate and the nitride semiconductor layer, so that it is possible to suppress the number of dislocations due to disagreement of the lattice constants to the minimum possible.

According to the inventions described above, in a nitride semiconductor element using Si as a substrate, it becomes possible to reduce the voltage in the forward direction (Vf) to a lower level than in the prior art.

A ninteenth invention is a nitride semiconductor element comprising a nitride semiconductor layer over an Si substrate, further comprising an Si crystalline layer whose p-type impurity density is higher than that of the Si substrate, and, as the nitride semiconductor layer, an n-type nitride semiconductor layer contacting on the Si crystalline layer.

It should be understood that, for example, with a nitride semiconductor element which has a nitride semiconductor layer over a Si substrate, at least a portion of the Si substrate and the nitride semiconductor layer are included in an current pass region, and, if the type of electrical conductivity of the current pass region on the Si substrate is p-type, by having, as the nitride semiconductor layer, an n-type nitride semiconductor layer which has a Si crystalline layer whose p-type impurity density is larger than that of the Si substrate, and by contacting on the Si crystalline layer, it is possible to make the type of electrical conductivity of the current pass region on the Si substrate be p-type. Furthermore with, for example, a nitride semiconductor element which has a nitride semiconductor layer over a Si substrate, at least a portion of the Si substrate and the nitride semiconductor layer are included in an current pass region, and, if the majority carriers of the current pass region on the Si substrate are holes, by having, as the nitride semiconductor layer, an n-type nitride semiconductor layer which has a Si crystalline layer whose p-type impurity density is larger than that of the Si substrate, and by contacting on the Si crystalline layer, then it is possible to make the majority carriers in the current pass region on the Si substrate be holes.

Also, a ninteenth invention is a nitride semiconductor element comprising a nitride semiconductor layer over an Si substrate, further comprising, at a junction portion between the Si substrate and the nitride semiconductor layer and in a neighborhood region thereof, an Si layer or an Si region having a higher p-type impurity density than that of the substrate side region outside the junction portion neighborhood region, and an n-type nitride semiconductor layer having a higher n-type impurity density than that of the nitride semiconductor region outside the junction portion neighborhood region.

It should be understood that with, for example, a nitride semiconductor element which has a nitride semiconductor layer over a Si substrate, if at least a portion of the Si substrate and the nitride semiconductor layer are included in the current pass region, and the type of electrical conductivity of the current pass region on the Si substrate is the p-type, then, at the junction portion between the Si substrate and the nitride semiconductor layer and in the neighborhood region thereof, by providing an Si layer or Si region which has a p-type impurity density which is higher than that of the region on the substrate side outside the junction portion neighborhood region, and an n-type nitride semiconductor layer which has an n-type impurity density which is higher than that of the nitride semiconductor region outside the junction portion neighborhood region, it is possible to make the type of electrical conductivity of the current pass region on the Si substrate be p-type. Furthermore, for example, with a nitride semiconductor element which has a nitride semiconductor layer over a Si substrate, if at least a portion of the Si substrate and the nitride semiconductor layer are included in the current pass region, and the majority carriers of the current pass region on the Si substrate are holes, then, at the junction portion between the Si substrate and the nitride semiconductor layer and in the neighborhood region thereof, by providing an Si layer or an Si region which has a p-type impurity density which is higher than that of the region on the substrate side outside the junction portion neighborhood region, and an n-type nitride semiconductor layer which has an n-type impurity density which is higher than that of the nitride semiconductor region outside the junction portion neighborhood region, it is possible to make the majority carriers of the current pass region on the Si substrate be holes.

A twentieth invention is the nitride semiconductor element according to the nineteenth invention, wherein the Si layer or Si region and the n-type nitride semiconductor layer are provided in an n-type conductive region.

A twenty-first invention is the nitride semiconductor element according to the nineteenth invention, wherein the nitride semiconductor element has a light emitting element structure comprising an active layer of nitride semiconductor between an n-type region comprising the Si layer or Si region and the n-type nitride semiconductor layer, and a p-type region comprising a p-type nitride semiconductor layer.

A twenty-second invention is a nitride semiconductor element comprising an element structure including a nitride semiconductor layer over an Si substrate, wherein a first conductive region of the element structure comprises a Si layer on the Si substrate or a Si region on the Si substrate surface, and a nitride semiconductor layer thereover.

It should be understood that, with for example a nitride semiconductor element which has a nitride semiconductor layer over a Si substrate, if at least a portion of the Si substrate and the nitride semiconductor layer are included in an current pass region, and the type of electrical conductivity of the current pass region on the Si substrate is p-type, then it is desirable for a first conductive region of an element structure which includes a nitride semiconductor layer on the Si substrate to include an Si layer over the Si substrate or an Si region of the Si substrate surface side, and a nitride semiconductor layer thereover. Furthermore, for example, with a nitride semiconductor element which has a nitride semiconductor layer over a Si substrate, if at least a portion of the Si substrate and the nitride semiconductor layer are included in an current pass region, and the majority carriers of the current pass region on the Si substrate are holes, then it is desirable for a first conductive region of an element structure which includes a nitride semiconductor layer on the Si substrate to include an Si layer over the Si substrate or an Si region of the Si substrate surface side, and a nitride semiconductor layer thereover.

A twenty-third invention is the nitride semiconductor element according to the twenty-second invention, comprising, in the first conductive region, a p-type impurity in the Si layer or in an Si region on the Si substrate surface, wherein the nitride semiconductor layer comprises an n-type impurity, and the first conductive region is an n-type conductive region.

A twenty-fourth invention is the nitride semiconductor element according to the twenty-second invention, wherein the element structure is a light emitting element structure having a nitride semiconductor layer and a second conductive region of a type of electrical conductivity which is different from the first type of electrical conductivity, the second conductive region being provided over the first conductive region.

A twenty-fifth invention is the nitride semiconductor element of the twenty-second invention, wherein an Si layer or an Si substrate surface side Si region on the Si substrate is a $p^+$ layer whose p-type impurity density is greater than that of the interior of the substrate and/or of the substrate rear surface, and the nitride semiconductor element comprises, over the Si crystalline layer, an n-type conductive layer including at least, as nitride semiconductor layers, an n+ type nitride semiconductor layer, and thereover an n-type nitride semiconductor layer whose n-type impurity density is less than that of the $n^+$ type layer.

A twenty-sixth invention is a nitride semiconductor element according to the nineteenth invention comprising a nitride semiconductor layer over an Si substrate, further comprising, on an n-type or a p-type Si substrate, a $p^+$ type Si crystalline layer whose p-type impurity density is greater than that of the substrate, and, over the Si crystalline layer, an n-type conductive layer which includes at least, as nitride semiconductor layers, an $n^+$ type nitride semiconductor layer, and thereover an n-type nitride semiconductor layer whose n-type impurity density is less than that of the n+ type layer.

It should be understood that, with for example a nitride semiconductor element which has a nitride semiconductor layer over a Si substrate, if at least a portion of the Si substrate and the nitride semiconductor layer are included in an current pass region, and the type of electrical conductivity of the current pass region on the Si substrate is p-type, then it is desirable to make an n-type conductive layer having, over an n-type or p-type Si substrate, a $p^+$ type Si crystalline layer whose p-type impurity density is larger than that of the substrate, and, over the Si crystalline layer, as a nitride semiconductor layer, an $n^+$ nitride semiconductor layer, and over that an n-type conductive layer including at least an n-type nitride semiconductor layer whose n-type impurity density is smaller than that of the $n^+$ type layer. Furthermore, for example, with a nitride semiconductor element which has a nitride semiconductor layer over a Si substrate, if at least a portion of the Si substrate and the nitride semiconductor layer are included in an current pass region, and the majority carriers of the current pass region on the Si substrate are holes, then it is desirable to make this nitride semiconductor element which has a nitride semiconductor layer over a Si substrate to include, over an n-type or p-type Si substrate, at least, a $p^+$ type Si crystalline layer whose p-type impurity density is larger than that of the substrate, and, over the Si crystalline layer, as a nitride semiconductor layer, an $n^+$ nitride semiconductor layer, and over that an n-type conductive layer including an n-type nitride semiconductor layer whose n-type impurity density is smaller than that of the $n^+$ type layer.

Also, a twenty-sixth invention is a nitride semiconductor element comprising a nitride semiconductor layer over an Si substrate, further comprising, on a surface side of an n-type or a p-type Si substrate, a $p^+$ type Si region whose p-type impurity density is greater than that of the substrate, and, over the Si region, an n-type conductive layer which includes at least, as nitride semiconductor layers, an $n^+$ type nitride semiconductor layer, and thereover an n-type nitride semiconductor layer.

It should be understood that, with for example a nitride semiconductor element which has a nitride semiconductor layer over a Si substrate, if at least a portion of the Si substrate and the nitride semiconductor layer are included in an current pass region, and the type of electrical conductivity of the current pass region on the Si substrate is p-type, then it is desirable to include, on an n-type or p-type Si substrate, an n-type conductive layer having, on its substrate surface side, a $p^+$ type Si region whose p-type impurity density is larger than that of the substrate, and, over the Si region, as a nitride semiconductor layer, an $n^+$ nitride semiconductor layer, and over that an n n-type nitride semiconductor layer. Furthermore, for example, with a nitride semiconductor element which has a nitride semiconductor layer over a Si substrate, if at least a portion of the Si substrate and the nitride semiconductor layer are included in an current pass region, and the majority carriers of the current pass region on the Si substrate are holes, then it is desirable to include, on an n-type or p-type Si substrate, an n-type conductive layer having, on its substrate surface side, a $p^+$ type Si region whose p-type impurity density is larger than that of the substrate, and, over the Si region, as a nitride semiconductor layer, an $n^+$ nitride semiconductor layer, and over that an n n-type nitride semiconductor layer.

A twenty-seventh invention is a nitride semiconductor element according to the ninteenth invention, wherein the Si layer or Si region includes an element of the group 13 of the periodic table, and the density of the group 13 element first increases along with distance from the nitride semiconductor layer, and then decreases along with further increase of the distance.

According to this twenty-seventh invention, it becomes possible to supply electrons, which will become carriers, from the Si substrate in an appropriate manner to the nitride semiconductor element structure, and accordingly it is possible to obtain a nitride semiconductor element for which Vf is low.

A twenty-eighth invention is the nitride semiconductor element according to the ninteenth invention, comprising the nitride semiconductor layer and the Si layer or Si region in an current pass region of the nitride semiconductor element.

A twenty-ninth invention is the nitride semiconductor element according to the twenty-sixth invention, comprising a light emitting element structure having a p-type conductive layer having a p-type nitride semiconductor layer over the n-type conductive layer.

A thirtieth invention is the nitride semiconductor element according to the ninteenth invention, wherein the impurity density of the Si layer or the Si region is from approximately $1 \times 10^{18}$ cm$^{-3}$ to approximately $1 \times 10^{22}$ cm$^{-3}$.

According to the inventions explained above, with a nitride semiconductor element which uses Si as a substrate, it becomes possible to reduce the voltage in the forward direction (Vf) lower than in the prior art. In addition, with an element structure of a nitride semiconductor on a Si substrate or a light emitting element structure, it is possible to make the characteristics of this element to be appropriate.

Furthermore, when the Si layer of the ninteenth to the thirtieth inventions is a crystalline layer which has been grown by mono-epitaxial growth on an Si substrate, it is possible to maintain good crystalline characteristics while thickening the layer, and the productivity is superb. Moreover, if there is some crystalline damage to the substrate surface, for example if crystalline deterioration has occurred due to the inclusion of an impurity for imparting the appropriate electrical conductivity, then it is possible to anticipate crystalline recovery by growth of the Si layer. By increasing the layer thickness it is possible, in the surface neighborhood, in other words in the neighborhood portion of the heterojunction interface with the GaN, appropriately to perform doping to a higher density than the other Si layer regions (on the substrate side). Since, in the Si region, the substrate crystalline characteristics are maintained while increasing the density, accordingly, in the same manner, it is possible to produce a product in which the growth of GaN crystals is appropriate, and it is possible to produce excellent element characteristics. Yet further, with a Si layer which is formed by heat diffusion of a dopant source gas for the Si region, when the next nitride semiconductor layer is formed continuously by using the same oven or device, for example a metalorganic vapor phase epitaxy device (MOVPE), since the substrate is not exposed, it is possible to grow the GaN crystals in a satisfactory manner, and moreover variation of the crystals which are grown is small, so that the adaptability to mass production and the manufacturing yield rate are excellent.

In an embodiment of the invention explained above, one of the conductive regions in the element structure of the nitride semiconductor—for example the n-type nitride semiconductor, the active layer of the nitride semiconductor, or a light emitting element structure to which a p-type nitride semiconductor is laminated—is made by being provided with a nitride semiconductor, in concrete terms an n-type nitride semiconductor, and a Si semiconductor. In other words, this is a device which solves the above problems with the prior art, by the provision of a Si/GaN type semiconductor (hereinafter termed Si/GaN) hetero-interface within the element structure, and by arranging one conductive region within the element structure. In concrete terms, Si/GaN hetero-interface is formed within this one conductive layer, by including the Si layer on the Si substrate or the Si region on the substrate side surface within the element structure of the nitride semiconductor which is provided on the Si substrate. By doing this, during shifting of this electric charge within the one conductive layer of the element structure, in concrete terms during the shifting of negative charges therein, by the above described Si/GaN hetero-interface being provided at the substrate surface, or at a p-n junction portion or the like, it is possible to suppress the problem at the hetero-junction interface to a low level.

Or, in another embodiment of the invention explained above, in the case of a Si layer on the Si substrate, there is no problem such as that due to growing GaN between the Si substrate of the prior art and a GaN layer, or in growing GaN by interposing an intermediate layer of a material which is different from both of them, or when growing GaN on a Si substrate surface formed by adding an impurity to an electrically conductive Si substrate and which has been subjected to crystalline deterioration; and, due to mono-epitaxial growth of the same type of material as the Si substrate/Si layer, a Si layer is grown of appropriate crystalline characteristics, and accordingly the excellent beneficial effects when forming a GaN layer thereover, in other words satisfactory crystalline growth, can be manifested. Furthermore, with regard to the appropriate crystalline characteristics of the Si layer, it is possible to suppress crystalline deterioration when doping the Si layer at high density, and, in addition, it is possible to suppress crystalline deterioration during doping into the GaN at high density over the Si layer whose crystalline characteristics are satisfactory, and operation takes place appropriately when forming a hetero-material junction interface with Si/GaN as will be described hereinafter whose type of electrical conductivity is different. In concrete terms, it is possible to enhance the crystalline characteristics, by making the surface side high density, and, along with the Si/GaN junction portion, by making between the surface side and the substrate low density.

In another embodiment of the invention explained above, the Si layer on the Si substrate or the Si region on the Si substrate surface side is provided at a high density of a p-type impurity, while the nitride semiconductor over the Si layer is provided at a high density of an n-type impurity. Due to this it is arranged that, as will be described hereinafter, the shifting of electric charges at the Si-GaN hetero-junction portion becomes appropriate, so that it becomes possible to reduce the voltage in the forward direction Vf at the interface. Furthermore, due to the above described beneficial effect of enhancing the crystalline characteristics, it becomes possible to reduce the series resistance of the entire semiconductor element. In addition, due to the fact that the high density layer is the Si growing layer, even if surface damage to the Si wafer or crystalline deterioration or the like is present, or there are variations in its hardness, it is possible to restore these crystalline characteristics due to the mono-epitaxial layer which has been grown over it, and thereby it becomes possible to dope that crystalline layer at high density; and, furthermore, it also becomes possible to perform partial doping in a surface neighborhood within the layer, in other words at the neighborhood of the junction portion with the GaN type semiconductor. In the Si region, it becomes possible to perform high density doping of the p-type impurity by diffusion doping, as will be described hereinafter, and in particular at the neighborhood of its surface, in other words in the neighborhood of the junction portion with the GaN type semiconductor, it becomes possible to perform doping at an even higher density. Moreover, when forming the high density Si region, since it is also possible to perform continuous processing within the same oven continuing on from after having grown the GaN type semiconductor, accordingly it is also possible to avoid the problem with the prior art of crystalline deterioration of the Si substrate surface.

Or, as an embodiment of the invention explained above in growth of a GaN type semiconductor on a Si substrate, no intermediate layer of a different type of material like the ZnO of the prior art is provided, so that a cause of damage to the GaN type semiconductor crystal at the Si substrate surface comes to be eliminated or at least reduced by mono-epitaxial growth over the Si substrate. On the other hand, in impurity diffusion into the Si substrate, by forming the dopant by heat diffusion, it becomes possible to perform doping at high density while maintaining the crystalline characteristics of the Si substrate or of the substrate side surface, and it is also possible to ensure that the shifting of electric charges at the current pass region of the above described Si/GaN hetero-interface is smooth. In concrete terms, when an impurity is added at high density during the formation of the Si ingot for the Si substrate, the overall crystalline characteristics of the Si ingot and of the Si substrate which is taken therefrom deteriorate, and, even if increase to high density is implemented, it is difficult to grow the GaN type semiconductor. However, as explained with regard to this embodiment, during formation of the Si layer or Si region, the original Si substrate can be doped at low density with an impurity which has the same type of electrical conductivity as the dopant for the Si layer or region, and moreover it is possible not to add any impurity, and the crystallinity of the Si substrate is good; and, furthermore, during the formation of the Si layer thereover or of the Si region at its surface side, it is possible supply it to the Si/GaN hetero-interface, thus maintaining satisfactory crystalline characteristics and implementing an increase of impurity density to a high level. In addition, even if the impurity which has been added to the Si substrate is one with the reverse type of electrical conductivity to the above described Si layer or Si region, it is still possible to control the type of electrical conductivity and the impurity density of the above described Si layer or Si region as desired; in other words, since it is possible to form them with a high design freedom, it becomes possible to apply this process to various different types of element.

And, as an embodiment of the invention explained above, by making, at the above described Si/GaN hetero-junction portion, the Si side be p-type, or its majority carriers be holes, or by making it be a layer or region which has a p-type impurity, and by making the GaN side be n-type or a layer or region which has an n-type impurity, more desirably, it includes impurities at high density which have various types of electrical conductivity; in concrete terms, it is made to have a higher density than the region exterior to the junction portion neighborhood. Although it has been experimentally checked that the voltage in the forward direction (Vf) becomes lower than in the prior art, no theoretical reason is clear for this behavior. However, in the following, a hypothesis is recounted, in order to make an attempt at a theoretical reason for the present invention. Since this is a hypothesis, the following explanation should not be considered as limitative of the present invention in any way.

In the embodiments of the invention explained above the type of electrical conductivity of the current pass region of the above described Si layer or Si region is made to be p-type, and furthermore, from the aspect of the carriers, the majority carriers of the current pass region of the above described Si layer or Si region are made to be holes. By doing this, the Fermi level in the above described Si layer or Si region comes to be close to the valence band. When this is shown by an energy band diagram of the junction interface between the above described Si layer or Si region and the nitride semiconductor layer, it is considered that the situation becomes as shown in FIG. 13A. Furthermore, by performing doping at high density, as shown in FIG. 13B, the whole or a portion degenerates, and the Fermi level comes to be present within the valence band. Yet further, when a large number of electrons are present in the current pass region of the nitride semiconductor layer, the Fermi level in the current pass region of the nitride semiconductor layer approaches the conduction band. When this is shown in an energy band diagram like that shown in FIG. 13A in the same manner, when doping is performed at a further high density, as shown in FIG. 13C, the situation degenerates and the Fermi level comes to be present within the conduction band. And when the Fermi level on the above described Si layer or Si region side is present within the valence band, and the Fermi level on the nitride semiconductor layer side is present within the conduction band, the situation becomes as shown in FIG. 13D. With the present invention, when a voltage in the forward direction (Vf) is applied to the nitride semiconductor element, since a reverse bias is applied to the Si/GaN hetero-junction surface, the valence band at the above described current pass region of the Si layer or Si region becomes higher than the conduction band at the current pass region of the nitride semiconductor layer, and moreover the depletion layer which is formed at the junction portion becomes narrower. When this is shown in a diagram, the situation becomes as shown in FIG. 13E, and it is considered that, due to this, the large number of electrons in the valence band of the above described Si layer or Si region perform tunneling and are injected into the conduction band of the nitride semiconductor layer. Due to this, it is considered that, according to the present invention, with a nitride semiconductor element which uses Si for its substrate, since it becomes possible to flow a larger current with a smaller voltage than in the prior art, accordingly it becomes possible to reduce the voltage in the forward direction (Vf), as compared with the prior art. Although, in FIGS. 13A to 13E which have been used here as energy band diagrams, an n-type GaN layer was used by way of example as the n-type nitride semiconductor layer, this is shown as a preferred embodiment, and the n-type nitride semiconductor layer on the nearest side to the above described Si layer or Si region is not to be considered as being limited thereby; it would also be possible to utilize an n-type AlInGaN layer. However, from the overriding aspect of, above all, being able to form a layer with good crystalline characteristics, it is desirable to utilize an n-type $Al_aGa1-_aN$ layer, where $0 \leq a \leq 0.5$. More desirably, an n-type GaN layer which is a binary mixed crystal may be used.

And, as the current pass region in an embodiment of the invention explained above, this is a region which determines the basic structure of the nitride semiconductor element, and it is the region through which current passes when a voltage has been applied between the positive electrode and the negative electrode on the element. Accordingly, for example, the region in which negative electric charges shift (the negative electric charge shifting region) is included in the current pass region.

Furthermore, in the embodiments of the invention explained above, by the hole density of the above described Si layer or Si region being greater than or equal to approximately $1 \times 10^{18}$ cm$^{-3}$ and less than or equal to approximately $1 \times 10^{21}$ cm$^{-3}$, or by its impurity density being greater than or equal to approximately $1 \times 10^{18}$ cm$^{-3}$ and less than or equal to approximately $1 \times 10^{22}$ cm$^{-3}$, thereby the energy position of the Si valence band becomes relatively high, and moreover, when current is introduced, the depletion layer between the above described Si layer or Si region and the nitride semiconductor layer becomes very thin. And it is considered that the Fermi level comes to be present at a lower position within the valence band, so that a larger number of electrons come to be injected from the above described Si layer or Si region into the nitride semiconductor layer, whereby the voltage in the forward direction (Vf) can also be made lower. By the electron density of the nitride semiconductor layer which contacts the above described Si layer or Si region being greater than or equal to approximately $1 \times 10^{17}$ cm$^{-3}$ and less than or equal to approximately $1 \times 10^{21}$ cm$^{-3}$, or the impurity type density being greater than or equal to approximately $1 \times 10^{17}$ cm$^{-3}$ and less than or equal to approximately $1 \times 10^{22}$ cm$^{-3}$, the energy position of the conduction band of the nitride semiconductor layer becomes relatively low, and furthermore, when a current is applied, the depletion layer between the above described Si layer or Si region and the nitride semiconductor layer becomes very thin. And it is considered that the Fermi level comes to be present at a higher position within the conduction band, so that a larger number of electrons come to be injected from the above described Si layer or Si region into the nitride semiconductor layer, whereby the voltage in the forward direction (Vf) can also be made lower.

A thirty-first invention is the nitride semiconductor element according to the first invention, comprising a buffer region between the Si substrate and the nitride semiconductor layer, and a first crystalline region and a second crystalline region on the surface of the Si substrate, wherein the first crystalline region comprises a first crystal which includes Al and Si, and the second crystalline region comprises a second crystal which includes a GaN type semiconductor including Si.

By distributing the first crystalline region which comprises the first crystal which includes Al and Si, and the second crystalline region which includes a GaN type semiconductor including Si, on the surface of the Si substrate, it becomes possible to form a nitride semiconductor layer of good crystalline characteristics on the Si substrate.

A thirty-second invention is the nitride semiconductor element according to the first invention, comprising a buffer region between the Si substrate and the nitride semiconductor layer, wherein the buffer region comprises a first region on the side of the Si substrate, and a second region which is more separated from the Si substrate than the first region, wherein the first region and the second region each has a multi-layered structure in which first layers made from a nitride semiconductor and second layers whose layer thickness is smaller than that of the first layers and which are made from a nitride semiconductor whose composition differs from that of the first layers are alternately laminated together, with the layer thickness of the first layers of the first region being greater than the layer thickness of the first layers of the second region.

According to this thirty-second invention, the layer whose lattice constant difference with the Si substrate is large (the second layer) is made to be a thinner layer than the layer whose lattice constant difference with the Si substrate is small (the first layer). Since the first layer is a nitride semiconductor, its lattice constant is smaller than that of the Si substrate. In other words, when forming the nitride semiconductor layer on the Si substrate, since their lattice constants are different, at the interface between the Si substrate and the nitride semiconductor layer, a compressive reaction force and a tension reaction force act on them respectively. In more detail, when the first layer which is made from a nitride semiconductor is formed on the Si substrate, a compressive reaction force acts on the Si substrate whose lattice constant is the larger; but, by contrast, a tension reaction force acts on the first layer whose lattice constant is the smaller. Since this tension reaction force acts on the first layer, along with the growth of this first layer, cracking tends to occur at this growing surface, which is undesirable. Furthermore, this generation of cracking makes it difficult to grow the nitride semiconductor layer further, which is also undesirable. Thus when the second layer, which is made from the nitride semiconductor whose lattice constant difference with respect to the Si substrate is the larger, is made as a thinner layer than the first layer, at the interface between the first layer and the second layer, the tension reaction force in the second layer is acted on by the compressive reaction force in the first layer. In other words, it is possible to suppress the occurrence of cracking, since the compressive reaction force acts on the growing surface of the first layer at which the tension reaction force is carrying on. That is to say, it is possible to form the first layer while suppressing the occurrence of cracking, and, by thus forming a multi-layered structure in which the first layer and the second layer are alternately laminated together, it becomes possible to obtain a buffer region made from nitride semiconductor, at which the occurrence of cracking is suppressed.

Even further by forming, on the Si substrate, the first region in which the occurrence of cracking between the first layer and the second layer is suppressed, and, over that, the second region in which the first layer and the second layer are alternately laminated together, it becomes possible to form a nitride semiconductor layer whose crystalline characteristics are good. According to this thirty-fifth invention, the layer thickness of the first layers which are included in the first region is greater than the layer thickness of the first layers which are included in the second region; in other words, the layer thickness of the first layers which are included in the second region is thinner than the layer thickness of the first layers which are included in the first region. Due to this, it is possible to obtain a nitride semiconductor layer which has good crystalline characteristics. This second region is able to manifest its functions due to the fact that it is over the first region. For example, it would not be possible to obtain a nitride semiconductor layer which had good crystalline characteristics, if a second region having the same layer thickness was formed directly over the Si substrate. In other words, the second region is able to manifest its beneficial effects due to the fact that it is formed over the Si substrate, and moreover that it is formed over a layer which suppresses the occurrence of cracking.

From the above, according to the thirty-second invention, it becomes possible to obtain a nitride semiconductor layer of which the crystalline characteristics are good.

It should be understood that, if a buffer region is provided between the Si substrate and the nitride semiconductor layer, and a first crystalline region and a second crystalline region are provided on the surface of the Si substrate, and the first crystalline region includes a first crystal which includes Al and Si, while the second crystalline region includes a second crystal which includes a GaN type semiconductor including Si, then it is desirable for the buffer region to include a first region on the side of the substrate, and a second region which is more separated from the Si substrate than the first region, and for the first region and the second region each to be made in a multi-layered structure in which first layers made from nitride semiconductor, and second layers whose layer thickness is smaller than that of the first layers, which are made from a nitride semiconductor, and which have a different composition from the first layers, are mutually laminated together; and for the layer thickness of the first layers which are included in the first region to be made to be greater than the layer thickness of the first layers which are included in the second region.

A thirty-third invention is the nitride semiconductor element according to the first invention, comprising a protective element portion of Si semiconductor having an Si substrate and, over the substrate, a light emitting structural portion in which a nitride semiconductor layer is laminated, wherein the junction portion between the protective element portion and the light emitting element structural portion is formed by a p-type Si semiconductor and an n-type nitride semiconductor layer.

Since a semiconductor element is thereby provided in which the light emitting element portion of the nitride semiconductor which has been laminated over the Si substrate and the Si protective element are joined by the n-type nitride semiconductor and the p-Si, accordingly, it is possible to flow a current with a smaller voltage than in the prior art at this n-GaN/p-Si interface; in other words, the driving of the LED and the driving of the protective element are performed appropriately, and the characteristics of each of these elements are enhanced.

A thirty-fourth invention is the nitride semiconductor element according to the thirty-third invention, wherein the semiconductor element is a three terminal element, and the three terminals are p and n electrodes of the light emitting structural portion, and an n electrode of a protective element portion which is provided on a main surface which faces a main surface on which the light emitting element structural portion of the substrate is provided.

A thirty-fifth invention is the nitride semiconductor element according to the thirty-third invention, wherein the semiconductor element comprises an internal circuit in which wiring is provided to the semiconductor element, so that an n electrode which is provided on a main surface of the substrate on which the light emitting element structural portion is provided and a p electrode of the light emitting structural portion are connected together.

A thirty-sixth invention is the nitride semiconductor element according to the thirty-third invention, wherein the semiconductor element is a two terminal element, and the two terminals are an n electrode of the light emitting structural portion, and an n electrode of a protective element portion which is provided on a main surface which faces a substrate main surface on which the light emitting element structural portion is provided.

BRIEF DESCRIPTION OF THE DRAWINGS

FIG. 1 is a figure showing a portion of a nitride semiconductor element according to an embodiment of the present invention;

FIG. 2 is a figure for explanation of the energy bands of a portion of this nitride semiconductor element according to an embodiment of the present invention;

FIG. 3 is another figure for explanation of the energy bands of a portion of this nitride semiconductor element according to an embodiment of the present invention;

FIG. 4 is yet another figure for explanation of the energy bands of a portion of this nitride semiconductor element according to an embodiment of the present invention;

FIG. 12 is a schematic sectional view of a semiconductor element according to an embodiment of the present invention;

FIG. 14 is a figure showing the current-voltage characteristic of an experimental example according to an embodiment of the present invention;

FIG. 15 is a schematic figure showing the energy band structure of a Si/GaN hetero-junction portion, according to the present invention;

FIG. 16 is a schematic sectional view of a semiconductor element according to an embodiment of the present invention, including a circuit diagram almost equivalent thereto (inserted at the upper right);

FIG. 17A is a schematic sectional view of a semiconductor element according to an embodiment of the present invention;

FIG. 17B is a schematic sectional view of a semiconductor element according to an embodiment of the present invention (of a different type from FIG. 17A);

FIG. 18A is a schematic sectional view of a semiconductor element according to an embodiment of the present invention;

FIG. 18B is a schematic sectional view of a semiconductor element according to an embodiment of the present invention (of a different type from FIG. 18A);

FIG. 24 is a figure showing an energy band diagram for a prior art nitride semiconductor element; and FIG. 25 is a schematic figure showing the structure of the energy bands of a Si/GaN hetero-junction portion, according to the present invention.

DESCRIPTION OF THE PREFERRED EMBODIMENTS

Figure 5:
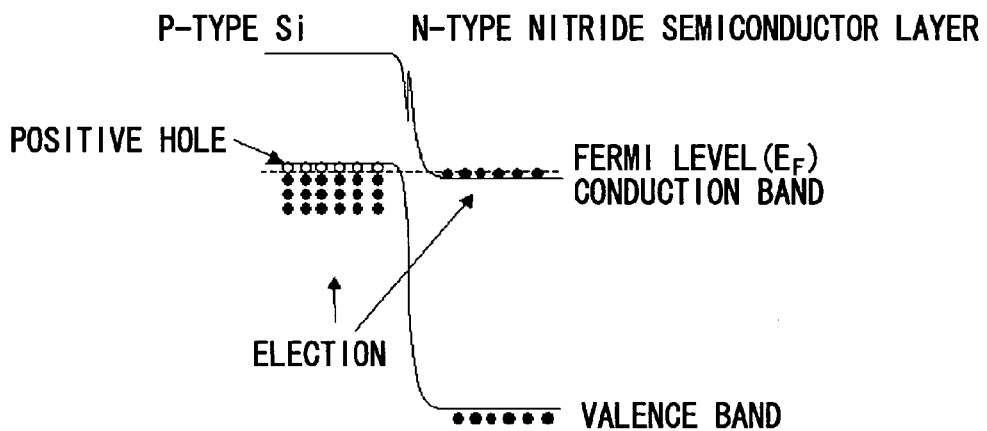
FIG. 5 is still yet another figure for explanation of the energy bands of a portion of this nitride semiconductor element according to an embodiment of the present invention.
Figure 6:
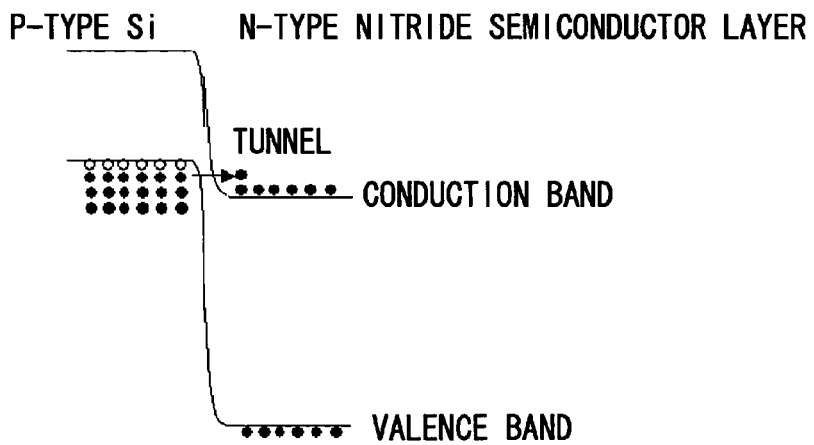
FIG. 6 is even yet another figure for explanation of the energy bands of a portion of this nitride semiconductor element according to an embodiment of the present invention.

In the following, preferred embodiments of the present invention will be described in detail with reference to the appended drawings.

FIG. 1 is a figure showing a portion of a nitride semiconductor element according to a first embodiment of the present invention.

As shown in FIG. 1, this nitride semiconductor element 1001 according to the first embodiment of the present invention comprises a nitride semiconductor layer 1003 on a Si substrate 1002. In this nitride semiconductor layer 1003 there are included an n-type nitride semiconductor layer 1004, an active layer 1005, and a p-type nitride semiconductor layer 1006; and, among these, it is the n-type nitride semiconductor layer 1004 which contacts the Si substrate 1002. As shown in FIG. 1, the type of electrical conductivity of the current pass region of the Si substrate 1002 is p-type.

It should be understood that, in this explanation of the first embodiment of the present invention, in order to simplify the discussion, a case is described in which the nitride semiconductor layer 1003 incorporates the active layer 1005; but it would also be possible, in the present invention, for the nitride semiconductor layer 1002 not to incorporate any active layer 1005, and, in that case, the interface between the n-type nitride semiconductor layer 1004 and the p-type nitride semiconductor layer 1006 would constitute a light emitting region from which light is emitted.

With this nitride semiconductor element 1000 according to the first embodiment, the current pass region on the Si substrate 1002 is not made to be n-type, but rather is made to be p-type; but, when this is done with a nitride semiconductor element which uses Si as the substrate, it becomes possible to reduce the voltage in the forward direction (Vf) to be lower than that in the case of a prior art n-type Si substrate. Here, if the Fermi level of the current pass region of the Si substrate 1002 comes to be present within the valence band, while the Fermi level of the current pass region of the nitride semiconductor layer 1003 comes to be present within the conduction band, then it is considered that the state has become degenerate, and, in particular, the fact that the state has become degenerate is considered to be the cause of the fact that it is possible to reduce Vf below its value in the prior art. It is desirable for the entire Si substrate to degenerate into this degenerate state, and it is even more desirable for both the Si substrate and the nitride semiconductor layer to degenerate in this manner. Furthermore it is conjectured that, if also the Fermi level at the junction is present within the valence band on the side of the Si substrate, but is not present within the conduction band on the side of the nitride semiconductor layer, then, since a similar type of energy band structure is created by applying an electric field as in the case of degeneracy, the same beneficial effect will be obtained. By doing this, it is considered that, with a nitride semiconductor layer in which Si is used as the substrate, as in this first embodiment, it becomes possible for a larger current to be caused to flow with a smaller voltage than in the prior art, so that it becomes possible to reduce the voltage in the forward direction (Vf) to be lower than in the prior art. It should be noted that the beneficial effects due to this embodiment have been checked on an experimental basis, and the theoretical explanation offered here is only a hypothesis. The theory involved in this hypothesis should not be considered as being in any way limitative of the present invention.

In the following, the nitride semiconductor element 1001 according to the first embodiment of the present invention will be described in greater detail.

[The Si Substrate 1002]

On the Si substrate 1002, its-current pass region is p-type or has majority carriers which are holes.

Although the present invention is not to be considered as being limited in any way by the hole density at the current pass region of the Si substrate 1002, this hole density is desirably greater than or equal to approximately $1 \times 10^{18}$ cm$^{-3}$ and less than or equal to approximately $1 \times 10^{21}$ cm$^{-3}$, and is more desirably greater than or equal to approximately $1 \times 10^{19}$ cm$^{-3}$ and less than or equal to approximately $2 \times 10^{20}$ cm$^{-3}$.

Furthermore, although the density of the p-type impurity (boron or aluminum or the like) in the current pass region of the Si substrate 1002 is not to be considered as being particularly limitative of the present invention, for the present invention, it is desirable for the density of this p-type impurity (boron or aluminum or the like) to be greater than or equal to approximately $1\times10^{18}$ cm$^{-3}$ and less than or equal to approximately $1\times10^{22}$ cm$^{-3}$, and it is more desirable for it to be greater than or equal to approximately $1\times10^{19}$ cm$^{-3}$ and less than or equal to approximately $2\times10^{21}$ cm$^{-3}$.

According to the Si substrate 1002 according to this first embodiment, it is considered that a large number of positive holes are created at its current pass region, and that the Fermi level of the current pass region of the Si substrate 1002 comes to be present at a lower potential within the valence band, while the Fermi level of the current pass region of the Si substrate 1002 comes to match the Fermi level of the current pass region of the n-type nitride semiconductor layer 1004. Furthermore, it is considered that the depletion layer between the current pass region of the Si substrate 1002 and the current pass region of the nitride semiconductor layer 1003 also becomes very thin. And it is considered that, due to this, a larger number of electrons come to be injected from the valence band of the Si substrate into the conduction band of the n-type nitride semiconductor layer 1004, so that, with this nitride semiconductor element 1001 which uses Si as its substrate, it becomes possible to make the voltage in the forward direction (Vf) lower.

Furthermore, although the specific resistance of the current pass region of the Si substrate 1002 is not to be considered as being particularly limitative of the present invention, it is desirable, for the present invention, for this specific resistance to be less than or equal to approximately 0.05 Ωcm, and it is more desirable for it to be less than or equal to approximately 0.02 Ωcm. By doing this it becomes possible, with this nitride semiconductor element 1001, to flow a greater current with the application of a smaller voltage, so that it becomes possible to make the voltage in the forward direction (Vf) smaller.

It should be understood that, with the present invention, as will be described hereinafter, it will be acceptable to make the entire extent of the Si substrate 1002 be an current pass region, or it will also be acceptable to make only a part of the Si substrate 1002 be an current pass region; and these may, for example, be suitably selected by the position for formation of a negative electrode. Furthermore, the above described values for the above described hole density, p-type impurity density, and specific resistance are desirably attained over at least a portion of the current pass region of the Si substrate 1002, but it is not necessary for the above described values to be attained over the entire extent of the current pass region of the Si substrate 1002. Accordingly, with the present invention, the following cases (1) to (4) are all included in its scope:

(1) The case in which the entire extent of the Si substrate 1002 is an current pass region, and the above described values for the above described hole density, p-type impurity density, and specific resistance are attained over the entire extent of this current pass region.

(2) The case in which the entire extent of the Si substrate 1002 is an current pass region, and the above described values for the above described hole density, p-type impurity density, and specific resistance are attained over only a portion of this current pass region.

(3) The case in which only a portion of the Si substrate 1002 is an current pass region, and the above described values for the above described hole density, p-type impurity density, and specific resistance are attained over the entire extent of this current pass region.

(4) The case in which only a portion of the Si substrate 1002 is an current pass region, and the above described values for the above described hole density, p-type impurity density, and specific resistance are attained over only a portion of this current pass region.

In fact, in the above discussion, in order to simplify the explanation of the present invention, conditions have been recited which are considered to result in the best possible realization of the beneficial effects of the present invention; but, even if the type and density of the p-type impurities and the specific resistance are different from those described above, nevertheless this is to be considered as being included within the scope of the present invention, since it will still be possible to obtain the beneficial effects of the present invention. It should be understood that while, in the above description, the numerical values which are assumed by the type and the density of the p-type impurities and their hole density and the specific resistance have been expressed as "approximate numerical values", this is a matter of course when expressing such type and density of the p-type impurities and their hole density and the specific resistance precisely as the above numerical values, and it is thereby intended to include cases in which the above described numerical values do not precisely fall within the limits specified above.

It should be understood that, if it is arranged for the (111) surface of the Si substrate 1002 to contact against the (0001) surface of the nitride semiconductor layer 1003, then it is possible to suppress dislocations between the Si substrate 1002 and the nitride semiconductor layer 1003 due to disagreement of their lattice constants to the minimum possible level.

It should be understood that the present invention is not to be considered as being limited by the method of measurement of the impurity density; the impurity density might, for example, be measured by secondary ion mass analysis (SIMS: Secondary Ion Mass Spectrometry) or the like.

[The Nitride Semiconductor Layer 1003]

(The n-Type Nitride Semiconductor Layer 1004)

The n-type nitride semiconductor layer 1004 may be made from a material such as one, for example, generally expressed as In$_e$Al$_f$Ga$_{1-e-f}$N (where $0 \leq e$, $0 \leq f$, and $e+f \leq 1$), and may consist of a single layer or of a plurality of layers; and, in order to obtain a nitride semiconductor layer 1003 in which the number of crystalline defects is low, it is desirable to use Al$_f$Ga$_{1-f}$N in which the value for GaN or f is less than or equal to 0.2. Furthermore, in order to keep down the resistance value and to reduce the voltage in the forward direction (Vf) of the nitride semiconductor element 1001 while preventing the occurrence of cracks, the layer thickness of the n-type nitride semiconductor layer 1004 is desirably greater than or equal to 0.1 μm and less than or equal to 5 μm, whereby it is possible to obtain a nitride semiconductor element of which the value of Vf is low. Moreover, it is more desirable for this layer thickness to be greater than or equal to 0.3 μm and less than or equal to 1 μm: by making it greater than or equal to 0.3 μm, a nitride semiconductor element structure (at least an n-type nitride semiconductor layer and a p-type nitride semiconductor layer) is obtained which has good crystalline characteristics; and, by making it less than or equal to 1 μm, it is made more difficult for cracking to occur in the structure of the nitride semiconductor element, and moreover the yield rate is enhanced. Furthermore, with regard to the n-type nitride semiconductor layer, by making that layer which is the nearest to the Si substrate with a layer thickness of greater than or equal to 10 nm, it is ensured that electrons come to be suitably injected from the Si substrate into the n-type nitride semiconductor layer. Desirably, this layer is provided as being of thickness greater than or equal to 10 nm and less than or equal to 300 nm, and moreover it is desirable, from the point of view of good electrical conductivity and good crystalline characteristics, to provide another layer thereover on its n side, such as a cladding layer or the like. Furthermore, it is desirable for the nearest side to the Si substrate to be an n-type GaN layer, so that it is ensured that electrons come to be injected from the Si substrate into the n-type nitride semiconductor layer in the most appropriate manner.

Yet further, between the n-type nitride semiconductor layer and the p-type nitride semiconductor layer, if a double hetero junction nitride semiconductor element structure provided with an active layer is used, it is desirable to have, as an n side cladding layer on the active layer side, an n-type nitride semiconductor layer of which the band gap energy is greater than that of the active layer. This may be functionally explained as follows: it prevents overflow of holes from the p-type nitride semiconductor layer side, and acts as a layer which enhances the probability of light emission recombination in the active layer.

Even further, if a plurality of n-type nitride semiconductor layers are provided, in some position, desirably more towards the Si substrate than the n side cladding layer, there should be provided a multi-layered lamination of repeated layers of AlN and $Al_aGa_{1-a}N$ (where 0<a<1), or a multi-layered lamination of repeated layers of AlN and GaN, or the like; by these layers, it is possible to mitigate the reaction force, and, above them, it is possible to obtain good crystalline characteristics for the nitride semiconductor layer.

Although for convenience the explanation thereof has herein been curtailed, it should be understood that it is desirable to provide a buffer layer (not shown in the figure) between the Si substrate 1002 and the n-type nitride semiconductor layer 1004, since thereby it is possible to obtain a nitride semiconductor element structure of excellent crystalline characteristics. As a material for such a buffer layer, desirably, there may be used a nitride semiconductor described by $Al_aGa_{1-a}N$ (where $0 \leq a \leq 1$), and more desirably, AlN may be used. By the formation of such a buffer layer, it is possible to mitigate non-matching between the lattices of the Si substrate 1002 and the n-type nitride semiconductor layer 1004. As for the thickness of this buffer layer, it should desirably, at least, be thinner than that layer of the n-type nitride semiconductor layers which is closest to the Si substrate, and desirably this thickness should be greater than or equal to 0.25 nm (greater than or equal to one atomic layer) and less than 10 nm. By making this thickness greater than or equal to 0.25 nm, it is ensured that this layer functions appropriately as a buffer layer, and, by making its thickness less than 10 nm, it is possible to obtain an electrical characteristic between the Si substrate and the n-type nitride semiconductor layer which is equal to the electrical characteristic in the case in which no buffer layer is provided. In other words, by providing a buffer layer whose layer thickness falls in this type of range, along with ensuring that the crystalline characteristics of the nitride semiconductor layer laid above this buffer layer are satisfactory, it is also possible to obtain the same electrical characteristics as in the case in which no such buffer layer is provided; and, from another aspect, it is ensured that electrons come substantially to be injected from the Si substrate into the n-type nitride semiconductor layer.

Although, in the present invention, the electron density of the n-type nitride semiconductor layer 1004 is not to be considered as being particularly limited, it is considered to be desirable for the electron density of the current pass region of this n-type nitride semiconductor layer 1004 to be greater than or equal to approximately $1 \times 10^{17}$ cm$^{-3}$ and less than or equal to approximately $1 \times 10^{21}$ cm$^{-3}$, and more desirable for it to be greater than or equal to approximately $2 \times 10^{18}$ cm$^{-3}$ and less than or equal to approximately $1 \times 10^{20}$ cm$^{-3}$. Furthermore although, with the present invention, the n-type impurity density of the n-type nitride semiconductor layer 1004 is not to be considered as being particularly limited, it is considered to be desirable for this n-type impurity density of the current pass region of this n-type nitride semiconductor layer 1004 to be greater than or equal to approximately $1 \times 10^{17}$ cm$^{-3}$ and less than or equal to approximately $1 \times 10^{22}$ cm$^{-3}$, and more desirable for it to be greater than or equal to approximately $2 \times 10^{18}$ cm$^{-3}$ and less than or equal to approximately $1 \times 10^{21}$ cm$^{-3}$. It is considered that, in this type of case, a large number of electrons are generated at the current pass region of the n-type nitride semiconductor layer 1004, and the Fermi level of the current pass region of the n-type nitride semiconductor layer 1004 is within the conduction band. Furthermore, it is considered that the depletion layer between the current pass region of the Si substrate 1002 and the current pass region of the nitride semiconductor layer 1003 is extremely thin. And it is considered that, as a result, a larger number of electrons are injected from the valence band of the Si substrate 1002 into the conduction band of the n-type nitride semiconductor layer 1004, and that thereby the voltage in the forward direction (Vf) can be reduced further.

Actually, according to the explanation described above, in order to simplify the description of the present invention, conditions for best realizing the beneficial effects of the present invention were enumerated; but, even if the type and density of the n-type impurities, and the electron density, are different from those described above, this is still to be considered as falling within the scope of the present invention, since it is still possible to obtain the beneficial effects of the present invention. It should be understood that while, in the above description, the numerical values which are assumed by the type and the density of the n-type impurities and the electron density have been expressed as "approximate numerical values", this is a matter of course when expressing such type and density of n-type impurities and electron density precisely as the above numerical values, and it is thereby intended also to include cases in which the above described numerical values do not precisely fall within the limits specified above.

(The Active Layer 1005)

It is possible to utilize a single quantum well structure or a multiple quantum well structure for the active layer 5, and it may be formed from a nitride semiconductor which includes In and Ga—desirably, from $In_aGa_{1-a}N$ (where $0 \leq a < 1$). If a multiple quantum well structure is employed, although the active layer 5 includes a barrier layer and a well layer, the barrier layer may consist of, for example, undoped GaN, while the well layer may consist of, for example, undoped $In_{0.35}Ga_{0.65}N$. Furthermore, although the layer thickness of the entire active layer is not to be considered as being particularly limited, the number of laminations and the order of lamination of the barrier layer and the well layer may be adjusted, and the layer thicknesses of the active layers may be set, in consideration of the light emitting wavelength and the like.

(The p-Type Nitride Semiconductor Layer 1006)

The p-type nitride semiconductor layer 1006 includes at least $Al_xIn_yGa_{1-x-y}N$ (where $0 \leq x$, $0 \leq y$, and $x+y<1$); a single layer structure or a multi-layer structure may be employed; and if, between the n-type nitride semiconductor layer and the p-type nitride semiconductor layer, a double hetero junction nitride semiconductor element structure in which an active layer is provided is employed, it is desirable to employ, as a p side cladding layer, at least a p-type nitride semiconductor layer whose band gap energy is greater than that of the active layer: to explain this in a functional manner, it is desirable to provide at least a layer which prevents overflow of electrons from the side of the n-type nitride semiconductor layer, and which enhances the probability of light emitting recombination in the active layer.

Furthermore there are desirably provided, in order from the side of the Si substrate 1002, a p-type cladding layer (not shown in the figure) and a p-type contact layer (also not shown in the figure) on which a positive electrode is formed.

Such a p-type cladding layer may be of a multi-layered structure (a superlattice structure) or of a single layered structure. Since, when the p-type cladding layer employs a superlattice structure, it is possible to obtain good crystalline characteristics, and to lower the specific resistance, accordingly it is possible to lower the voltage in the forward direction (Vf). As the p-type impurity with which this p-type cladding layer is doped, an element of the group IIA or IIB of the periodic table, like Mg, Zn, Ca, Be or the like may be selected; and, desirably, Mg or Ca or the like may be used for the p-type impurity. Furthermore, if this p-type cladding layer doped with a p-type impurity consists of a single layer made from $Al_tGa_{1-t}N$ (where $0 \leq t \leq 1$) including a p-type impurity, then, although the light emission output is somewhat decreased, then it is possible to obtain a satisfactory product in which the electrostatic resistance is almost equal to the case of using a superlattice.

Although it is possible to form the p-type contact layer by using a nitride semiconductor as expressed in general by $In_rAl_sG_{1-r-s}N$ (where $0 \leq r<1$, $0 \leq s<1$, and $r+s<1$), in order to form a layer whose crystalline characteristics are satisfactory, it is desirable to employ a ternary mixed crystal nitride semiconductor, and it is more desirable to employ a nitride semiconductor which is made from binary mixed crystal GaN which does not include any In or Al. Moreover, if the p-type contact layer is made from such a binary mixed crystal GaN which does not include any In or Al, it is possible to obtain more satisfactory ohmic contact with the positive electrode, and it is possible to enhance the light emitting efficiency. As the p-type impurity for the p-type contact layer, although the same kind of p-type impurity as that used for the p-type cladding layer may be employed, more desirably Mg is used. When Mg is used for the p-type impurity for doping into the p-type contact layer, then it becomes possible to obtain a p-type characteristic for the nitride semiconductor layer in a simple and easy manner, and furthermore it is possible to form ohmic contact simply and easily.

Figure 7:
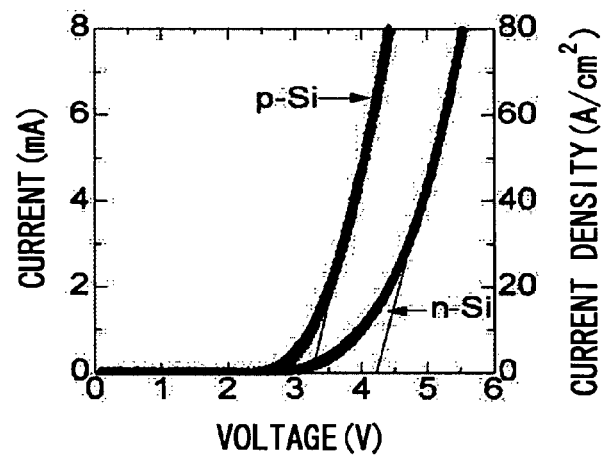
FIG. 7 is a figure showing the current-voltage characteristic (I-V characteristic) of this nitride semiconductor element according to an embodiment of the present invention.

FIG. 7 is a figure for comparison of the Vf for a nitride semiconductor element (with a p-type Si substrate) according to the first embodiment of the present invention, and the Vf for a prior art nitride semiconductor element (with an n-type Si substrate). In this experiment, the size of the LED chip was 100 μm×100 μm, so that the area was about a tenth of the area of a current LED in general use.

The experiment was performed with the current set to 5 mA (50 A/cm$^2$), and, when Vf was compared, as shown in FIG. 7, the Vf for the prior art nitride semiconductor element (with an n-type Si substrate) was 5.1 V, while the Vf for the nitride semiconductor element (with a p-type Si substrate) according to the first embodiment of the present invention was 4.0 V. Accordingly, within the limitations of this experiment, the value of Vf was improved by 1.1 V with the first embodiment of the present invention.

Furthermore, as shown in FIG. 7, with the nitride semiconductor element according to the first embodiment of the present invention, the rising slope voltage is 3.2 V, while with a prior art nitride semiconductor element it is 4.2 V. Accordingly it may be the, within the limitations of this experiment, that the rising voltage has been improved by approximately 1 V with the first embodiment of the present invention. In this manner, according to this first embodiment, a nitride semiconductor element is obtained which has a lower value of Vf than the prior art. Furthermore, it is considered that the I-V characteristic at the junction portion between the nitride semiconductor layer and the Si substrate becomes approximately linear, so that it is possible to obtain a satisfactory ohmic characteristic. It should be understood that here the term "approximately linear" of course includes the case that the I-V characteristic is not precisely linear, although indeed it may be precisely linear.

Figure 8:
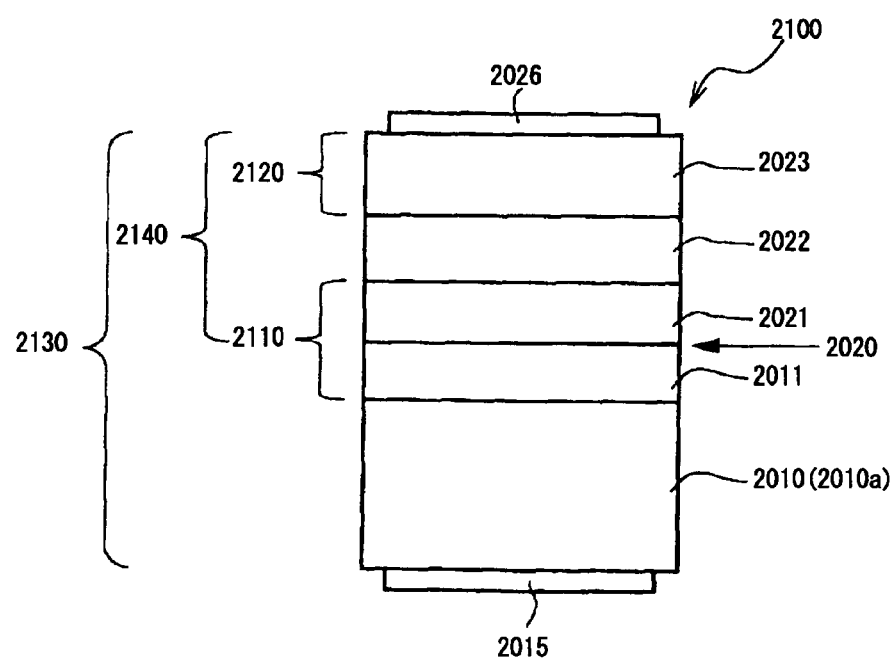
FIG. 8 is a schematic sectional view of this semiconductor element according to an embodiment of the present invention.

FIG. 8 is a figure showing a nitride semiconductor element according to a second embodiment of the present invention.

As shown in FIG. 8, the nitride semiconductor element 2100 according to the second embodiment of the present invention comprises, on a Si substrate 2010, via an Si layer or an Si region 2011, a nitride semiconductor layer (lamination) 2140. In this nitride semiconductor layer 2140, there are included an n-type nitride semiconductor layer 2021, an active layer 2022, and a p-type nitride semiconductor layer 2023; and, among these, the n-type nitride semiconductor layer 2022 is in contact with the Si layer or Si region 2011. In the example shown in FIG. 8, the type of the electrical conductivity of the Si substrate 2010a and the Si layer or Si region 2011 is p-type.

It should be understood that, in this second embodiment, in order to facilitate the explanation of the present invention and make it easier, the description has been made in terms of the nitride semiconductor layer (the lamination) 2140 including the active layer 2022, in the light emitting element of the semiconductor element of the present invention, it would also be possible for he nitride semiconductor layer 2140 not to include any active layer 2022, and, in this case, the light emitting region at which light is emitted would be at the interface between the n-type nitride semiconductor layer 2021 and the p-type nitride semiconductor layer 2023.

Although, with the nitride semiconductor element according to this second embodiment, the Si substrate 2010b and the Si layer or Si region 2011 are not n-type but rather p-type, when this is done, with a nitride semiconductor element using Si as the substrate, in concrete terms, with a Si/GaN heterojunction interface 2020, it becomes possible to reduce the voltage in the forward direction (Vf) to be lower than with a prior art n-type Si substrate or Si layer or Si region. Here, if the Fermi level of the current pass region of the Si substrate 2010b or the Si layer or Si region 2011 comes to be present within the valence band, while the Fermi level of the current pass region of the nitride semiconductor layer 2140 comes to be present within the conduction band, then it is considered that the state has become degenerate, and, in particular, the fact that the state has become degenerate is considered to be the cause of the fact that it is possible to reduce Vf below its value in the prior art. It is desirable for the entire Si substrate to degenerate into this degenerate state, and it is considered to be even more desirable for both the Si substrate and the nitride semiconductor layer to degenerate in this manner. Furthermore it is conjectured that, if also the Fermi level at the junction is present within the valence band on the side of the Si substrate, but is not present within the conduction band on the side of the nitride semiconductor layer, then, since a similar type of energy band structure is created by applying an electric field as in the case of degeneracy, the same beneficial effect will be obtained. By doing this, it is considered that, with a semiconductor layer in which Si is used as the substrate, and which has a Si/GaN hetero-junction interface, as in this second embodiment, it becomes possible for a larger current to be caused to flow with a smaller voltage than in the prior art, so that it becomes possible to reduce the voltage in the forward direction (Vf) to be lower than in the prior art. It should be noted that the beneficial effects due to this embodiment have been checked on an experimental basis, and the theoretical explanation offered here is only a hypothesis. The theory involved in this hypothesis should not be considered as being in any way limitative of the present invention.

In the following, the semiconductor element 2100 according to the second embodiment of the present invention will be described in more detail.

[The Si Substrate 2010]

With regard to the Si substrate 2010, with a electrode structure as shown in FIGS. 8 and 9, which show an example of the structure of a semiconductor element which is a light emitting element, it is possible to use a p-type substrate 2010a, an n-type substrate 2010b, or a non electrically conductive substrate 2010c, and to endow this substrate with various different electrical conductivities or partial electrical conductivities It should be understood that, if it is arranged for the (111) surface of the Si substrate 2010 to contact against the (0001) surface of the nitride semiconductor layer 2140, then it is possible to suppress, to the minimum possible level, dislocations due to disagreement of the lattice constants between the Si substrate 2010 or the Si layer or Si region 2011 and the nitride semiconductor layer 2140.

[The Si Layer and the Si Region 2011]

The Si layer 2011 or the Si region 2011 on the Si substrate of the present invention, or at least the first conductive region of the Si/GaN hetero-junction interface neighborhood or element, is p-type, or majority carriers are holes. Although this hole density is not to be considered as being particularly limited, it is considered to be desirable for this hole density to be greater than or equal to approximately $1 \times 10^{18}$ cm$^{-3}$ and less than or equal to approximately $1 \times 10^{21}$ cm$^{-3}$, and it is considered for it to be more desirable for this hole density to be greater than or equal to approximately $1 \times 10^{19}$ cm$^{-3}$ and less than or equal to approximately $2 \times 10^{20}$ cm$^{-3}$. Moreover, although the density of p-type impurities (boron or aluminum or the like) is not to be considered as being particularly limited, it is considered to be desirable for this p-type impurity density (boron or aluminum or the like) to be greater than or equal to approximately $1 \times 10^{18}$ cm$^{-3}$ and less than or equal to approximately $1 \times 10^{22}$ cm$^{-3}$, and it is considered to be more desirable for this impurity density to be greater than or equal to approximately $1 \times 10^{19}$ cm$^{-3}$ and less than or equal to approximately $2 \times 10^{21}$ cm$^{-3}$.

With the present invention, in order for the Si semiconductors, for example, in the figure, the (Si semiconductor) substrate 2010, for example the n-type substrate 2010a, or the p-type substrate 2010b, or the Si (semiconductor) layer or region 2011, to have various types of electrical conductivity, they are doped with impurities: as an n-type impurity, there may be cited elements from the 5B group of the periodic table—in concrete terms, P (phosphorus), As (arsenic), or Sb (antimony); and, as a p-type impurity, there may be cited elements of the 3B group of the periodic table—in concrete terms, B (boron), Al, Ga, Ti, or the like—and desirably B may be employed.

[Formation of the Si Layer 2011]

In the following, the formation of the Si layer or region 2011 of the present invention will be explained with reference to FIGS. 10 to 12; but it should be noted that (b-2), (c-2), and (d-2) in each of these figures are given by way of example, for schematically showing the amounts of impurities of n-type (on their left sides) and of p-type (on their right sides), corresponding to the sectional views of the various layers and regions shown in (b-1), (c-1), and (d-1) respectively; and these impurity distributions are given only by way of example, and are not to be considered as being limited by any correspondence relationship with the sectional views; it would be possible to obtain various different types of such distributions.

With the present invention, in the formation of the Si semiconductor layer on the Si substrate 2010, it is possible to employ a method which is per se known from the prior art—for example, a metalorganic vapor phase epitaxy method (MOVPE), thermal CVD, or the like. Although a metalorganic vapor phase epitaxy method will be described in the following, the present invention is not to be considered as being limited thereby; it would be possible to form this layer by various types of method, such as a physical vapor deposition method such as spattering or the like, (thermal) CVD, a chemical vapor deposition method such as MBE and so on, or the like. In formation of the Si semiconductor layer 2011 which is one aspect of the present invention, as described above, this is performed by crystalline growth, in other words mono-epitaxial growth, of the same type of material on the Si substrate. By doing this, it becomes possible to form a thicker layer, to enhance the crystalline characteristics, and to further increase the doping level due to these enhanced crystalline characteristics.

To explain this in concrete terms using FIG. 12: a Si semiconductor crystal is grown (see FIG. 12(a)) on a Si substrate 2030; a Si layer 2031 is formed; a desired impurity is doped thereinto at this time (in concrete terms, a p-type impurity); and the surface side of the Si layer is formed as a high density impurity layer (see FIG. 12(b)); and, next, as a laminated nitride semiconductor structure 2140, nitride semiconductor layers 2091, 2092 and so on of a first conductive region are laminated (see FIG. 12(c)).

When growing the Si layer, the density distribution (the distribution 2060) may be an almost uniform density distribution within the layer 2031, as shown by the impurity distribution of FIG. 12(b-2); or, as in FIG. 12(b-1), there may also be a distribution 2070 in which the density varies within the layer, so that there are two layers 2031a and 2031b in which the densities are different, with the surface layer 2031b having a higher density than the deeper layer 2031a. In other words, it is possible to have any desired impurity distribution by varying the doping amount as desired while growing the layer. In particular, as in the distribution 2070, by the surface side 2031b being doped at a higher density than region 2031a on the substrate rear surface side (its surface which is opposite to the surface on which the laminated structure 2140 of the nitride semiconductor is provided), the crystalline characteristic is enhanced during initial growth, and, during final crystal growth, in other words in the neighborhood of the surface, it is possible to perform doping at high density, and it is possible to manufacture a product in which the shifting of electric charge at the Si/GaN junction portion is smooth.

Figure 9A:
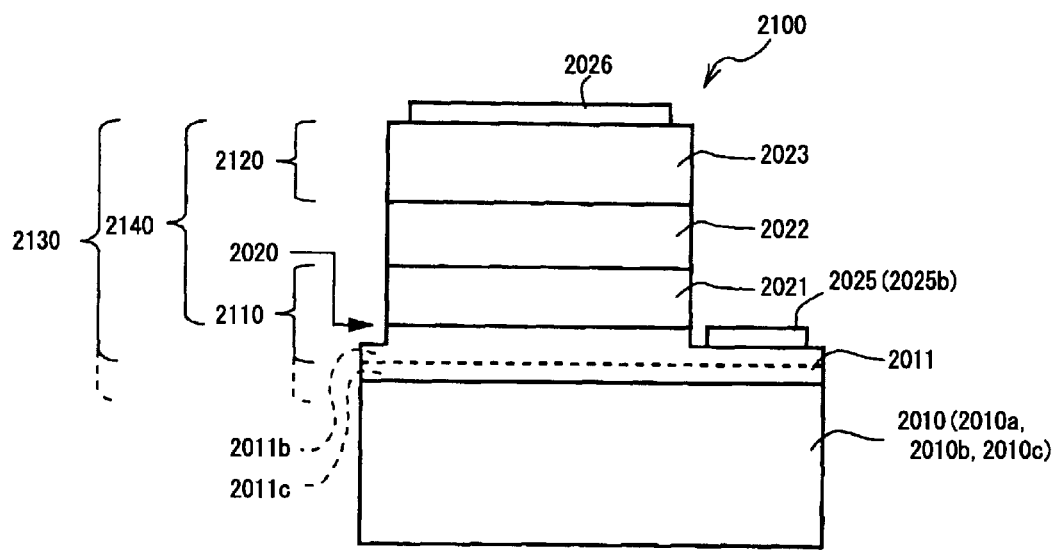
FIG. 9A is another schematic sectional view of this semiconductor element according to an embodiment of the present invention.

At this time, with regard to the doping amount of the regions other than the junction portion neighborhood of the Si/GaN hetero-junction portion, for example the region 2031a, as shown in FIG. 9A, in a case such as when the surface side 2011b of the Si layer 2011 is an current pass region, in other words when, in the first conductive region 2110, the deep layer side 2011*a* is not an current pass region, it is also possible not to add any impurity at all, or to dope an impurity which has the opposite type of electrical conductivity. Desirably, in this case, during the initial step of growth, in order to serve the purposes of crystalline recovery and crystalline characteristic enhancement, it becomes desirable for the impurity amount to be as low as possible, and it is most desirable not to add any impurity at all.

Furthermore, by heating during the formation of the nitride semiconductor laminated structure 2140, due to heat diffusion from the distribution 2060 (2070) (see FIG. 12(*b*-2)) during formation of the Si layer, after the formation of the laminated structure 2140, as shown in FIG. 12(*c*-2), the impurities are diffused towards the side of the deep layer, in other words towards the side of the low density region, and this implies that the density of the surface layer side of the Si layer 2031 is also decreased. Due to this fact, since, when a large impurity density difference is provided between the above described surface layer side 2031*b* and the side of the deep layer 2031*a* there is a tendency for the diffusability also to become high, accordingly it is desirably for the average density within the thickness of the Si layer to be set to be high, or the thickness of the high density surface layer region to be set to quite a large size.

As the layer thickness for the Si layer, a range of thickness of the entire layer from greater than or equal to 0.1 μm to less than or equal to 10 μm is desirable; if this thickness is less than 0.1 μm, then it becomes difficult to control the diffusion of impurities, in particular after the formation of the laminated structure 2140, while, if this thickness is greater than 10 μm, then the crystalline characteristics of the Si layer deteriorate. Desirably, it is possible to control the impurity diffusion within a range of from greater than or equal to 0.2 μm to less than or equal to 1 μm, from the point of view of obtaining satisfactory crystalline characteristics; thereby, it becomes possible to form an element of a satisfactory structure, and in particular, it becomes possible to form the first conductive region in a satisfactory manner. In concrete terms, by forming the surface side region 2011*b* of a certain layer thickness, heat diffusion during formation of the subsequently following laminated structure 2140 is compensated, and, by providing the high density region to be deep, after formation of the element as well, the Si layer 2011, and in particular its surface side 2011*a*, is maintained at an appropriate high density, in order to keep the density gradient of the surface region 2011*b* low. In particular, this layer thickness range becomes an appropriate layer thickness range for forming the high density layer of the surface side Si layer 2011*b*. Furthermore if, as will be described hereinafter, a different element structure (an integrated circuit) is provided in the Si semiconductor of the Si substrate and/or the Si layer and region, by setting the layer thickness of the Si layer in the range of greater than or equal to 5 μm to less than or equal to 10 μm, there is a tendency for the demarcation of the types of electrical conductivity, i.e. the steepness of the p, n impurities (the type of electrical conductivity) of the boundary portion, to be excellent.

Furthermore, as a desirable impurity density for the Si layer, the range therefore is desirably greater than or equal to approximately $1 \times 10^{18}$ cm$^{-3}$ and less than or equal to approximately $1 \times 10^{22}$ cm$^{-3}$, and more desirably is greater than or equal to approximately $1 \times 10^{19}$ cm$^{-3}$ and less than or equal to approximately $2 \times 10^{20}$ cm$^{-3}$; if the impurity density is high, the crystalline deterioration becomes great, and it is difficult to grow the GaN type semiconductor, while, if the impurity density is low, as described above, there is a tendency for the barrier to electrical charge shifting of the Si/GaN heterojunction to become great. In particular, it is desirable for the density of the surface layer side 11*b* to be within this range.

The above described considerations of layer thickness and layer density may, to a certain extent, be applied in the same manner to the Si region below.

[Formation of the Si Region 2011]

With the present invention, it is possible to utilize a per se known prior art method in Si semiconductor technique for formation of the Si region on the original Si substrate 2030: for example, ion implantation, impurity heat diffusion (heat processing in an oven, irradiation with electromagnetic radiation, or, for example, laser annealing or lamp annealing) are available, and, among these, it is desirable in particular to utilize impurity diffusion, either gas phase diffusion or solid phase diffusion, as described below; most desirably, gas phase diffusion is employed. This profits from the feature that, in formation of the Si region on the original substrate 2030, by comparison with the Si layer, it is simple and easy to form a partial region. In concrete terms, for partial formation of the above described Si layer 2031, it is possible to form such a partial layer by a selective growth method such as selective growth from an exposed portion of a region which is partially covered, or by an etching process after growth, but this method is not desirable, since the number of man-hours required increases, and moreover surface irregularities may occur due to existence or non-existence of the layer, which can become a cause of difficulties in subsequent growth of the GaN type semiconductor crystal. On the other hand since, in formation of the Si region, it is provided within the substrate, and the surface of the substrate is kept almost in its original state, it can be almost equivalent to subsequently growing the GaN type semiconductor crystal on the substrate. In other words, the influence of a partial Si region is almost not exerted on the GaN type semiconductor crystal growth, so that it is possible to form various types of element structure.

(Gas Phase Impurity Diffusion)

In the present invention, as the fundamental structure of a method of gas phase impurity diffusion, an impurity source for the gas phase, in concrete terms a p-type impurity source gas, is supplied under heat processing to the Si substrate 2040, so that the desired Si region 2041 is formed on the Si substrate 2040. The raw material of the gas phase impurity source is not particularly limited; it may be an elemental metallic impurity or a compound thereof: for example, in the case of B (boron), it may be a hydrogen compound thereof, in concrete terms, a hydrogenated boron compound, or an organic metallic compound or the like may be suggested; and this is used in the gas phase state (the above described halogenated compound, an organic metallic gas, or the like). Desirably, the hydrogenated compound $B_2H_6$ may be used.

Figure 10:
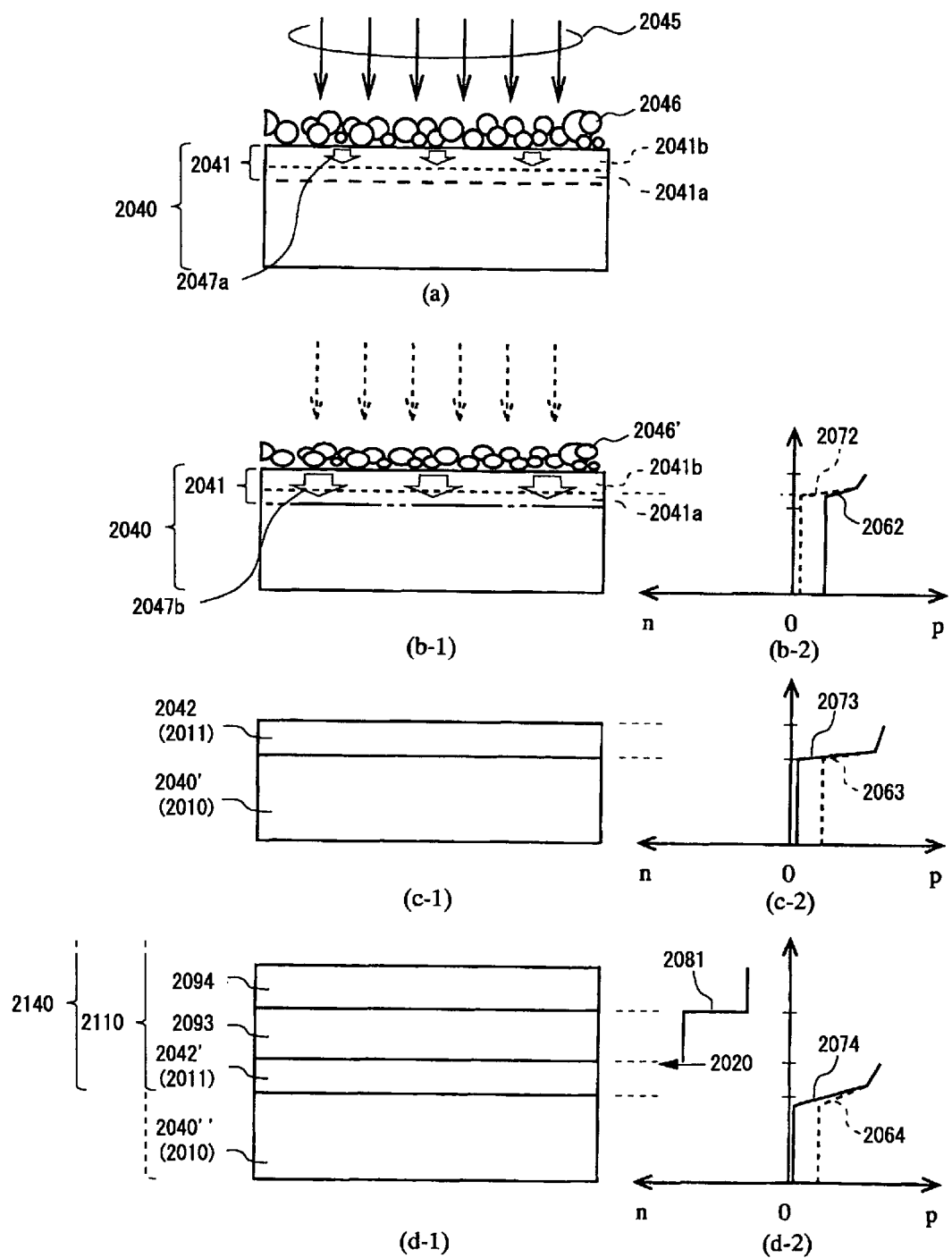
FIG. 10 is a schematic sectional view for explanation of the manufacturing process for this semiconductor element according to an embodiment of the present invention.

To explain this in concrete terms with reference to FIG. 10, an impurity source gas 2045 is supplied to the surface of the Si substrate 2040, and the impurity is adsorbed and accumulated matter 2046 is formed, and diffusion takes place from this accumulated matter 2046; or diffusion takes place directly into the surface, so that, for example, almost simultaneously with the impurity adsorption, the impurity is diffused into the interior of the substrate 2040; by either or both of these processes, the impurity diffuses into the interior of the substrate, and a diffusion region 2041 or the like is formed (refer to FIG. 10(*a*)). Next, the supply of the impurity source is stopped, and, by again performing heat processing, diffusion occurs from the accumulated matter 2046 (refer to FIG. 10(*b*)), and a diffusion region 2041 is formed from the Si region 2011 (refer to FIG. 10(*c*)). Next, the nitride semiconductor materials of the first conductive region 2110, in concrete terms the n-type nitride semiconductor layers 2093 and 2094, are laminated as a laminated structure 2140 of the nitride semiconductor (refer to FIG. 10(d)). Although, herein, supply of an impurity source gas and heat processing after termination of this supply have been described as being separate, if the impurity diffusion during the above described gas supply is sufficient, it would be possible to eliminate the heat processing while the supply of gas is stopped, while, if the diffusion is not sufficient during the supply of the impurity source gas, i.e., for example, in a case such as one in which, during supply of the impurity source gas, a temperature which is sufficient for diffusion has not been attained, heat processing after the termination of gas supply will be necessary; according to the present invention, it is possible to select a method suitably according to either of these reaction conditions. Furthermore, with regard to the heat processing during the supply of the impurity gas, and after the supply thereof has been terminated, according to the conditions of these processes, in a case such as, for example, one in which the speed of deposition of the accumulated matter 2046 becomes great, it is also possible to employ a method of heat diffusion in which the supply and stoppage of the impurity source gas is repeated, and heat processing is performed during either one of these processes, or both.

In the above, there is a tendency for the amount of the accumulated matter to depend on the material of the impurity source gas and its supply conditions, and in particular on the temperature; and, if the temperature is low, it is possible to form the accumulation of matter, while, if the temperature is high, adsorption of this accumulated matter and its diffusion into the interior occur in order before its amount becomes very great, so that it is possible to form the diffusion region during the supply of gas, without deposition. Furthermore, it is possible to anticipate a high doping density on the substrate surface side, if the conditions are such as to allow a temporary accumulation of matter. When forming an accumulation of matter, it is desirable to utilize an organic metallic compound, as shown in the embodiment, while, if an accumulation of matter is not to be formed, it is desirable to utilize a hydrogenated compound ($B_2H_6$ or the like) as the impurity source gas.

Although the explanation of the removal of the accumulated matter 2046 has been omitted in the above description, in order to remove such accumulated matter, it will be acceptable to remove this accumulated matter by taking the workpiece out of the gas phase reaction atmosphere, for example out of the reaction oven, and by using a suitable removal means, for example a chemical etching liquid or the like; or, as described above, in a case such as one in which the impurity source material (the accumulated matter 2046) is eliminated in the atmosphere during supply of the impurity source gas, or in the heat processing atmosphere after supply of the impurity source gas has been stopped, by being dissolved back into the impurity source or carrier, or the atmosphere gas, or by being readsorbed or by undergoing a chemical reaction, or by being emitted into the atmosphere, this accumulated matter may be removed by such a method during impurity deposition, during diffusion, or after diffusion. After the diffusion process, it is possible to remove the accumulated matter by removal into an etching gas or into the ambient atmosphere, or the like. In the following, the gas phase heat diffusion of the present invention will be described in detail by explaining the MOVPE of this embodiment, by way of example.

As shown in FIG. 10(a), TEB (tri-ethyl boron) as the impurity source gas 2045, and hydrogen ($H_2$) as the carrier gas (the atmosphere gas) were supplied to the Si substrate 2040 in a reaction oven, and the boron or boron compound or the like was adsorbed onto the surface, and a portion thereof became accumulated matter 2046, while a portion which was supplied was diffused as the diffusion region 2041. Furthermore, the supply of the impurity source gas was stopped, and, by heat processing within the reaction oven, heat diffusion occurred (see FIG. 10(b-1)), and finally the diffusion region 2042 was created, which became the Si region 2011. At this time, in order to avoid creation of a layer of an altered composition on the surface portion due to chemical reaction with the Si of the Si substrate 2040 during the supply of the impurity source gas and while this supply is stopped, it is desirable to perform these processes in an atmosphere which does not react with the Si of the substrate; an atmosphere of a monatomic gas such as argon or the like, or a reducing atmosphere of hydrogen or the like, will be acceptable, and in concrete terms, a hydrogen atmosphere is preferred. This is because, with regard to the control of this heat processing atmosphere when the supply has been stopped, it often happens that the accumulated matter does not sufficiently cover the surface, and it is apprehended that a state may occur in which a surface formed in a state with a large number of holes or the like is partially exposed; but, if the accumulated matter covers the surface with a close layer, and if the Si substrate is not soaked in the atmosphere, then it is possible to perform the process under an atmosphere which is satisfactory from the point of view of diffusion characteristics, without any limitation on that above described atmosphere. As shown by way of example with the distributions 2061-2062 and 2071-2072 in FIGS. 10(b-2) and 10(c-2) the diffusion region 2041 (2042) is diffused from the surface layer side 2041b (2042b), and, since its deep layer side 2041a (2042a) depends on diffusion from the surface layer side, in other words since the surface side region 2041b (2042b) is of higher density than the deep layer side, accordingly the neighborhood of the surface is formed as the impurity region of the highest density. This distribution functions in an appropriate manner for a Si/GaN heterojunction portion.

Furthermore, when forming the laminated structure 2140 of the nitride semiconductor, in the same manner as in the formation of the above described Si layer, with regard to the Si diffusion region 2042, in order to form the final Si diffusion region 2042' by heat diffusion, it is necessary to form the Si diffusion region 2042 in consideration of this heat diffusion.

With the present invention, as a material for the p-type impurity source gas which is used in the gas phase diffusion, apart from TEB, there may be cited $B_2H_6$ (diborane), TMB (tri-methyl-boron), or the like. If a hydrogenated substance (for example diborane) is used, thermal CVD becomes an appropriate means for the gas phase diffusion.

(Solid Phase Impurity Diffusion)

Figure 11:
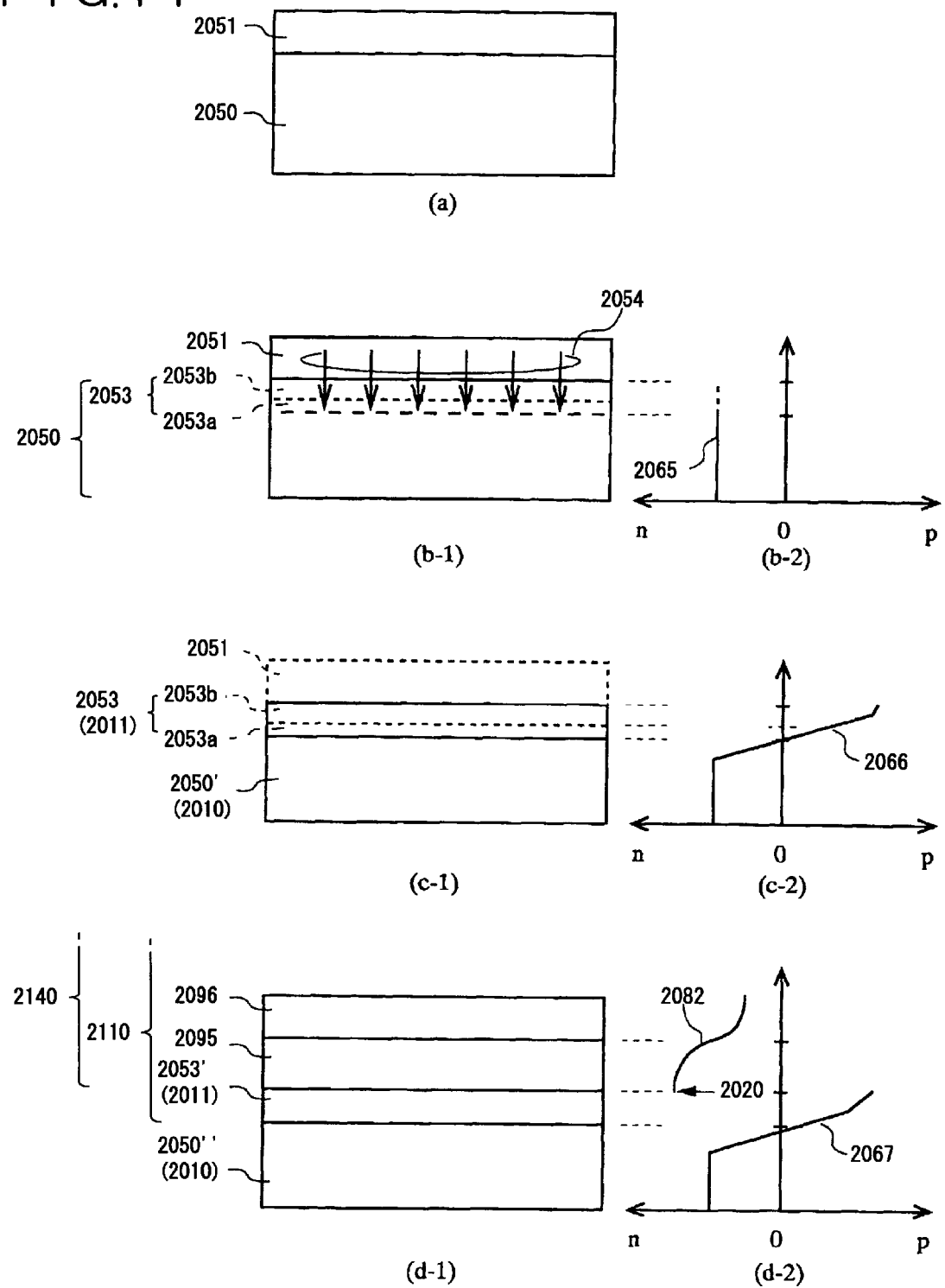
FIG. 11 is another schematic sectional view for explanation of the manufacturing process for this semiconductor element according to an embodiment of the present invention.
Figure 13A:
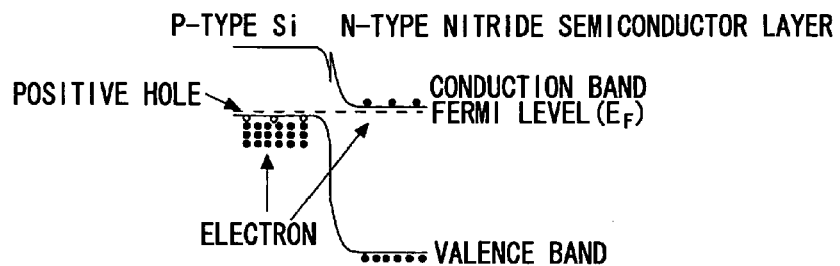
FIG. 13A is a schematic figure showing, for a portion of this semiconductor element according to an embodiment of the present invention, the structure of the energy bands in the neighborhood of an Si/GaN junction portion where the Si and the nitride are both non-degenerate.
Figure 13B:
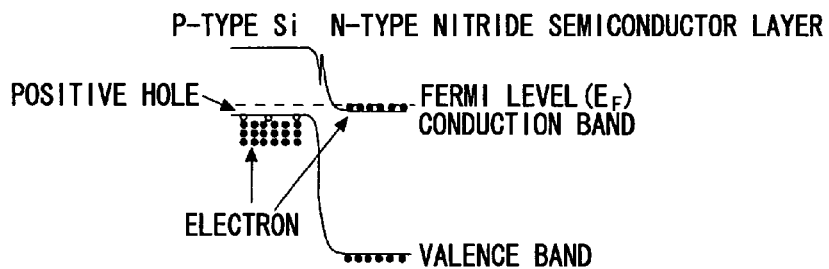
FIG. 13B is a schematic figure showing, for a portion of this semiconductor element according to an embodiment of the present invention, the structure of the energy bands in the neighborhood of an Si/GaN junction portion where only the Si is degenerate.
Figure 13C:
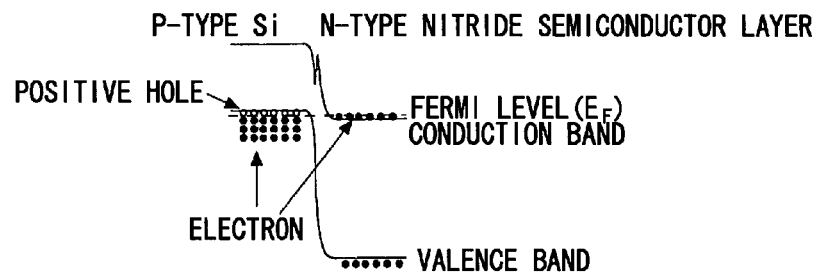
FIG. 13C is a schematic figure showing, for a portion of this semiconductor element according to an embodiment of the present invention, the structure of the energy bands in the neighborhood of an Si/GaN junction portion where only the nitride is degenerate.
Figure 13D:
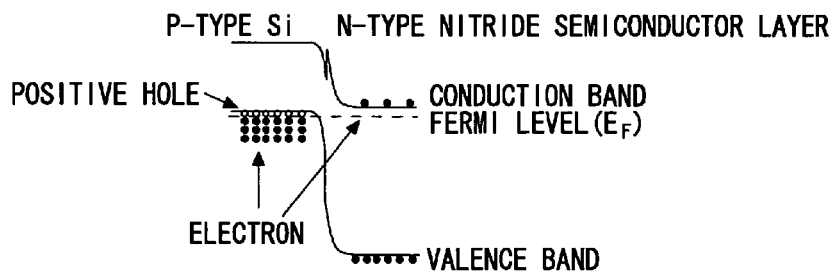
FIG. 13D is a schematic figure showing, for a portion of this semiconductor element according to an embodiment of the present invention, the structure of the energy bands in the neighborhood of an Si/GaN junction portion where the Si and the nitride are both degenerate.
Figure 13E:
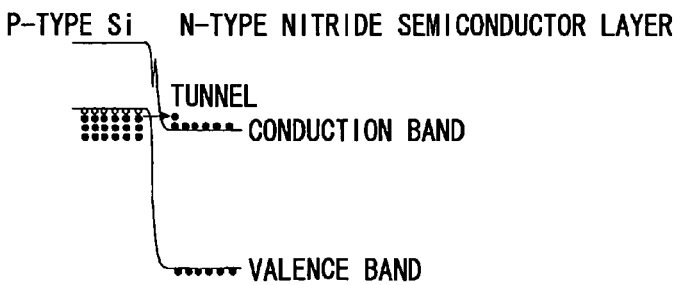
FIG. 13E is a schematic figure showing, for a portion of this semiconductor element according to an embodiment of the present invention, the structure of the energy bands in the neighborhood of an Si/GaN junction portion when a voltage in the forward direction is applied (LED driving)

As a second method of impurity diffusion in the present invention, as shown in FIG. 11, a member which is to constitute a source of an impurity is formed on the surface of a Si substrate 2050, and the impurity is diffused into the substrate 2050 by applying heat processing, so that a diffusion region 2053 is created within the substrate 2050. At this time, the member 2051 which has constituted the source of the impurity is removed, and then, following on therefrom, the formation process for the laminated structure 2140 of the nitride semiconductor is implemented.

In this type of solid phase impurity diffusion, a method which is per se known from the prior art as a Si semiconductor technique may be employed: in concrete terms, a covering layer 51 is made from a material to which a p-type impurity has been added (doped), or from a compound of a p-type impurity element, or the like, and is then heat diffused in an appropriate atmosphere for heat processing. The temperature and the atmosphere for this heat processing depend on the material, the thickness of the layer thereof, and so on, in the same manner as in the above described case of gas phase impurity diffusion. As a concrete example, in the case of boron doped silica glass (BSG), a heat diffusion region was formed by heat processing in an oxidizing atmosphere and at a temperature of from 800° C. to 1200° C. With regard to the impurity distribution, in the same manner as with the above described gas phase diffusion, the surface layer side 2053$b$ was of higher density than the deep layer side 2053$a$, and in particular, the highest density was attained in the neighborhood of the surface, and moreover, by a subsequent process of formation of a nitride semiconductor laminated structure 2140, this impurity diffusion region 2053 was further heat diffused, so as finally to form a diffusion region 2053' which constituted the Si region 2011.

As a layer material to be employed as the p-type impurity source in this solid phase diffusion for the present invention, a material doped with boron, a compound of boron, or the like may be suggested; and, in concrete terms, BSG may be cited as the former, while $HBO_2$ may be cited as the latter.

[The Structure of the Element]

(The Si/GaN Hetero-Junction Portion)

With regard to the Si layer or region (the substrate surface) 2011 at the surface of the hetero-junction portion 2020 which supplies the surface on which the nitride semiconductor layers 2021 to 2023 are to be grown, it is desirable to arrange for this surface to supply an appropriate crystalline surface for the growth of such a nitride semiconductor.

FIG. 14 is for explanation of the junction portion 2020 of the present invention, and shows an experiment in which a nitride semiconductor light emitting element which included an n-type layer, an active layer, and a p-type layer was provided on a Si substrate, and in which the Vf was measured of such an element in which the substrate was manufactured as an p-type Si substrate or an n-type Si substrate. This is a figure in which the Vf with a p-type Si substrate, in other words with a laminated structure consisting of a p-Si substrate/an n-type GaN type semiconductor layer/an active layer/a p-type GaN type semiconductor layer, is compared to the Vf for a nitride semiconductor element according to the prior art (i.e., to the Vf with an n-type Si substrate, in other words with a laminated structure consisting of an n-Si substrate/an n-type GaN type semiconductor layer/an active layer/a p-type GaN type semiconductor layer). The LED chip area in this experiment was 100 μm×100 μm, which is approximately ⅒th of the area (approximately 300 μm square) of a LED which is currently in general use.

An experiment was performed with a current of 5 mA (50 A/cm$^2$), and, when Vf was compared, as shown in FIG. 13, by comparison to the Vf of a prior art type nitride semiconductor element (with an n-type Si substrate) which was 5.1 V, the Vf of a nitride semiconductor element according to one aspect of the present invention (with a p-type Si substrate) was 4.0 V. Accordingly it will be understood that, without limitation to this experiment, with the p-type Si substrate of this aspect of the present invention, the value of Vf is improved by 1.1 V; in other words, with an element which has a p-type Si/GaN hetero-junction for a part of its structure, the Vf at this hetero-junction portion is reduced.

Furthermore, as shown in FIG. 14, the rising slope voltage with the nitride semiconductor element with a p-type Si substrate according to this aspect of the present invention was 3.2 V, while with the nitride semiconductor element of the prior art it was 4.2 V. Accordingly it will be understood that, without limitation to this experiment, with the p-type Si substrate of this aspect of the present invention, the value of Vf is improved by 1 V; in other words, with an element which has a p-type Si/GaN hetero-junction for a part of its structure, the Vf at this hetero-junction portion is reduced.

In this manner, according to this experiment, a nitride semiconductor layer is obtained of which the Vf is lower than in the prior art. Furthermore, it is considered that the I-V characteristic at the junction portion between the nitride semiconductor layer and the Si layer or region 2011 becomes approximately linear, so that it is possible to obtain a satisfactory ohmic characteristic. It should be understood that here, the term "approximately linear" is intended to include the case in which the I-V characteristic is not precisely linear, although of course it may indeed be precisely linear.

(The Neighborhood Region of the Si Side Junction Portion 2020, and the First Conductive Region 2110)

As has been explained above, at the Si/GaN hetero-junction portion 2020 of the present invention, in the neighborhood of this junction portion, it is desirable to make the Si semiconductor side be a region which contains a p-type impurity or a p-type layer, while making the nitride semiconductor side be a region which contains an n-type impurity or an n-type nitride semiconductor layer (region).

In an embodiment of the element structure of the present invention, by incorporating at least a first conductive region, a structure is provided which incorporates a Si/GaN hetero-junction portion in this first conductive region. And it is also possible to provide an element structure in which a second conductive region which has a different type of electrical conductivity from the first conductive region is added over the first conductive region. In concrete terms, this is a structure which comprises, as shown in FIGS. 8 and 9, a first conductive region 2110 (an n-type nitride semiconductor) and, over that region 2110, a second conductive region 2120 (a p-type nitride semiconductor). According to another aspect, a laminated nitride semiconductor structure 2140 is provided over a hetero-junction portion 2020, and a nitride semiconductor 2021 on the side of the hetero-junction portion is allocated to a portion of a first conductive region, this first conductive region being formed by the Si layer or region 2011 on the side of the hetero-junction portion.

If, in this manner, a first conductive region which includes the hetero-junction portion 2020 is provided in the element structure, then, as shown in the impurity distribution diagrams (c-1) and (d-1) of FIGS. 10 to 12, the distribution of n-type impurity of the nitride semiconductor may assume various different formats, but, as its fundamental structure, it has a structure which is high density in the region closely neighboring the hetero-junction portion 2020, while at a region further therefrom, it is low density. This is the point that the formation of the hetero-junction portion from the above described high density n-type nitride semiconductor has a tendency for the shifting of electric charges at this hetero-junction interface to become satisfactory, but, on the other hand, in the region 2140 of the laminated nitride semiconductor structure above the neighborhood region of the hetero-junction portion, it is made to be low density, since crystalline deterioration would ensue due to growth of the GaN type semiconductor from a different type of surface which is doped at high density; and this is very important in order to cause crystalline recovery and enhancement. This is because, in particular with a light emitting element which has an active layer, a second conductive region or the like, another conductive region of the element structure, and an current pass region, the crystalline characteristics of the current pass region which constitutes the light emitting recombination region are an important cause for determination of the characteristics of the element. Furthermore, in the case of an n-type impurity distribution 2080 such as the one shown in FIG. 12(d-2), although an example is shown which has a neighborhood portion high density region and a region of lower density, and a density distribution within the low density region, an embodiment is shown in which it is partially doped at high density, in consideration of the electrical conductivity, elevation of the voltage in the forward direction of the element, and so on. In this case, it is desirable to form the neighborhood portion at least of a higher density than the layer thickness average density.

(The Si Semiconductor Region)

Figure 9B:
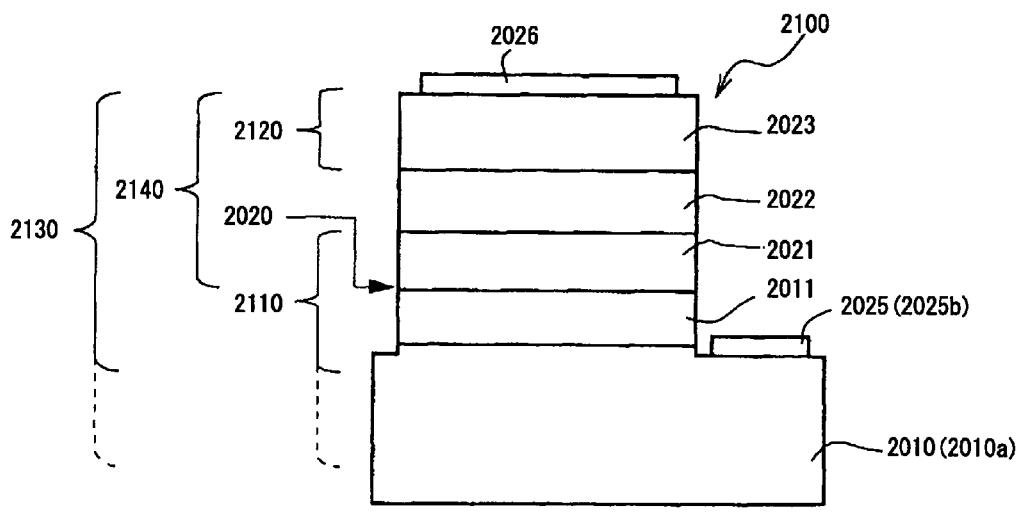
FIG. 9B is yet another schematic sectional view of this semiconductor element according to an embodiment of the present invention (of a different type from FIG. 2A)

In the element structure of the present invention, the Si layer or region 2011, as shown in FIGS. 8 and 9, may be used for various functions, in particular with the shifting direction of electric charge. To classify into cases, there is an aspect in which, as shown in FIGS. 8 and 9B, the Si layer or region 2011 and the Si substrate 2010, or a partial region of the Si substrate 2010, and a region such as the one shown in FIG. 9B by the dotted line portions 2130, 2140 are both current pass regions, in other words are provided within a first conductive region; and there is a structure in which, as shown in FIG. 9A, the Si layer or region 2011, or a part of this region, for example the surface layer side region 2011a of the laminated structure 2140 side of the nitride semiconductor, is an current pass region, in other words, is provided within a first conductive region.

In the latter case, the partial Si layer or region 2011b (the deep layer side) and/or Si substrate outside the current pass region, irrespective of its particular electrical conductivity and type of electrical conductivity, as shown, for example, with the substrate 10 of FIG. 9A, may be any of p-type 2010a, n-type 2010b, non electrically conductive, or i-type 2010c. As for the concrete density distribution of the Si semiconductor region, as shown in the distribution diagrams (b-2), (c-2), and (d-2) of FIGS. 10 to 12, and as appears in the examples 2060, 2070 (FIG. 12), 2062 (FIG. 12) of substrates of the same type of electrical conductivity as the Si layer or region 2011, when the original Si substrate 2030, 2040 includes a p-type impurity or is p-type, when forming the Si layer or region 2011, during heat diffusion after formation, since the diffusion destination has a certain degree of density, accordingly the diffusion characteristic becomes low, and it is possible to maintain the Si layer or region 2011 at high density. In other words, it is possible to implement an increase in the density of the p-type Si substrate, and it is possible to make a great contribution to a satisfactory Si/GaN hetero-junction portion.

On the other hand, in the former case in which the electrical conductivity is supposed, for example, to be the opposite type of electrical conductivity or electrical non-conductivity, as appears in the density distributions 2072 (FIG. 10, electrically non-conductive) and 2065 (FIG. 11, n-type substrate with the opposite type of electrically conductivity) of FIGS. 10 to 12, a substrate and Si layer or region 2011 is formed which exhibits an abrupt variation, in the depth direction of the substrate, in the distribution of the p-type impurity in the Si layer or region 2011. As an element which can utilize this type of steep density distribution, it becomes profitable in a format such as, for example, an element in which the insulating characteristic between the substrate rear side surface and the element structure side 2140 is increased, and the implementation surface is made as the substrate rear side surface, so that it is necessary to insulate between the implementation surface and the element. Furthermore, with the Si layer or region 2011, as shown in FIG. 9A, in the case of an element structure in which the shifting region of electric charge is in the horizontal direction, it is possible appropriately to control the depth of the electric charge shifting region, and thus of the current pass region. Yet further since, as shown by the prior art example, the p-type or n-type region is formed within the Si semiconductor of the Si substrate 2010 and the Si layer or region 2011, accordingly it is also possible to form a circuit structure having various types of Si semiconductor element. On the other hand, when an Si substrate which is electrically non-conductive, in other words which is of lower density than the Si layer or region 2011 (as the density of impurity in the Si, irrespective of its type of electrical conductivity), and which desirably is without additions, is used, then, in the growth of the Si layer or the formation of the Si region thereon, it is possible to enhance the crystalline characteristics, since the amount of impurity in the substrate is small.

(The Second Conductive Region)

As the second conductive region, basically, it is formed from a nitride semiconductor which has a different type of electrical conductivity from the first conductive region; in concrete terms, it is formed as a p-type region.

The present invention is not limited to the first conductive region and the second conductive region explained above; it would also be possible to provide, within the laminated structure 2140 or outside, another conductive region, or a tunneling junction portion such as shown, for example, in the prior art example, within the laminated structure 2140 of the nitride semiconductor, or the like.

[The Nitride Semiconductor Laminated Structure 2140]

In the following the various semiconductor layers will be explained in concrete terms, taking as an example the light emitting element structure shown in FIGS. 8 and 9.

(The n-Type Nitride Semiconductor Layer 2021)

The n-type nitride semiconductor layer 2021 may consist, for example, of a single layer or a plurality of layers; but, in order to obtain a nitride semiconductor layer 2021 which has a small number of crystal defects, it is desirable for it to be made of GaN or of $Al_fGa_{1-f}N$ which has a mixed crystal ratio f of less than or equal to 0.2. Furthermore, with regard to the layer thickness of this n-type nitride semiconductor layer 2021, since it is a question of growing it on a different type of crystalline substrate, in particular on a Si substrate, in consideration of the cracking characteristics, the resistance value, and the voltage of the element in the forward direction (Vf), desirably this layer thickness should be made to be greater than or equal to 0.1 μm and less than or equal to 5 μm; and thereby it is possible to obtain a nitride semiconductor layer whose Vf is low. Furthermore, it is more desirable for this layer thickness to be made to be greater than or equal to 0.3 μm and less than or equal to 1 μm; by making this layer thickness be greater than or equal to 0.3 μm, the crystalline characteristics of the n-type layer 2021 are improved, and an active layer 2022 and a p-type layer 2023 may be obtained above it; while, by making this layer thickness be less than or equal to 1 μm, it becomes difficult for cracking to occur in the nitride semiconductor element structure, and there is a tendency for the yield rate to be enhanced. It is desirable to enhance the light emitting element characteristic by providing some layer of the various functional layers of the element, such as a carrier injector of the n-side cladding layer or the like, in the n-type layer, but it is desirable to provide a buffer layer or a ground layer between this layer and the substrate or layer region 2011, and it is desirable to promote thick crystalline growth and to provide, as a GaN layer which appropriately enhances the crystalline characteristics, such a ground layer as a portion of the periodic structure, so that electrons may be most appropriately injected from the Si substrate into the n-type nitride semiconductor layer.

Yet further, if, between the n-type layer and the p-type layer, a double hetero junction nitride semiconductor element structure provided with an active layer is used, it is desirable to have, as an n side cladding layer on the active layer side within the n-type layer 2022, a layer of which the band gap energy is greater than that of the active layer.

When, as a ground layer on the Si substrate side, which is more desirable than an n side cladding layer, a multi-layered laminate in which AlN and $Al_aGa_{1-a}N$ (where $0 \leq a \leq 1$) are repeated and laminated is provided, it is possible to mitigate the reaction force due to the difference in lattice constants between the Si and the GaN type semiconductor, and due to the difference in coefficients of thermal expansion during the growing process and the like, and thereby it is possible to obtain a nitride semiconductor layer which has good crystalline characteristics.

It should be understood that, by providing a buffer layer (not shown in the figures) in the initial period of growth on the surface of the Si layer or region 2011, in other words of the GaN type semiconductor, it is possible to mitigate the lattice non-matching between the different types of the Si and the GaN, and it is thereby possible to obtain good crystalline characteristics. As a composition for this buffer layer, desirably, $Al_aGa_{1-a}N$ (where $0 \leq a \leq 1$) may be employed; and, more desirably, AlN may be employed. As for the layer thickness, desirably it is greater than or equal to 0.25 nm (greater than or equal to one atomic layer), and less than 10 nm. By making this layer thickness greater than or equal to 0.25 nm, it is ensured that this layer functions appropriately as a buffer layer, and, by making it less than 10 nm, it is possible to maintain the electrical characteristics between the Si substrate and the n-type nitride semiconductor layer as equivalent to those of an element in which no such buffer layer is provided.

If a p-type layer is provided on the substrate side, this buffer layer or ground layer may be provided in the p-type layer.

Desirably, with the present invention, as the electron density of the n-type nitride semiconductor layer 2021, and in particular of the n-type layer in the neighborhood of the Si/GaN junction portion 2020 of the p-type Si 2011, it should be greater than or equal to approximately $2 \times 10^{18}$ cm$^{-3}$ and less than or equal to approximately $1 \times 10^{20}$ cm$^{-3}$. At this time, as the impurity density, it should desirably be greater than or equal to approximately $2 \times 10^{18}$ cm$^{-3}$ and less than or equal to approximately $1 \times 10^{21}$ cm$^{-3}$. It is considered that, in this type of case, a large number of electrons are created at the n-type nitride semiconductor layer 2021, in particular in the neighborhood of the Si/GaN junction portion 2020 of the p-type Si 2011, and the Fermi level of the current pass region of the n-type nitride semiconductor layer 2021 comes to be present within the conduction band. Furthermore, it is considered that the depletion layer between the current pass region of the Si layer or region 2011 and the current pass region of the nitride semiconductor layer 2021 becomes very thin. And it is thought that, as a result, a larger number of electrons come to be injected from the valence band of the Si layer or region 2011 into the conduction band of the n-type nitride semiconductor layer 2021, so that it becomes possible to further reduce the voltage in the forward direction (Vf).

(The Active Layer 2022)

It is possible to utilize a single quantum well structure or a multiple quantum well structure for the active layer 2022, and it may be formed from a nitride semiconductor which includes In and Ga—desirably, from $In_aGa_{1-a}N$ (where $0 \leq a \leq 1$). If a multiple quantum well structure is employed, although the active layer 2022 includes a barrier layer and a well layer, the barrier layer may consist of, for example, undoped GaN, while the well layer may consist of, for example, undoped $In_{0.35}Ga_{0.65}N$. Furthermore, although the layer thickness of the entire active layer is not to be considered as being particularly limited, the number of laminations and the order of lamination of the barrier layer and the well layer may be adjusted, and the layer thicknesses of the active layers may be adjusted, and the thicknesses of the active layers may be set, in consideration of the light emitting wavelength and the like.

(The p-Type Nitride Semiconductor Layer 2023)

The p-type nitride semiconductor layer 2023 may be a single layer or a plurality of layers; and if, between the n-type nitride semiconductor layer and the p-type nitride semiconductor layer, a double hetero junction nitride semiconductor element structure provided with an active layer is used, it is desirable to have, as a p side cladding layer, at least a p-type layer of which the band gap energy is greater than that of the active layer. This may be functionally explained as follows: it prevents overflow of electrons from the n-type nitride semiconductor layer side, and at least acts as a layer which enhances the probability of light emission recombination in the active layer.

Furthermore, desirably there are incorporated, in order from the side of the Si substrate 2010, a p-type cladding layer (not shown in the figures), and a p-type contact layer (not shown in the figures either), by which the positive electrode is formed.

This p-type cladding layer may be a multi-layered structure (a superlattice structure) or a single-layered structure. When the p-type cladding layer is made as a superlattice structure, it is possible to provide good crystalline characteristics, and, since it is possible to keep the specific resistance low, it is possible also to make the voltage in the forward direction (Vf) low. As a p-type impurity for doping into the p-type cladding layer, an element of the IIA or the IIB group of the periodic table such as Mg, Zn, Ca, or Be may be selected, and desirably this p-type impurity is made to be Mg or Ca. Furthermore, although the light emitting output is somewhat decreased if this p-type impurity doped p-type cladding layer is made from a single layer which is made from $Al_tGa_{1-t}N$ (where $0 \leq t \leq 1$) including a p-type impurity, nevertheless it is possible to obtain a satisfactory electrostatic resistance, almost equal to that in the case of a superlattice structure.

The p-type contact layer is desirably made by using a ternary mixed crystal nitride semiconductor, and it is more desirable to employ a nitride semiconductor which is made from binary mixed crystal GaN which does not include any In or Al. Moreover, if the p-type contact layer is made from such a binary mixed crystal GaN which does not include any In or Al, then it is possible to obtain more satisfactory ohmic contact with the positive electrode, and it is possible to enhance the light emitting efficiency. As the p-type impurity for the p-type contact layer, although the same kind of p-type impurity as that used for the p-type cladding layer may be employed, more desirably Mg is used. When Mg is used as the p-type impurity for doping into the p-type contact layer, then it becomes possible to obtain a p-type characteristic for the nitride semiconductor layer in a simple and easy manner, and furthermore it is possible to form ohmic contact simply and easily.

It should be understood that, as a third embodiment of the present invention, the above described Si substrate may be made so that, in a first region thereof, the density of the group 13 chemical element increases along with increasing distance from the nitride semiconductor layer, and then it decreases along with further increase thereof. Although, with this Si substrate, a nitride semiconductor element may be obtained by ion implantation in which electrons are supplied to the nitride semiconductor element structure in an appropriate manner, there is no such ion implantation at the surface of the Si substrate where it contacts the nitride semiconductor (the interface with the nitride semiconductor element structure), and it is desirable to inject ions from the surface while targeting a position which is spaced away from the surface. If this injection is performed while targeting the contact surface, and the density of the element of the group 13 of the periodic table becomes highest at the contacting surface (the interface), then it is not possible to obtain a nitride semiconductor element structure which has good crystalline characteristics, and the characteristics of the element structure itself are deteriorated, and there is a tendency for it not to be possible to obtain a nitride semiconductor element whose Vf is low. Accordingly, what is desirable is a position which is separated from this surface, which is greater than or equal to 100 nm in the depth direction from the surface of the Si substrate on its side which has the nitride semiconductor.

By contrast, when the ion implantation is performed at a position which is separated from the surface of contact with the nitride semiconductor element structure, the element which is injected comes to be included in the Si substrate over a wide extent, and the base of its density profile comes to be in a position at the surface of contact with the nitride semiconductor element structure; and at this surface it is desirable, along with the Si becoming p-type, for the nitride semiconductor element structure to have good crystalline characteristics, in order to be able to obtain a nitride semiconductor element whose Vf is low. In other words, in the Si substrate, it is desirable for the density of the element of the group 13 to increase along with separation from the nitride semiconductor layer, and moreover it is also desirable for the density of the element of the group 13 to increase along with separation from the nitride semiconductor layer, and moreover it is desirable for it to decrease along with further separation therefrom.

Yet further, it is desirable to perform heating processing after the ion implantation, and, by this heating processing, the element of the group 13 which has been injected is diffused within the Si, and its density profile comes to shift from high density towards low density.

Even further, by using such ion implantation, along with it being possible to dope Al in a simple and easy manner, there is also a tendency for it to be easy to obtain a density profile such as the one shown in this embodiment.

Furthermore, as a fourth embodiment of the present invention, it may be arranged for a buffer region to be provided between the Si substrate and the nitride semiconductor layer, and for a first crystalline region and a second crystalline region to be provided on the surface of the Si substrate, with the first crystalline region comprising a first crystal which includes Al and Si, while the second crystalline region comprises a second crystal which includes a GaN type semiconductor including Si. By distributing the first crystalline region which includes the first crystal which includes Al and Si, and the second crystalline region which includes the GaN type semiconductor which includes Si, on the surface of the Si substrate, it is possible to form a nitride semiconductor layer which has good crystalline characteristics on the surface of the Si substrate.

Here, it is desirable for the first crystalline region to include the first crystal which includes Al and Si, and which includes a nitride of at least one of this Al and Si; and, in more concrete terms, the first crystal may be made to include a crystalline mass which includes Al or Si, or a crystalline mass made from AlN which includes Si, or a crystalline mass made from SiN which includes Al, or a crystalline mass made from SiAlN, or the like. By distributing the first crystalline region which includes the first crystal which includes Al and Si, and which includes a nitride of at least one thereof, and the second crystalline region which includes the second crystal which includes a GaN type semiconductor which includes Si, on the surface of the Si substrate, it is possible to form a nitride semiconductor layer which has good crystalline characteristics on the Si substrate.

Moreover, it is desirable to provide the first crystal on the surface of the Si substrate in a layer form, and to provide the second crystal over the first crystal. It is possible to form the first crystalline region on the surface of the Si substrate in a layer form, and to form the second crystalline region over this first crystalline region, and to form a nitride semiconductor layer over this second crystalline region.

Furthermore it is desirable, at the surface of the Si substrate, to arrange for one of the first crystalline region and the second crystalline region to be in the form of an island, and for this one which is in the form of an island to be surrounded by the other. Since, the first crystalline region and the second crystalline region contact one another at the surface of the Si substrate and exist there in mutual harmony, the layer above the Si substrate comes to have a crystalline structure suitable for the injection and shifting of carriers, and accordingly it is possible to form a nitride semiconductor layer in an appropriate manner on the Si substrate.

Yet further, in the second crystalline region, it is desirable for the crystalline orientation of the second crystal at the portion which is formed from the surface of the Si substrate and the crystalline orientation of the second crystal at the portion which is formed from the surface of the first crystalline region, to be different from one another. By ensuring that the crystalline orientations of the second crystals at the portion which is formed from the surface of the Si substrate and at the portion which is formed from the surface of the first crystalline region are different from one another, it is possible to form a nitride semiconductor layer which has good crystalline characteristics on the Si substrate.

Even further, it is desirable for the crystalline orientation of the second crystal at the portion which is formed from the surface of the Si substrate to be (111), and for the crystalline orientation of the second crystal at the portion which is formed from the surface of the first crystalline region to be (0001). By thus ensuring that, for the second crystalline region, the crystalline orientation of the second crystal at the portion which is formed from the surface of the Si substrate is (111), while the crystalline orientation of the second crystal at the portion which is formed from the surface of the first crystalline region is (0001), it is possible to form a nitride semiconductor layer which has good crystalline characteristics on the Si substrate.

Still further, it is desirable for the first crystalline region to cover over the second crystalline region. In this case, it is possible to make the crystalline characteristics of the nitride semiconductor layer which is formed over the Si substrate satisfactory.

Furthermore, it is desirable for the second crystal to be made from GaN which includes Si.

It should be understood that the type of electrical conductivity of the Si substrate 1 is not particularly limited, but, if the type of electrical conductivity of at least the surface of the Si substrate 1 is made to be p-type, then it is possible to perform the injection of carriers between the Si substrate 1 and the nitride semiconductor layer in a more satisfactory manner, and the carriers are injected into the nitride semiconductor layer in a more efficient manner than in the case of an n-type Si substrate.

A method of making this type of nitride semiconductor element will now be explained.

First, Al or a raw material therefore, or Si or a raw material therefore, is fed over the Si substrate 1, and a crystal (the first crystal) is formed on the Si substrate (in a first process). This crystal (the first crystal) may be made in layer form, or may be made in island form. By doing this, it is possible to enhance the crystalline characteristics of the nitride semiconductor layer which is formed on the Si substrate 1.

Next, over this crystal (the first crystal) which is made in layer form, or so as to cover this crystal (the first crystal) which is made in island form, a crystal (the second crystal) of the GaN type nitride semiconductor is formed (in a second process). It should be understood that it would also be acceptable to arrange to form the first crystal, not in island form, but in a reverse island form, i.e. reverse to the above described island form. In this case, the firs crystal is formed in a layer which has pits, so that it is formed in a reverse island manner, while the second crystal comes to be formed from these pits. It should be understood that, although the case when a crystal of a GaN type nitride semiconductor which is present between the crystal of the GaN type nitride semiconductor (the second crystal) and the first crystal is a GaN type nitride semiconductor which includes Al is included, in this case, it is desirable for the Al density of the first crystalline region to be greater than that of the second crystalline region, in order to be able further to enhance the crystalline characteristics of the nitride semiconductor layer.

Furthermore, as a fifth embodiment of the present invention, it may be arranged to provide a buffer region between the Si substrate and the nitride semiconductor layer, with the buffer region having a first region on the side of the substrate, and a second region which is more separated from the Si substrate than is the first region, and with the first region and the second region each having a multi-layered structure in which a first layer which is made from a nitride semiconductor and a second layer which is made from a nitride semiconductor and moreover whose thickness is smaller than that of the first layer and whose composition is different from that of the first layer are alternately laminated together, with the layer thickness of the first layers which are possessed by the first region is greater than the layer thickness of the first layers which are possessed by the second region.

The layers whose lattice constant difference with the Si substrate is large (the second layers) are formed as thinner layers, than are the layers whose lattice constant difference with the Si substrate is small (the first layers). Since the first layers are made from a nitride semiconductor, their lattice constant is small with respect to that of the Si substrate. In other words, when the nitride semiconductor layer is formed on the Si substrate, a compressive reaction force and a tension reaction force respectively act on them at the interface between the Si substrate and the nitride semiconductor layer, since there is a difference in their lattice constants. In detail, when the first layer which is made from the nitride semiconductor is formed on the Si substrate, by contrast to the fact that a compressive reaction force acts on the Si substrate whose lattice constant is the larger, a tension reaction force acts on the first layer whose lattice constant is the smaller. Since a tension reaction force acts on the first layer, when the growth of this first layer progresses, cracking occurs at this growing surface, which is not desirable. Furthermore, this occurrence of cracking becomes an obstacle to the further growth of the nitride semiconductor layer, which is also not desirable. Thus, when the second layer which is made from a nitride semiconductor whose lattice constant difference with respect to the Si substrate is larger than that of the first layer is made as a thin layer, at the interface between the first layer and the second layer, the tension reaction force in the second layer acts as a compressive reaction force on the first layer. In other words, since the compressive reaction force acts at the growing surface of the first layer which is being maintained under a tension reaction force, accordingly it is possible to suppress the occurrence of cracking. That is, it is possible to form the first layer while suppressing the occurrence of cracking, and accordingly, by building this multi-layered structure in which the first layer and the second layer are alternately laminated together, it becomes possible to obtain a buffer region made from nitride semiconductor, with which cracking is suppressed.

Yet further, by forming the second region which is made by alternately laminating together the first layer and the second layer over the first region which has suppressed the occurrence of cracking between its first layer and its second layer on the Si substrate, it becomes possible to form a nitride semiconductor layer which has good crystalline characteristics. Thus, according to a twelfth invention, the layer thickness of the first layer which is possessed by the first region is greater than the layer thickness of the first layer which is possessed by the second region; in other words, the layer thickness of the first layer which is possessed by the second region is thinner than the layer thickness of the first layer which is possessed by the first region. Due to this, it is possible to obtain a nitride semiconductor layer which has good crystalline characteristics. This second region manifests its functions due to the fact that it is above the first region. For example, if the second region having the same layer thickness were to be formed directly on the Si substrate, it would not be possible to obtain a nitride semiconductor layer which had good crystalline characteristics. In other words, by forming the second region over the Si substrate and moreover with a thickness that suppresses the occurrence of cracking, it is possible to manifest the beneficial effects thereof.

From the above, according to the fifth embodiment of the present invention, it becomes possible to obtain a nitride semiconductor layer which has good crystalline characteristics.

Here, it is desirable for the layer thickness of the second layer in the buffer region to be approximately uniform. The design of the periodicity of the multiple layered structure and of the layer thickness ratio variation thereof and so on becomes simple and easy, since the layer thickness of the second layer in the buffer region is made approximately uniform in this manner.

Furthermore, it is desirable for the first layer to include Al, and for its Al mixed crystal ratio to be smaller than that of the second layer. With a multi-layered structure, when the difference between the composition ratios of the two types of layers which make it up is not very great, the difference between the inherent specific crystalline characteristics and mechanical characteristics of these compositions becomes small, so that, although the objective of attaining crystalline growth in which the characteristics of the compositions of both of them are evoked is difficult to attain, if the above is done, since the Al mixed crystal ratio of the first layer is made to be smaller than that of the second layer, it is possible to evoke the characteristics of both the first layer and the second layer, and accordingly it is possible to achieve good crystalline growth.

Yet further, it is desirable for the first layer to be $Al_xGa_{1-x}N$ (where $0 \leq x \leq 0.5$), and for the second layer to be $Al_yGa_{1-y}N$ (where $0.5 < y \leq 1$); and it is desirable for (y−x) to be greater than 0.5. Since the first layer is $Al_xGa_{1-x}N$ (where $0 \leq x \leq 0.5$), and the second layer is $Al_yGa_{1-y}N$ (where $0.5 < y \leq 1$, and furthermore (y−x) is greater than 0.5, accordingly it is possible to make the difference in the composition ratios of these two types of layer large, so that the function of acting as layers for suppressing cracking may be sufficiently manifested.

Still further, it is desirable for the first layer to include a nitride semiconductor n-type impurity. By making a nitride semiconductor n-type impurity be included in the first layer, it is possible to make the buffer region be an electric charge shifting layer of an appropriate type. Furthermore, since band discontinuities originating in differences in band structure occur at the interface between the Si substrate and the multi-layered structure, a potential barrier is created at this interface. Thus, by including a nitride semiconductor n-type impurity in the first layer of the buffer region, the thickness of the potential barrier becomes thinner, and it is possible to anticipate a reduction of Vf. In particular, the reduction of Vf becomes very effective due to the inclusion of such an n-type impurity in the first layer.

Even further, it is desirable, in the buffer region, for the Si substrate side to include more of the nitride semiconductor n-type impurity than the nitride semiconductor layer side. Although Vf is reduced by the first layer of the multi-layered structure including the n-type impurity, the beneficial effect thereof is that, since there is the potential barrier which is created at the interface between the Si substrate and the multi-layered structure, the layer which includes the n-type impurity is desirably the first layer on the side of the Si substrate; while, conversely, it is difficult to obtain any prominent beneficial effect with the nitride semiconductor layer side which is opposite to the Si substrate. Furthermore, when considered from the aspect of the crystalline characteristic, the inclusion of the n-type impurity causes the crystalline characteristic of the nitride semiconductor layer over the multi-layered structure to be decreased. Thus, by reducing the amount of the n-type impurity on the nitride semiconductor layer side with respect to the Si substrate side, in addition to reducing Vf, it is also possible to obtain a nitride semiconductor layer which has good crystalline characteristics. In addition, by making the first layer which is the nearest layer to the Si substrate side so that it includes a larger amount of the n-type impurity as compared to the other first layers, the thickness of the potential barrier between the Si substrate and the multi-layered structure is made thinner, and, while the crystalline characteristics are reduced, it is possible to obtain a layer in which the electric charge shifting is appropriate.

If the above described procedure is adopted, it is possible to enhance both the crystalline characteristics and the electrical conductivity of the nitride semiconductor layer which is formed on the Si substrate.

In this fifth embodiment, it is possible to suppress the occurrence of cracking, because a compressive reaction force acts at the growth surface of the first layer which is continuing to hold the tension reaction force. In other words, it is possible to form the first layer while suppressing the formation of cracking, and, by making the multi-layered structure in which the first layer and the second layer are alternately laminated together, it becomes possible to obtain a buffer region which is made from a nitride semiconductor, in which cracking is suppressed.

Moreover, by forming the second region in which the first layer and the second layer are alternately laminated together over on the first region on the Si substrate for which the occurrence of cracking between the first layer and the second layer is suppressed, it becomes possible to form a nitride semiconductor layer of which the crystalline characteristics are good. In this fifth preferred embodiment, the layer thickness of the first layer which is included in the first region is made to be larger than the layer thickness of the first layer which is included in the second region; in other words, the layer thickness of the first layer possessed by the second region is made to be thinner than the layer thickness of the first layer possessed by the first region. By doing this, it is possible to obtain a nitride semiconductor layer of which the crystalline characteristics are good. By this second region being disposed over the first region, it is able to manifest its functions in an appropriate manner.

Still further, the desirable layer thicknesses of the first layer and the second layer in this fifth embodiment are as follows. The thickness of the first layer is desirably greater than or equal to 5 nm and less than or equal to 100 nm, and more desirably is greater than or equal to 10 nm and less than or equal to 40 nm; and the second layer is desirably thinner than the first layer, and desirably its thickness is greater than or equal to 1 nm and less than or equal to 10 nm, and more desirably is greater than or equal to 1 nm and less than or equal to 5 nm.

Furthermore, as a sixth embodiment of the present invention, in a nitride semiconductor element having a protective element portion of Si semiconductor having a Si substrate, and a light emitting structural portion in which a nitride semiconductor layer is laminated over the substrate, it is desirable to form the junction portion between the protective element portion and the light emitting element structural portion as a p-type Si semiconductor and an n-type nitride semiconductor layer.

Here, with this nitride semiconductor element according to the sixth embodiment of the present invention, it is desirable for it to be a three terminal element 3100, and for the three terminals to be the p, n electrodes 3026, 3025 of the light emitting element portion 3120, which is a nitride semiconductor layer including a n-type layer 3021, an active layer 3022 and a p-type layer 3023, and an n electrode 3015 of a protective element portion 3110 which is provided on a main surface 3310 of the substrate 3010 facing a main surface 3320 on which the light emitting element portion 3120 is provided.

Yet further, with this sixth embodiment, it is desirable to provide an internal circuit, in which wiring is provided to the nitride semiconductor element, so that an n electrode which is provided on a main surface of the substrate on which the light emitting element structural portion is provided, and a p electrode of the light emitting structural portion, are connected together.

Even further, it is desirable for this nitride semiconductor element according to the sixth embodiment of the present invention to be a two terminal element, and for the two terminals to be an n electrode of the light emitting structural portion, and an n electrode of a protective element portion which is provided on a main surface opposite to a substrate main surface on which the light emitting structural portion is provided.

As one aspect of this sixth embodiment, the circuit structure is not integrated within a surface as in the prior art, but instead the light emitting portion and the protective element portion are laminated vertically, so as to result in a overlapping layered integrated element. By making an element in which the light emitting element portion and the protective element portion are laminated in this manner, it is possible to make the area of the light emitting layer, and accordingly the area of the light emitting portion, be greater with respect to the chip area.

As seen for example in FIGS. 16 to 18, a light emitting element portion 3120 of a nitride semiconductor which is laminated on a Si substrate 3010 and a protective element portion 3110 made from Si are a semiconductor element in which an n-type nitride semiconductor 3021 and p-Si 3011 are joined together, and, at the n-GaN/p-Si interface 3020, it is possible to flow a current with a lower voltage than in the prior art, so that it is possible to drive each of the elements 3120 3110, in other words both the LED 3120 and the protective element 3110, in an appropriate manner, so that it is possible to enhance the characteristics of both of the elements 3120, 3110.

By forming a laminated structure 3130 in which the protective element portion 3110 of the Si semiconductor on the Si substrate side is further overlapped and layered on the light emitting element portion 3120 of the nitride semiconductor on this substrate 3010, it is possible to form a semiconductor element 3100 which can protect the light emitting element portion 3120, without intercepting the emitted light from the light emitting element portion 3120, and without any loss of the light emitting characteristics.

Furthermore, by making the junction portion 3020 between the protective element portion 3110 and the light emitting element portion 3120 be p-Si 3011 and an n-type nitride semiconductor 3021, it is possible to solve the problem of a band barrier at this junction portion 3020; and, by the electric charge and current shifting the junction portion 3020 appropriately, the operational function of the elements 3110, 3120 is enhanced.

Various formats are possible for the position of formation for the common electrode 3025 of the light emitting element portion 3120, as shown in FIGS. 16, 17A and 17B. In FIG. 16, by providing the common electrode 3025 on one conductive region of the light emitting element portion 3120 (here, the n-type layer), the hetero junction portion 3020 is provided more to the substrate side than the electrode 3025, in other words in the protective element portion 3110, and this junction portion 3020, in other words when driving the protective element portion 3110, constitutes a tunnel junction.

With this nitride semiconductor element according to the sixth embodiment, when the protective element portion and the light emitting element portion are connected oppositely in parallel, one of these connections has a structure which is provided within the semiconductor element structure. As shown in FIG. 19, one of the electrodes of the light emitting element portion (here, a pad electrode 3027 which is provided on the p electrode), and an electrode of an electrode formation surface which is provided as exposed on the light emitting element portion side of the substrate, are connected together by wiring 3040 as shown in FIG. 19B. By providing one of the connections oppositely in parallel within the semiconductor element structure in this manner, it is possible, if the substrate electrode is placed on the implementation surface side, when it is connected on the implementation surface, to make a semiconductor element which can be driven by connecting a wire to an electrode of its light emitting element portion, so that it becomes possible to implement driving of this element with one wire, and it is possible to reduce the number of wires by one; and accordingly, with a light emitting device to which this semiconductor element is mounted, it is possible to reduce the problem of breakage of the wiring, which can be caused as a result of thermal expansion of a sealing member or the like. Furthermore, it is considered that the efficiency for light emission may be deteriorated due to the fact that light is cut off because of covering the light emitting element portion with a wiring section, but, with a wire connection to the electrode of the other light emitting element portion, a bonding region (a pad electrode) of diameter 50 to 100 μm is required, and light interception may occur due thereto. On the other hand since, in the example of Example 4, the pad electrode 3027 (the electrode 3026) is a connection with the lead 3040, it is possible to form it with a smaller area than in the case of connection by a wire, and there is a tendency for the efficiency of emission of light not to be greatly decreased.

Figure 19A:
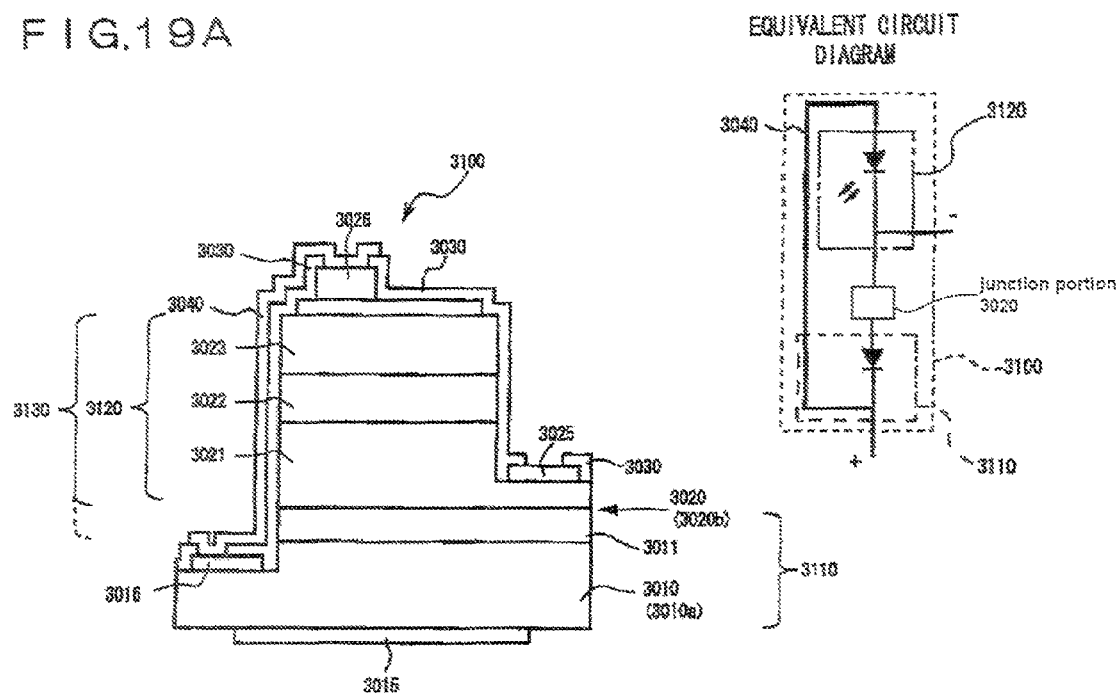
FIG. 19A is a schematic sectional view of a semiconductor element according to an embodiment of the present invention, including a circuit diagram almost equivalent thereto (inserted at the upper right)
Figure 19B:
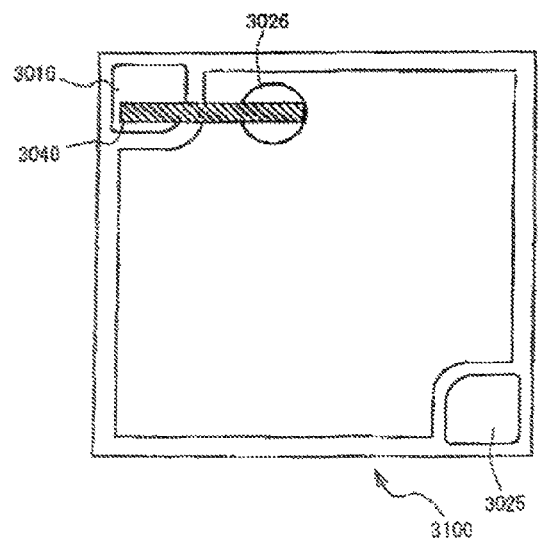
FIG. 19B is a schematic plan view of a semiconductor element according to an embodiment of the present invention (FIG. 4A)

In FIG. 16 and FIG. 19A, in the interests of easy comprehension of the semiconductor element structure of Examples 1 and 4, equivalent circuit diagrams are inserted in the upper right of the figures, but these are not limited to being precisely equivalent circuits. The equivalent circuit diagrams in FIGS. 16 and 19A are only partial circuit diagrams, and some device parts may be missing from the diagrams since it is difficult to exactly represent the detailed layer structure in an equivalent circuit diagram. As will be understood from these equivalent circuit diagrams, in FIG. 16 and the related embodiments, it is necessary to provide wiring 3200 externally to the semiconductor element structure with one of the circuits which are connected oppositely in parallel, but, with Example 4 of FIG. 19, the light emitting element structure, this is a two terminal element in which this wiring 3040 is formed. As will be understood from the figure, the other terminal is the above described common electrode 3025 which has been led out from between the light emitting element portion and the protective element portion, and the other which is connected reversely in parallel is a multi-layer type lamination, in other words, a structure which is connected by a hetero-junction portion 3020 of the laminate interface.

Example 1

Figure 20:
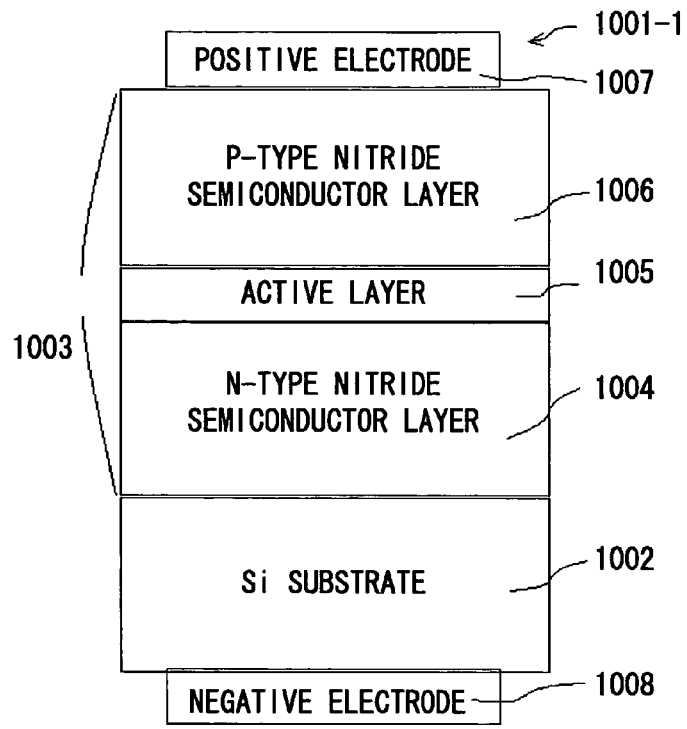
FIG. 20 is a figure showing a nitride semiconductor element according to an Example 1 of the present invention.

FIG. 20 is a figure showing a nitride semiconductor element 1001-1 according to Example 1, which is an example of the first embodiment of the present invention.

In this Example 1, in this nitride semiconductor element 1001-1, the positive electrode 1007 is provided on the side of a p-type nitride semiconductor layer 1006 which is opposite to the Si substrate 1002, while the negative electrode 1008 is provided on the opposite side of the Si substrate 1002 from the nitride semiconductor layer 1006. Since the positive electrode 1007 and the negative electrode 1008 are provided on opposite faces of the Si substrate 1002, accordingly it becomes possible to make this nitride semiconductor element 1001 more compact, as compared with a case in which the positive electrode 1007 and the negative electrode 1008 are provided on the same surface thereof. It should be understood that it would also be possible to provide the positive electrode 1007 on the side surface of the p-type nitride semiconductor layer 1006, and to provide the negative electrode 1008 on the side surface of the Si substrate 1002, and, even if this is done, it is possible to reduce the voltage in the forward direction (Vf) of the nitride semiconductor element 1001-1. Moreover, it should be understood that the materials and the sizes of the positive electrode 1007 and the negative electrode 1008, in the structure of the present invention, are not to be considered as being particularly limited; for example, it would be possible to utilize Ni/Au or ITO or the like for the positive electrode 1007, and to utilize W/Al for the negative electrode 1008.

In the Example 1 shown in FIG. 20, the entire extent of the Si substrate 1002 constitutes an current pass region, and the type of electrical conductivity of all of this current pass region is p-type, so as to attain the above described hole density, p-type impurity density, and specific resistance.

Example 2

Figure 21:
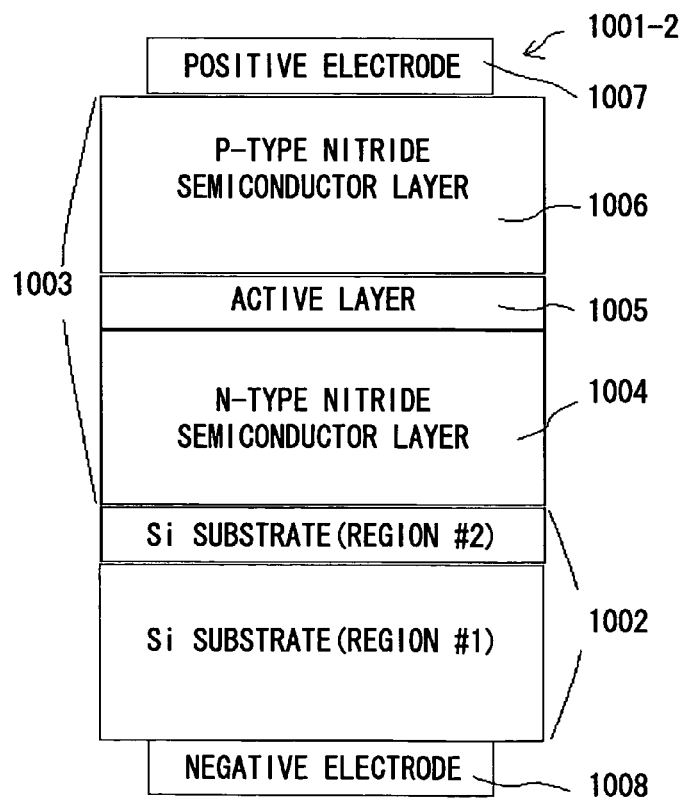
FIG. 21 is a figure showing a nitride semiconductor element according to an Example 2 of the present invention.

FIG. 21 is a figure showing a nitride semiconductor element 1001-2 according to Example 2, which is also an example of the first embodiment of the present invention.

In this Example 2, for this nitride semiconductor element 1001-2, a positive electrode 1007 is provided on the surface of a p-type nitride semiconductor layer 1006, and a negative electrode 1008 is provided on the opposite surface of a Si substrate 1002 from the positive electrode 1007. Since the positive electrode 1007 and the negative electrode 1008 are provided on opposite faces of the Si substrate 1002, accordingly it becomes possible to make this nitride semiconductor element 1001-2 more compact, as compared with a case in which the positive electrode 1007 and the negative electrode 1008 are provided on the same surface thereof. It should be understood that it would also be possible to provide the positive electrode 1007 on the side surface of the p-type nitride semiconductor layer 1006, and to provide the negative electrode 1008 on the side surface of the Si substrate 1002, and, even if this is done, it is possible to reduce the voltage in the forward direction (Vf) of this nitride semiconductor element 1001-2. Moreover, it should be understood that the materials and the sizes of the positive electrode 1007 and the negative electrode 1008, in the structure of the present invention, are not to be considered as being particularly limited; for example, it would be possible to utilize Ni/Au or ITO (indium tin oxide) or the like for the positive electrode 1007, and to utilize W/Al for the negative electrode 1008.

In this Example 2 shown in FIG. 21, the entire extent of the Si substrate 1002 (both region #1 and region #2 thereof) constitutes an current pass region, and its type of electrical conductivity is p-type. However, in this case, while the region #2 (which is the part of the current pass region on the side of the n-type nitride semiconductor layer) attains the hole density, p-type impurity density, and specific resistance described above, by contrast, the region #1 (which is the part of the current pass region on the opposite side from the n-type nitride semiconductor layer) does not attain the hole density, p-type impurity density, and specific resistance described above. However, even though this is the case, it is possible to obtain the beneficial effects of the present invention, and accordingly this structure is to be considered as falling within the scope of the present invention. As shown by way of example in this Example 2, such a case in which all of the Si substrate 1002 constitutes the current pass region, while one part of this current pass region which contacts the n-type nitride semiconductor layer attains the hole density, p-type impurity density, and specific resistance described above, while another part of the current pass region does not attain the hole density, p-type impurity density, and specific resistance described above, is also to be considered as falling within the scope of the present invention.

Example 3

Figure 22:
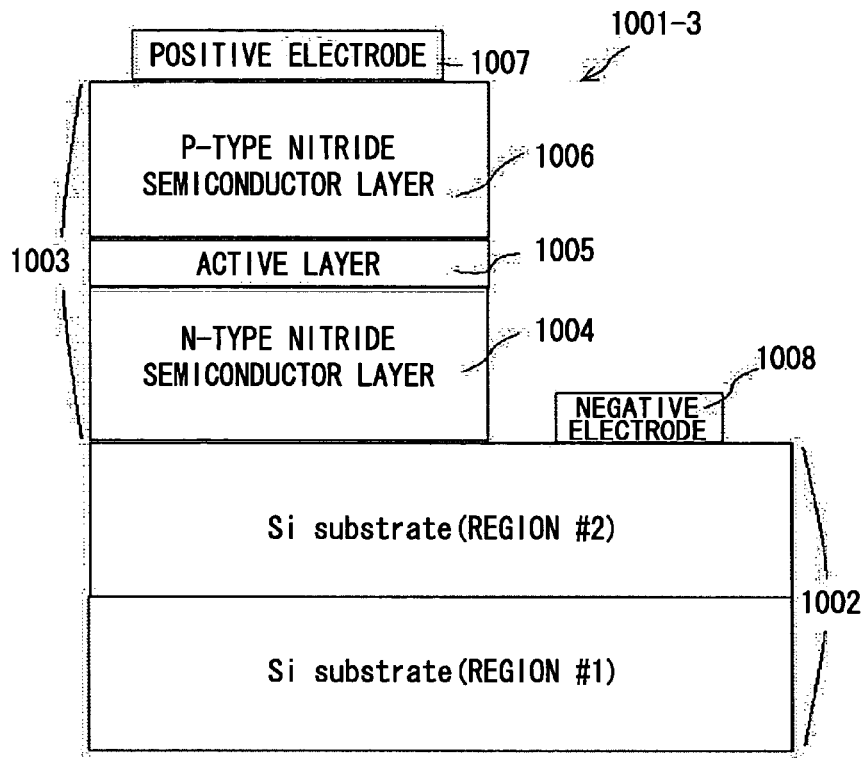
FIG. 22 is a figure showing a nitride semiconductor element according to an Example 3 of the present invention.

FIG. 22 is a figure showing a nitride semiconductor element 1001-3 according to Example 3, which is an example of the first embodiment of the present invention.

In the nitride semiconductor element 1001-3 of this Example 3, a positive electrode 1007 is provided on the opposite side of the p-type nitride semiconductor layer 1006 from the Si substrate 1002, while a negative electrode 1008 is provided over the Si substrate 1002. It should be understood that this positive electrode 1007 may also be provided on the side surface of the p-type nitride semiconductor layer 1006, and the negative electrode 1008 may also be provided on the side surface of the Si substrate 1002; and, even if this is done, it is possible to reduce the voltage in the forward direction (Vf) of this nitride semiconductor element 1001-3. It should be understood that the materials and the sizes of the positive electrode 1007 and the negative electrode 1008, in the structure of the present invention, are not to be considered as being particularly limited; for example, it would be possible to utilize ITO (indium tin oxide) or the like for the positive electrode 1007, and to utilize W/Al for the negative electrode 1008.

In this Example 3 shown in FIG. 22, while the region #2 (a portion of the Si substrate 1002) constitutes an current pass region, the region #1 thereof (another portion of the Si substrate 1002) does not constitute an current pass region. Thus, the type of electrical conductivity of the entire extent of the region #2 (the portion of the Si substrate 1002 which constitutes its current pass region) is p-type, and it attains the hole density, p-type impurity density, and specific resistance described above. By contrast, in this Example 3, the type of electrical conductivity of the region #1 (the other portion of the Si substrate 1002 which constitutes its incurrent pass region) is not particularly limited, and, even though this is the case, it is possible to obtain the beneficial effects of the present invention, so that accordingly this structure is to be considered as falling within the scope of the present invention. As shown in this Example 3, such a case in which all of the Si substrate 1002 constitutes an current pass region, while one part of this current pass region which contacts the n-type nitride semiconductor layer attains the hole density, p-type impurity density, and specific resistance described above, while another part of the current pass region does not attain the hole density, p-type impurity density, and specific resistance described above, is also to be considered as falling within the scope of the present invention.

Example 4

Figure 23:
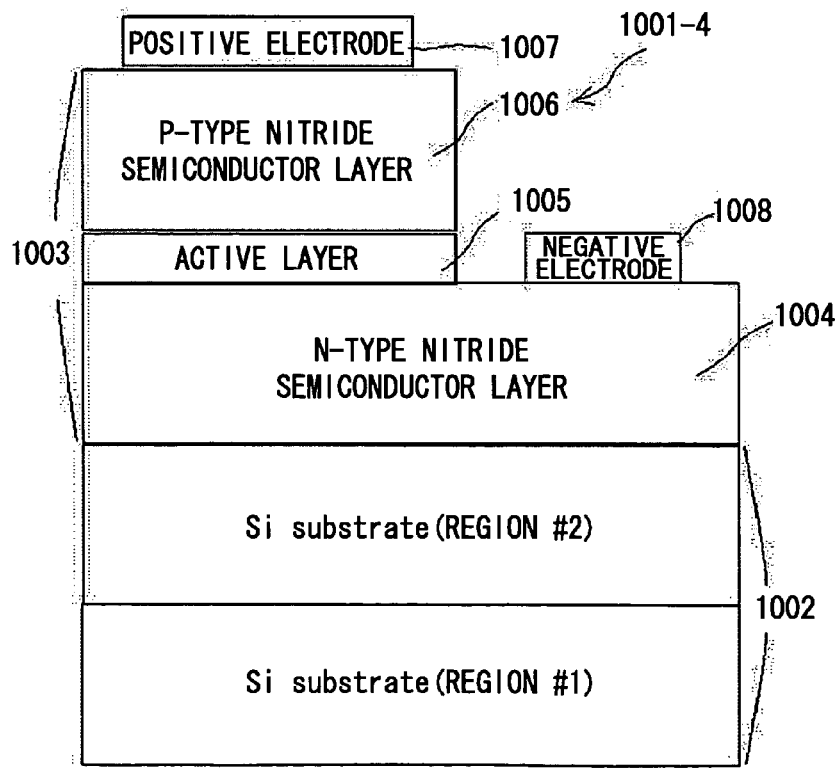
FIG. 23 is a figure showing a nitride semiconductor element according to an Example 4 of the present invention.

FIG. 23 is a figure showing a nitride semiconductor element 1001-4 according to Example 4, which is an example of the first embodiment of the present invention.

In the nitride semiconductor element 1001-4 of this Example 4, a positive electrode 1007 is provided on the surface of the p-type nitride semiconductor layer 1006, while a negative electrode 1008 is provided on the same surface of the n-type nitride semiconductor layer 1004 as the positive electrode 1007. Since the positive electrode 1007 and the negative electrode 1008 are both provided on the same surface, it is not necessary to give any consideration to the electrical conductivity of the Si substrate 1002. It should be understood that this positive electrode 1007 may also be provided on the side surface of the p-type nitride semiconductor layer 1006, and the negative electrode 1008 may also be provided on the side surface of the n-type nitride semiconductor layer 1004; and, even if this is done, it is possible to reduce the voltage in the forward direction (Vf) of this nitride semiconductor element 1001-4. Moreover, it should be understood that the materials and the sizes of the positive electrode 1007 and the negative electrode 1008, in the structure of the present invention, are not to be considered as being particularly limited; for example, it would be possible to utilize Ni/Au or the like for the positive electrode 1007, and to utilize Ti/Pt for the negative electrode 1008.

In this Example 4 shown in FIG. 23, while the region #2 (a portion of the Si substrate 1002) constitutes an current pass region, the region #1 thereof (another portion of the Si substrate 1002) does not constitute an current pass region. Thus, the type of electrical conductivity of the entire extent of the region #2 (the portion of the Si substrate 1002 which constitutes its current pass region) is p-type, and it attains the hole density, p-type impurity density, and specific resistance described above. By contrast, in this Example 4, the type of electrical conductivity of the region #1 (the other portion of the Si substrate 1002 which constitutes its incurrent pass region) is not particularly limited, and, even though this is the case, it is possible to obtain the beneficial effects of the present invention, so that accordingly this structure is to be considered as falling within the scope of the present invention. As shown in this Example 4, such a case in which all of the Si substrate 1002 constitutes an current pass region, while one part of this current pass region which contacts the n-type nitride semiconductor layer attains the hole density, p-type impurity density, and specific resistance described above, while another part of the current pass region does not attain the hole density, p-type impurity density, and specific resistance described above, is also to be considered as falling within the scope of the present invention.

Example 5

The nitride semiconductor elements 1001-1, 1001-2, 1001-3, and 1001-4 of the above described Examples 1 to 4 may be manufactured, for example, in the following manner.

First, the Si substrate 1002 is set in a reaction vessel, and the temperature of the Si substrate 1002 is elevated while hydrogen is flowed over it, so that cleaning of the Si substrate 1002 is performed.

Next, the n-type nitride semiconductor layer 1004 is grown at a predetermined temperature.

Next, the active layer 1005 is grown; this consists of a multiple quantum well structure in which five barrier layers and four well layers are laminated together alternately in the order barrier+well+barrier+well . . . +barrier.

Next, a p-type multi-layered cladding layer is grown which consists of a multi-layered superlattice structure.

Next, a p-type contact layer is grown.

Next, the temperature is lowered to room temperature, and annealing of the Si substrate 1002 is performed within a reaction vessel in a nitrogen atmosphere, so that the resistance of the p-type nitride semiconductor layer 1006 is thereby further lowered.

Thus, when the positive electrode 1007 and the negative electrode 1008 are to be provided on a surface on the same side, the Si substrate 1002 is taken out from the reaction vessel, and, on its p-type contact layer which is its uppermost layer, a $SiO_2$ mask of a thickness of 1 μm is formed in a predetermined shape in the position where the positive electrode 1007 is to be formed, and etching is performed from the side of the p-type contact layer with a RIE (reactive ion etching) device. And further, over this $SiO_2$ mask which has been formed, a portion is left and a resist layer is formed, and a portion of the surface at the Si substrate 1002 or the n-type nitride semiconductor layer 1004 is exposed using RIE.

Next, a positive electrode 1007 made from ITO at a layer thickness of 300 nm is formed as a translucent electrode over almost the entire extent of the p-type contact layer which is the uppermost layer, and, over the positive electrode 1007, a pad electrode (not shown in the figure), made from Au for bonding, is formed at a layer thickness of 0.5 μm. On the other hand, a negative electrode 1008 which includes W and Al is formed on the surface of the Si substrate 1002, on the same surface thereof as the positive electrode 1007 (or on the surface of the Si substrate 1002 which has been exposed by the etching and the surface of the n-type nitride semiconductor layer 1004).

If the Si substrate 1002 which has been formed in the above manner is polished and made into chip form, it becomes possible to obtain the nitride semiconductor element 1001-1, 1001-2, 1001-3, or 1001-4.

After having mounted and bonded the nitride semiconductor element 1001-1, 1001-2, 1001-3, or 1001-4 which has been obtained in this manner to a reed frame (not shown in the figure) or the like, it is sealed with a sealing member (not shown in the figure either). Here, as such a sealing member, there is used a translucent resin which is transparent to light of the desired wavelength; for example, an epoxy resin or a Si resin or an acrylic resin may be applied. It should be understood that it would be acceptable to mix into this sealing member a light diffusing material which diffuses the emitted light, or a substance, such as a fluorescent substance or the like, which is excited by the light from the nitride semiconductor element 1001-1, 1001-2, 1001-3, or 1001-4 and which can emit light at a longer wavelength than the wavelength of that light. As for the shape of the sealing member, any design may be employed; for example, it would be possible to use a half-cylindrical pillar shape or a straight line shape or the like.

Example 6

Now an Example 6, which is an example of the second embodiment of the present invention, will be explained.

A two-inch diameter p-type Si substrate 2010 (carrier density $8 \times 10^{18}/cm^3$, and doped with B [boron]) was prepared, and was conveyed into an oven of a MOVPE device, and, after having been subjected to a thermal cleaning process in an atmosphere of $H_2$ carrier gas at 1150° C., a TEB of p-type impurity source gas (here, boron) at a temperature of 800° C. was supplied (at 20 sccm for 5 minutes), and then, after having deposited the boron in this reducing atmosphere of hydrogen, the supply of TEB was stopped, and the workpiece was kept in the hydrogen atmosphere at a temperature of 1080° C. for about 5 minutes so as to perform heat diffusion processing. Although TEB was used here, it would also be possible to use a suitable means for gas phase diffusion by thermal CVD.

With the Si substrate which is obtained in this manner, it is possible to elevate the density of the p-type impurity (here, boron) at its surface region to approximately $2 \times 10^{20}/cm^3$.

After this heat diffusion processing, next, reaction processing is continued in the same oven, and the nitride semiconductor layers described below are laminated, so as to form the laminated structure 2140.

A Si doped GaN n-type layer 2021 (a contact layer), an active layer 2022 of a multiple quantum well structure in which a plurality of pairs of InGaN/GaN are laminated together, and a p-type layer 2023 (a contact layer) of Mg doped GaN and the like are laminated. Here, it would also be acceptable to provide a cladding layer or an intermediate layer or the like between the contact layers between the n-type layers and the p-type layers and the active layers (within the n-type layers or within the p-type layers). Furthermore, as described above, it would also be possible to provide a ground layer or an intermediate layer between the Si substrate and the nitride semiconductor, and in particular the active layer.

By doing this, as shown in FIG. 8, on the Si substrate 2010 (the p-type Si substrate 2010a), there is obtained a substrate having a $p^+$ region 2011 on its surface, as one portion of a first conductive region 2110 of a light emitting element 2100, and then a laminated structure 2130 is obtained by forming a construction by laminating on this substrate surface, as a GaN type semiconductor laminated structure 2140, an n-type layer 2021 which constitutes a portion of the first conductive region 2110 of the light emitting element 2100, an active layer 2022, and a p-type layer 2023 (a second conductive region 2120). At this time, the p-type impurity density distribution of the $p^+$ type region 2011, as schematically shown in FIG. 10 (*c-2*), changes and becomes greater in its deeper region, due to being further diffused during the formation of the nitride semiconductor laminated structure 2140; and it is also considered that the density of the surface region is decreased to approximately $3\text{-}10 \times 10^9/cm^3$.

Next, a positive electrode 2026 (made as a translucent electrode, for example from ITO) is formed on the surface of the p-type layer 2023, and a negative electrode 2015 (made, for example, from W/Al) is formed on the rear surface of the Si substrate 2010, and thereby the semiconductor element (the light emitting element) 2100 is obtained. A pad electrode (made, for example, from Cr/Au) for wire bonding is provided on the positive electrode 2026, although this feature is not shown in the figure.

Here, as the electrode material for the p-type nitride semiconductor layer, there may be cited a metal, an alloy, or a laminated structure which includes at least one material selected from the group which consists of Ni, Pt, Pd, Rh, Ru, Os, Ir, Ti, Zr, Hf, V, Nb, Ta, Co, Fe, Mn, Mo, Cr, W, La, Cu, Ag, and Y, or compounds thereof; or, for example, an electrically conductive oxide or the like may be used: as such electrically conductive metallic oxides (oxide semiconductors), there may be cited indium oxide which has been doped with tin of a thickness of 5 nm to 10 μm (Indium Tin Oxide: ITO), ZnO, $In_2O_3$, or $SnO_2$, or a nitride semiconductor in which one of those has been doped with an element of the group 3 of the periodic table such as Ga or the like; any of these may appropriately be used as the translucent electrode. In the case of an oxide semiconductor material, this becomes an aspect which has a function intermediate between the conductive layers 2021 and 2023, and the electrodes 2025 and 2026 (refer to FIG. 9), and it will be acceptable to make the types of electrical conductivity of the conductive layers 2021 and 2023 and the metallic oxide the same; while, if the electrodes are made from oxide semiconductor layers of different types of electrical conductivity, it will be acceptable to use any intermediate layer (an oppositely conductive layer, an oxide semiconductor, or a metallic layer) between the laminated structure 2140; or, since it also functions as a current diffusion conductor, it will also be acceptable to use this type of semiconductor layer or electrode material as a diffusing conductor on the side of the first conductive region 2021. Furthermore, in the same manner as with the positive electrode, a translucent electrode material may also be employed in the case of providing the electrode in the n-type layer 2021 (i.e. in the first conductive region 2120), as in a subsequent embodiment.

With regard to the emission of light from the light emitting element which has been obtained in this manner, this light is principally emitted from the nitride semiconductor side of the laminated structure 2140; but some light may be taken out from the side surfaces of the laminated structure 2140 as well. Furthermore, the Vf of this light emitting element has a tendency to be decreased by about 0.2 to 0.4 V as compared with the Vf of a light emitting element in which a laminated structure 2140 is provided directly over the p-type Si substrate, as shown in Reference Example 1; for example, a Vf of about 3.1 V may be obtained.

Example 7

Now an Example 7, which is also an example of the second embodiment of the present invention, will be explained.

In the same manner as in Example 6, a two-inch diameter p-type Si substrate 2010 was prepared, and this was conveyed into a thermal CVD device, and then, in order to form the Si semiconductor layer 2011, at 1100° C. in an atmosphere of $H_2$, an Si source gas of $SiH_4$ (or $SiH_2Cl_2$) and a source gas for a p-type impurity (here, boron) of $B_2H_6$ were supplied, and thereby an Si layer of thickness about 300 nm was formed, this layer which was obtained having a doping amount which was almost uniform in its depth direction.

Next, in the same manner as in Example 1, a laminated structure 2140 of nitride semiconductor was formed, and electrodes were provided, so that a light emitting element was thereby manufactured.

Example 8

Now an Example 8, which is a further example of the second embodiment of the present invention, will be explained.

In the same manner as in Example 1, a two-inch diameter p-type Si substrate 2010 was prepared, a layer of BSG was formed on its surface as a diffusion source layer for a p-type impurity (here, boron), the workpiece was conveyed into an oxidizing oven, and heat processing was performed so that a p+ region 2011 was formed on the surface of the substrate; and then the BHF or the like was removed from this layer, and thereby the p+ region 2011 was exposed on the surface of the substrate.

Next, in the same manner as in Example 1, this substrate was conveyed into a MOVPE device, and a laminated structure 2140 of nitride semiconductor was formed, and electrodes were provided, so that a light emitting element was thereby manufactured.

Example 9

Now an Example 9, which is an example of the second embodiment of the present invention, will be explained.

Using a non-electrically conductive Si substrate 2010c, a Si region 2011 was formed in the same way as in Example 1, and then a laminated structure 2140 was formed, with, as shown in FIG. 9A, a portion of the Si region 2011 of the Si substrate being exposed by etching to a certain depth, so that an electrode formation surface was exposed; and then a light emitting element was manufactured, by forming a positive electrode 2026 in the same manner as in the case of Example 1, and by forming a negative electrode 2025 (for example from W/Pt/Au) on the Si region 2011 of the exposed substrate surface. Although this feature is not shown in the figure, in order to provide surface protection on the side surface of the nitride semiconductor layer 2140, an insulation layer which is translucent, made for example from $SiO_2$, may be formed on the exposed region from the electrode, as a short circuit prevention structure (an insulating structure).

With the light emitting element 2100 obtained in this manner, the first conductive region 2110 of the n-type region includes the p+ type Si region 2011, while, since the Si substrate 2010c is non-electrically conductive, it constitutes a region in which almost no current flows.

Reference Example 1

Now a Reference Example 1, which is likewise an example of the second embodiment of the present invention, will be explained.

In the same way as in Example 7, a two-inch diameter p-type Si substrate 2010 was prepared, and in the same manner as in Example 7, apart from not forming any Si region 2011, a laminated structure 2140 of an n-type nitride semiconductor layer, an active layer, and a p-type nitride semiconductor layer was formed, and thereby a light emitting element was manufactured. As compared with Example 1, no Si region 2011 was incorporated; in other words, the manufacturing process proceeded in the same manner apart from not employing any heat diffusion process. The light emitting characteristic of this light emitting element was able to be almost equal to that of Example 1, and furthermore a forward voltage Vf of about 3.6V was obtained, which was satisfactory.

INDUSTRY APPLICABILITY

Although the nitride semiconductor element of the present invention has been explained in terms of a light emitting element, it can also be applied to a light receiving element in which at least an n-type nitride semiconductor layer and a p-type nitride semiconductor layer are laminated together, or the like; and it may also be applied to a field effect transistor (FET: Field Effect Transistor) which employs a nitride semiconductor, or the like.

In the above explanation, various embodiments of the present invention have been described in detail, but they are not particularly limitative of the present invention. The present invention is to be considered as including all of the nitride semiconductor elements and manufacturing methods thereof which fall within the scope of the present invention, [as defined by the appended Claims].

What is claimed is:

1. A three-terminal nitride semiconductor element comprising:
    a protective element portion having an n-type Si substrate, the protective element portion extending between a first main surface which is a surface of said n-type Si substrate, and a second main surface which is opposite to said first main surface;
    a light emitting element portion having a nitride semiconductor layer laminated on said n-type Si substrate of said protective element portion, said nitride semiconductor layer of said light emitting element being laminated directly on said protective element portion, such that said light emitting element portion is laminated directly on said second main surface of said protective element portion;
    a p-electrode, as one of three terminals, provided on said light emitting element portion;
    a first n-electrode, as another of three terminals, provided on said light emitting element portion; and
    a second n-electrode, as another of three terminals, provided on said first main surface of said protective element portion;
wherein
    said protective element portion includes a p-type Si semiconductor layer,
    said nitride semiconductor layer includes a n-type nitride semiconductor layer, and
    a junction portion between said protective element portion and said light emitting element portion is formed by said p-type Si semiconductor layer and said n-type nitride semiconductor layer.

2. The three-terminal nitride semiconductor element of claim 1, wherein said first n-electrode is provided on a surface of said light emitting element portion or on a surface of said p-type Si semiconductor layer, and serves as a common electrode for said protective element portion and said light emitting element portion.

3. The nitride three-terminal semiconductor element of claim 1, wherein an impurity density of said p-type Si semiconductor layer on said n-type Si substrate is greater than or equal to approximately $1 \times 10^{18}$ cm$^{-3}$ and less than or equal to approximately $1 \times 10^{22}$ cm$^{-3}$.

4. The three-terminal nitride semiconductor element of claim 1, wherein at least the side of said n-type nitride semiconductor layer which is the closest to said n-type Si substrate is an n-type GaN layer.

5. The three-terminal nitride semiconductor element of claim 1, wherein the electron density of said n-type nitride semiconductor layer is greater than or equal to approximately $1 \times 10^{17}$ cm$^{-3}$ and less than or equal to approximately $1 \times 10^{21}$ cm$^{-3}$.

6. The three-terminal nitride semiconductor element of claim 1, wherein the n-type impurity density of said n-type nitride semiconductor layer is greater than or equal to approximately $1 \times 10^{17}$ cm$^{-3}$ and less than or equal to approximately $1 \times 10^{22}$ cm$^{-3}$.

7. The three-terminal semiconductor element of claim 1, wherein an active layer which can emit light or receive light is included in said nitride semiconductor layer.

8. The three-terminal nitride semiconductor element of claim 1, wherein said three-terminal nitride element comprises an internal circuit in which wiring is provided to said three-terminal nitride semiconductor element, so that said second n-electrode which is provided on said first main surface of said protective element portion and said p-electrode are connected together.

* * * * *